(12) United States Patent
Baba et al.

(10) Patent No.: US 7,080,446 B2
(45) Date of Patent: Jul. 25, 2006

(54) WIRING BOARD SHEET AND ITS MANUFACTURING METHOD, MULTILAYER BOARD AND ITS MANUFACTURING METHOD

(75) Inventors: Daizou Baba, Osaka (JP); Naohito Fukuya, Osaka (JP); Tatsuo Hirabayashi, Osaka (JP)

(73) Assignee: Matsushita Electric Works, Ltd., Osaka (JP)

( * ) Notice: Subject to any disclaimer, the term of this patent is extended or adjusted under 35 U.S.C. 154(b) by 67 days.

(21) Appl. No.: 10/493,760

(22) PCT Filed: Oct. 28, 2002

(86) PCT No.: PCT/JP02/11194

§ 371 (c)(1),
(2), (4) Date: Apr. 26, 2004

(87) PCT Pub. No.: WO03/037050

PCT Pub. Date: May 1, 2003

(65) Prior Publication Data

US 2005/0118750 A1  Jun. 2, 2005

(30) Foreign Application Priority Data

Oct. 26, 2001 (JP) .............................. 2001-329935
Aug. 27, 2002 (JP) .............................. 2002-247839

(51) Int. Cl.
*H05K 3/30* (2006.01)

(52) U.S. Cl. ........................... 29/832; 29/825; 29/840; 29/852; 174/260; 257/774; 438/637; 438/667

(58) Field of Classification Search ................. 29/825, 29/832, 833, 840, 846, 852; 174/260; 257/774; 438/637, 640, 667, 668
See application file for complete search history.

(56) References Cited

U.S. PATENT DOCUMENTS

| | | | |
|---|---|---|---|
| 6,195,882 B1 | 3/2001 | Tsukamoto et al. | ............ 29/852 |
| 6,489,685 B1* | 12/2002 | Asahi et al. | ................. 257/774 |
| 6,724,638 B1* | 4/2004 | Inagaki et al. | ............... 361/763 |
| 6,780,668 B1* | 8/2004 | Tsukahara et al. | .......... 438/106 |
| 6,855,892 B1* | 2/2005 | Komatsu et al. | ............ 174/256 |
| 6,872,893 B1* | 3/2005 | Fukuoka et al. | ............. 174/255 |
| 6,878,554 B1* | 4/2005 | Schermer et al. | ........... 436/180 |

FOREIGN PATENT DOCUMENTS

| | | |
|---|---|---|
| JP | 60-55695 | 3/1985 |
| JP | 1-164089 | 6/1989 |
| JP | 7-76871 | 7/1995 |
| JP | 10-270851 | 10/1998 |
| JP | 2001-244638 | 9/2001 |

* cited by examiner

Primary Examiner—Carl J. Arbes
(74) Attorney, Agent, or Firm—Baker & Daniels

(57) ABSTRACT

A wiring board sheet which enables the miniaturization of a wiring board by mounting electric components (10) in an insulation layer (4) to increase the quantity of mounting electric components, has a high reliability, and undergoes a complicated manufacturing process, and a method for manufacturing the wiring board sheet A multilayer board which is mannufactured from this wiring board sheet, eliminates a difference in thermal histories during molding in each layer, simplifies the manufacturing process, and realize miniaturization by the scale-down and high-density of a conductor circuit and an improvement in reliability, and a method for manufacturing the multilayer board.

18 Claims, 33 Drawing Sheets

(a)

(b)

(a)

(b)

(c)

(a)

(b)

WIRING BOARD SHEET AND ITS MANUFACTURING METHOD, MULTILAYER BOARD AND ITS MANUFACTURING METHOD

TECHNICAL FIELD

The present invention relates to a wiring board sheet used for the manufacture of a wiring board and its manufacturing method, as well as to a multilayer board manufactured from such a wiring board sheet and its manufacturing method.

BACKGROUND TECHNOLOGY

In recent years, an increase in the integration of semiconductors, reduction in the distance of the wires and miniaturization of printed wiring boards have been required in accordance with demands for the development of the functions, miniaturization and reduction of the thickness of electronic apparatuses. Semiconductor devices and electric components in chip form such as bare chips, capacitors in chip form and inductors in chip form are mounted on such a printed wiring board.

However, such electric components are mounted only on conductor circuits on the external layers of a printed wiring board, and therefore, the quantity of electric components which are mounted on the printed wiring board is limited while such electric components are placed so as to protrude from the external surfaces of the printed wiring board, which hinders the miniaturization of the printed wiring board. In addition, in the case where electric components are mounted on positions of the outermost layers of a wiring board, freedom in the wiring design is restricted.

These problems become more significant as a greater number of layers are included in a printed wiring board. That is to say, the greater the number of layers included in a printed wiring board, the greater the quantity of wiring, while electric components are mounted solely on the external layers of the printed wiring board resulting in the reduction of the quantity of electric components mounted on the printed wiring board relative to the quantity of wiring, and therefore, the miniaturization of a printed wiring board due to an increase in the number of layers is limited by the quantity of electric components mounted on the printed wiring board.

In addition, as disclosed in Japanese Unexamined Patent Publication H11(1999)-126978, manufacture of a multilayered wiring board has been proposed wherein an air space is provided in an insulation layer so that semiconductor elements and the like are mounted in this air space, and furthermore, such insulation layers made of photosensitive resin and wired circuits are sequentially layered so as to form the wiring board according to the prior art. According to this technology, it becomes possible to mount electric components within insulation layers so that an increase in the quantity of mounted electric components, miniaturization of a wiring board and an increase in the freedom of wiring are achieved to some extent while air is sealed in a gap that has occurred between the inner surface of an air space and an electric component, causing a high risk of a crack in an insulation layer and a defect due to damage of or disconnection of the wire of an electric component to occur as a result of a thermal expansion of air within the air space in the case where the wiring board is subjected to stress due to heat, and in addition, the manufacturing process for such a wiring board becomes complicated because an air space must be created in an insulation layer in accordance with the dimensions or the quantity of the mounted electric components. In addition, insulation layers and conductor circuits are sequentially layered to form a multilayer board in the case of fabrication of a multilayer board, and therefore, the formation of an insulation layer and the formation of a conductor circuit need to be repeated alternately, requiring time and effort for very complicated procedure in the manufacture of the multilayer board. In addition, a heat treatment is required for the curing to form an insulation layer whenever one layer of an insulation layer or conductor circuit is formed, and therefore, each conductor circuit formed in each layer has a different thermal history leading to a different contraction ratio of each conductor circuit pattern, which requires correction. In addition, at the time of the formation of an insulation layer on a conductor circuit pattern, a conductor circuit is buried in an insulation layer as a result of the curing of an insulating resin that has been melted for the formation of the insulation layer wherein unevenness in the wiring board that occurs when a conductor circuit is buried in an insulation layer becomes greater as a greater number of layers are included in the wiring board. In some cases, the unevenness in the wiring board causes a failure in the formation of an insulation layer that covers unevenness of a conductor circuit in a manner where an extremely thin portion is formed in the insulation layer causing a high risk of lowering the reliability of the insulation.

Furthermore, connection structures such as pad on via and via on via can not be formed according to such a conventional manufacturing method, and a problem arises wherein there is a limit in the increase in the density of the conductive circuit, and there is a limit in the reduction of the board area, preventing the reduction in the distance of signal paths.

In addition, a component is inserted in an insulation layer, and thereby, the length of a via in this insulation layer becomes extremely large, causing a big problem in the reliability of the conductive resistance of the via.

As described above, several problems exist in the conventional manufacturing method concerning the reduction of unevenness of a circuit layer by efficiently burying components in the layer as well as concerning the securing of connection reliability, and the quantity of mounting when components are mounted.

The present invention is provided in view of the above described problems, and an object thereof is to provide a wiring board sheet with a high reliability, as well as its manufacturing method, that allows miniaturization of a wiring board where electric components are mounted within an insulation layer, and thereby, the quantity of electric components to be mounted is increased and that allows a manufacture of a wiring board without undergoing a complicated manufacturing process and to provide a multilayer board with an increased reliability, as well as its manufacturing method, that allows miniaturization of a wiring board where electric components are mounted within an insulation layer, and thereby, the quantity of electric components to be mounted is increased; that allows the formation of multiple layers in a collective manner resolving a problem caused by a difference in the thermal histories of the respective layers at the time of formation and allowing for the simplification the manufacturing process; and that allows miniaturization of the wiring board as a result of scale-down and density-increased conductive circuits, achieving an increase in the reliability.

DISCLOSURE OF THE INVENTION

A manufacturing method for a wiring board sheet according to the present invention is characterized in that: a base 6 for transcription, on a surface of which a conductor circuit 5 is placed and an electric component 10 is mounted or is formed through printing on this conductor circuit 5, is layered on one or two surfaces of a resin layer 4 in the B-stage so that the conductor circuit 5 as well as the electric component 10 and the resin layer 4 are opposite to each other; the conductor circuit 5 and the electric component 10 are buried in the resin layer 4; and the base 6 for transcription is released from the resin layer 4 while the conductor circuit 5 is made to remain on the resin layer 4 side, resulting in the transcription of the conductor circuit 5 to the resin layer 4, so that the external surface of the resin layer 4 and the exposed surface of the conductor circuit 5 are in the same plane when a wiring board sheet is formed.

In addition, a manufacturing method for a wiring board sheet according to the present invention is characterized in that: in the above described manufacturing method for a wiring board sheet, the conductor circuit 5 is transcribed to only one surface of the resin layer 4 by using the base 6 for transcription so that the external surface of the resin layer 4 and the exposed surface of the conductor circuit 5 are in the same plane when a wiring board sheet is formed; and a metal foil 9 or a metal foil 17 with resin is layered on and integrated with the other surface of the resin layer 4.

In addition, a manufacturing method for a wiring board sheet according to the present invention is characterized in that: in the above described manufacturing method for a wiring board sheet, the conductor circuit 5 is placed on a surface of the base 6 for transcription, on which the electric component 10 is mounted, wherein a stainless steel base is used as the base 6 for transcription; the conductor circuit 5 is formed by carrying out a plating treatment after the formation of a resist on the surface of the base 6 for transcription; the electric component 10 is mounted or is formed through printing; and underfill is used on the mounting surface side of the electric component 10.

In addition, a manufacturing method for a wiring board sheet according to the present invention is characterized in that: in the above described manufacturing method for a wiring board sheet, a protective film 12 is layered on one or two surfaces of the resin layer 4 after the conductor circuit 5 has been transcribed; a through hole 3 is created so as to penetrate the resin layer 4, the conductor circuit 5 and the protective film 12; a conductive paste 8 is applied to the external surface side of the protective film 12 so that the through hole 3 is filled in with conductive paste 8; and after that, the protective film 12 is released from the resin layer 4 so that the conductive paste 8 protrudes from the through hole 3 towards the outside when a wiring board sheet is formed.

In addition, the manufacturing method for a wiring board sheet according to the present invention is characterized in that: a metal foil 9 is layered on and integrated with the surface, on the opposite side of the surface on which the conductor circuit 5 has been formed, of the wiring board sheet 1 on only one surface of which the conductor circuit has been formed according to the above described manufacturing method for a wiring board sheet, or a base for transcription on which a circuit is placed is layered on and integrated with the surface, on the opposite side of the surface on which the conductor circuit 5 has been formed, of wiring board sheet 1 on only one surface of which the conductor circuit has been formed according to the above described manufacturing method for a wiring board sheet in a manner where the conductor circuit and the resin layer are opposite to each other.

In addition, the manufacturing method for a wiring board sheet according to the present invention is characterized in that: the protective film 12 is layered on one or two surfaces of the resin layer 4 after the conductor circuit 5 has been transcribed to one or two surfaces of the resin layer 4; the through hole 3 is created so as to penetrate the resin layer 4, the conductor circuit 5 and the protective film 12; a hole plating 18 is provided on the inner surface of the through hole 3; a resin paste 20, or the conductive paste 8, is applied to the external surface side of the protective film 12 so that the through hole 3 is filled in with the resin paste 20, or the conductive paste 8; and after that, the protective film 12 is released from the resin layer 4.

In addition, a manufacturing method for a wiring board sheet according to the present invention is characterized in that: in the above described manufacturing method for a wiring board sheet, a stainless steel base having a thickness of from 50 μm to 150 μm on which a surface roughening treatment has been carried out so that the degree of surface roughness, Ra, of the surface on which the conductor circuit 5 is formed, becomes 2 μm or less, is used as the base 6 for transcription.

In addition, a manufacturing method for a wiring board sheet according to the present invention is characterized in that: in the above described manufacturing method for a wiring board sheet, the resin layer 4 is formed of a resin composition that contains at least one type of inorganic fillers selected from among silica, alumina, aluminum nitride, boron nitride, titanium oxide, aluminum borate and magnesium oxide where the maximum grain diameter of these inorganic fillers is 10 μm or less.

In addition, a manufacturing method for a wiring board sheet according to the present invention is characterized in that: in the above described manufacturing method for a wiring board sheet, the resin layer 4 is formed of a resin composition of which the content of the inorganic filler is from 70 wt. % to 95 wt. % and that contains at least either a coupling agent or a dispersing agent.

In addition, a manufacturing method for a wiring board sheet according to the present invention is characterized in that: in the above described manufacturing method for a wiring board sheet, the resin layer 4 is formed of a resin sheet 4a gained by impregnating an unwoven cloth with a resin composition which is then dried.

In addition, a manufacturing method for a wiring board sheet according to the present invention is characterized in that: in the above described manufacturing method for a wiring board sheet, after the formation of the resin layer 4, the resin layer 4 is maintained in the B-stage.

A wiring board sheet according to the present invention is characterized by being manufactured in accordance with the above described manufacturing method for a wiring board sheet.

A manufacturing method for a multilayer board according to the present invention is characterized in that a plurality of wiring board sheets each of which is the same as the above described wiring board sheet 1 are layered and integrated so as to form a multilayer board.

In addition, the manufacturing method for a multilayer board according to the present invention is characterized in that at least one wiring board sheet 1 from among the above described wiring board sheets and at least one sheet 13, which has the resin layer 4 in the B and/or C-stage and of which the inside the electric component 10 is not buried, are layered to be integrated so as to form a multilayer board.

In addition, a manufacturing method for a multilayer board according to the present invention is characterized in that, in the above described manufacturing method for a multilayer board, at least one wiring board sheet 1 from among the above described wiring board sheets and at least one sheet 13, which has the resin layer 4 in the B and/or C-stage and of which the inside the electric component 10 is not buried, are layered and then are collectively molded in this condition to become a multilayer board.

In addition, a manufacturing method for a multilayer board according to the present invention is characterized in that, in the above described manufacturing method for a multilayer board, at least one wiring board sheet 1 from among the above described wiring board sheets is used in layering and via hole creating processes according to a build-up manufacturing method.

In addition, a manufacturing method for a multilayer board according to the present invention is characterized in that: in the above described manufacturing method for a multilayer board, a through hole 19 is created so as to penetrate the layered body after the layering and integrating process; hole plating 18 is provided on the inner surface of the through hole 19; and after that, this through hole 19 is filled in with the resin paste 20 or the conductive paste 8.

Furthermore, a multilayer board according to the present invention is characterized by being manufactured according to the above described manufacturing method for a multilayer board.

EXPLANATION OF SYMBOLS

Figure 1:
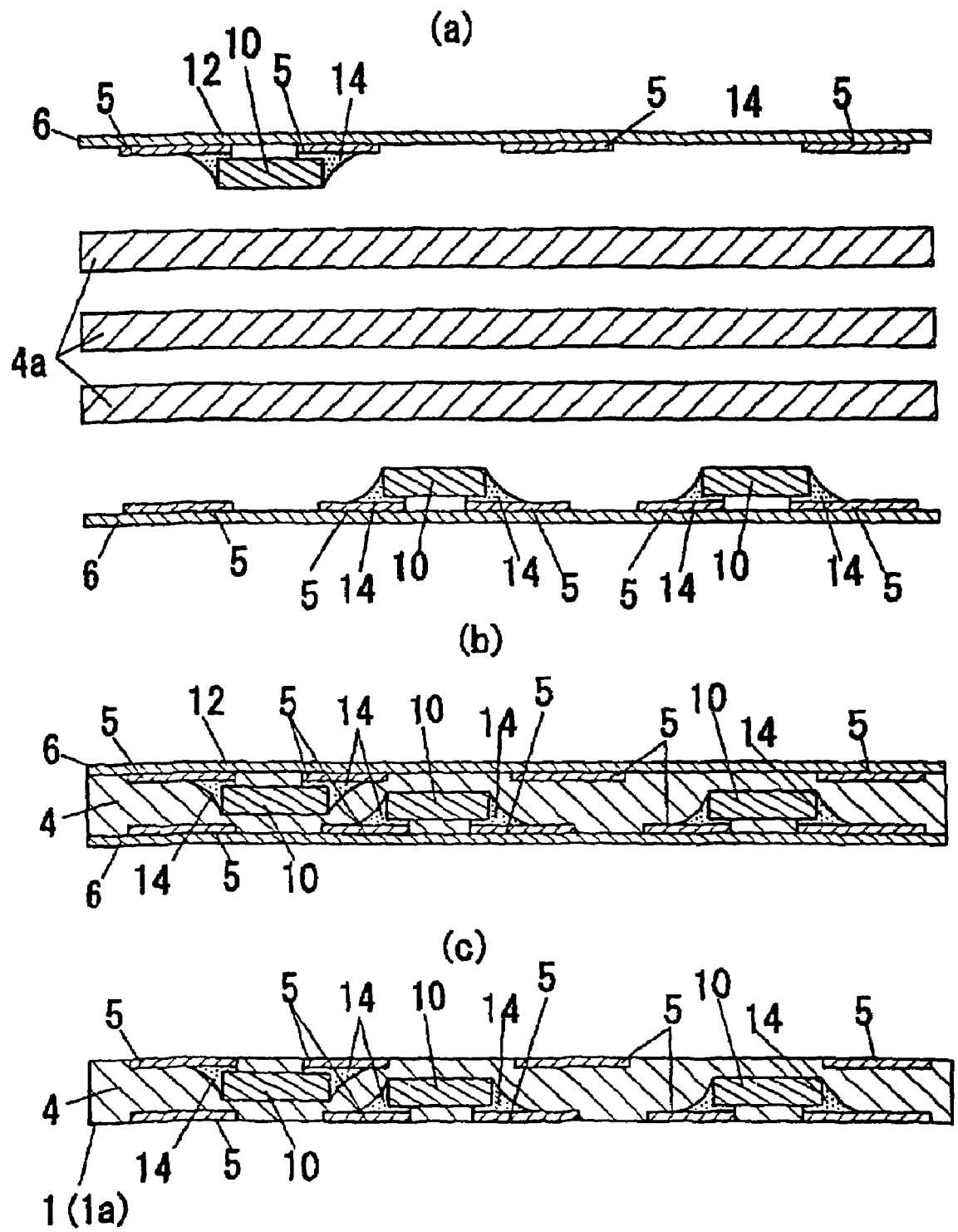
FIGS. 1(*a*) to 1(*c*) are cross sectional views showing an example of a manufacturing process for a wiring board sheet.

1 wiring board sheet
3 through holes
4 resin layer 5 conductor circuit
5a ground layer
6 base for transcription
7 carrier base
8 conductive paste
9 metal foil
10 electric components
11 multilayer board
12 protective film
13 sheet
17 metal foil with resin
18 hole plating
19 through holes
20 resin paste

BEST MODE FOR CARRYING OUT THE INVENTION

The preferred embodiments of the present invention are described in the following.

A wiring sheet 1 is fabricated by transcribing a conductor circuit 5 that has been placed on a base 6 for transcription to a resin layer 4 in the B-stage, and by burying electric components 10 that have been mounted on this conductor circuit in the resin layer 4.

Figure 12:
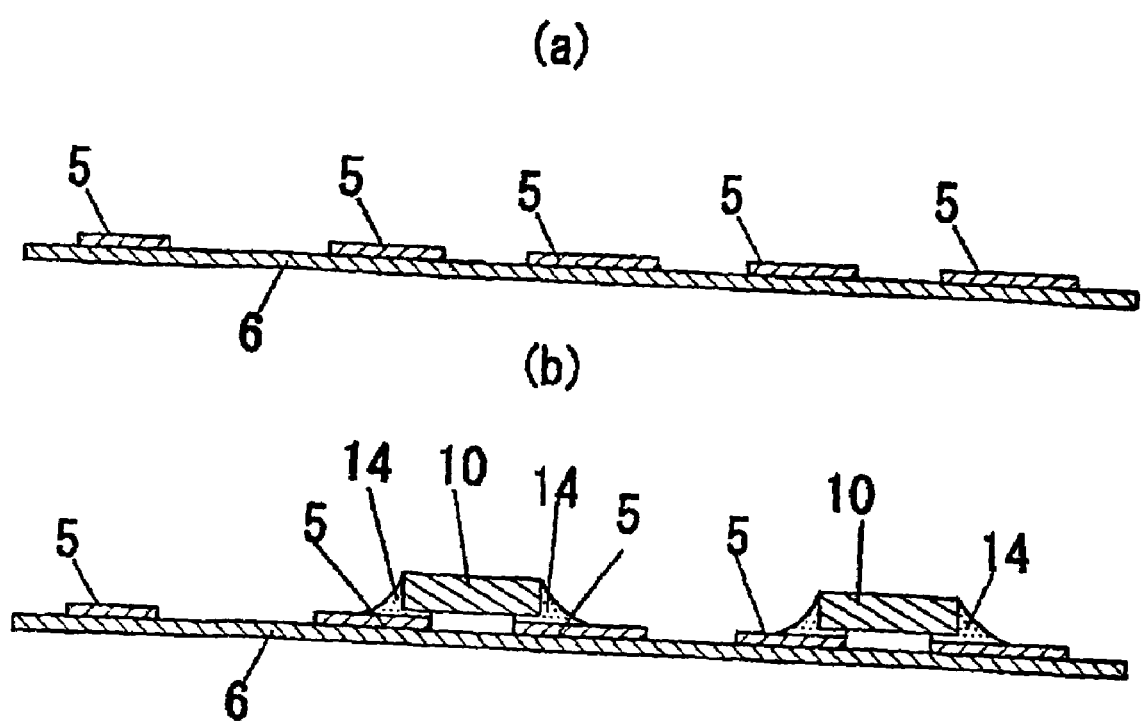
FIG. 12(*a*) is a cross sectional view showing a base for transcription on which a conductor circuit has been formed and FIG. 12(*b*) is a cross sectional view showing the base for transcription where electric components have additionally been mounted on the conductor circuit.
Figure 13:
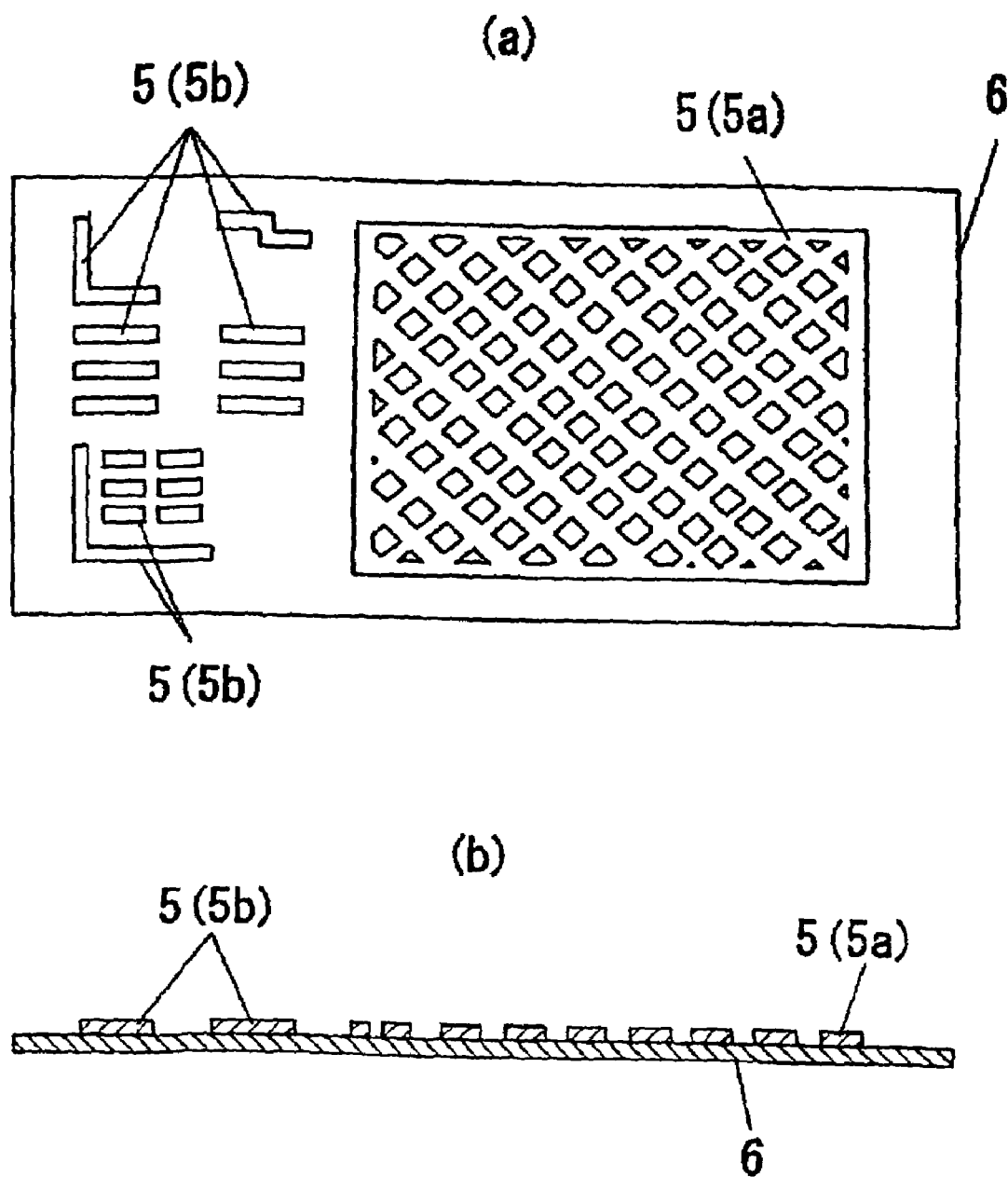
FIG. 13(*a*) is a plan view showing another example of a base for transcription on which a conductor circuit has been formed and FIG. 13(*b*) is a cross sectional view of FIG. 13(*a*)

FIG. 12(a) shows the base 6 for transcription on a surface of which the conductor circuit 5 has been placed. A method for forming the conductor circuit 5 on the base 6 for transcription is not particularly limited, and the conductor circuit 5 can be formed by carrying out an etching process after a metal foil such as a copper foil has been adhered to the base 6 for transcription. However, in the case where the formation of the conductor circuit 5 is carried out through pattern plating by means of electrolyte copper plating or the like, a microscopic conductor circuit 5 can be easily formed, and in addition, the conductor circuit 5, having two smooth surfaces, can be easily formed so that the high frequency loss of the ultimately completed wiring board can be reduced so as to increase the reliability in the high frequency. It is preferable for this conductor circuit 5 to be formed so as to have a thickness of from 5 μm to 35 μm.

The formation of the conductor circuit by means of a plating treatment is carried out in a manner where after the formation of a plating resist on the surface of, for example, a base for transcription, a conductor circuit is placed on the base for transcription by carrying out a plating treatment, and after that, the plating resist is released.

The formation of the plating resist is carried out according to a general technique using a photosensitive dry film, a resist ink or the like. In addition, the formation of the conductor circuit by means of a plating treatment can be carried out through the formation of a plating film such as copper, nickel or gold, according to a general technique.

In the case where the conductor circuit 5 is formed by means of a plating treatment as described above, it is preferable to carry out a surface treatment to an extent where the high frequency characteristics are not damaged in order to ensure the adhesiveness between the resin layer 4, insulator layer 16 and the conductor circuit 5 at the time of the below described transcription of the conductor circuit 5. A surface roughening treatment by means of, for example, a blackening treatment or an alumite treatment can be cited as the above described surface treatment.

As shown in FIG. 12(b), the electric components 10 are mounted on predetermined positions of the conductor circuit 5 placed on the base 6 for transcription as described above. Passive components such as resistors in chip form, capacitors in chip form or inductors in chip form can be mounted as these electric components 10 and at this time the components in chip form can be mounted so as to be connected to the conductor circuit 5 by means of solder 14. In addition, active components such as semiconductor bare chips represented by silicon bare chips can be mounted as the electric components 10 and in such a case semiconductor bare chips can be mounted so as to be connected to the conductor circuit 5 by means of solder balls or the like, where underfill is used and cured. An epoxy resin composition, or the like, can be generally used as the underfill.

Here, the mounting of the electric components 10 is not limited to that by means of solder 14, but rather the mounting can be carried out using a conductive paste though the connection by means of solder 14 has a high reliability in the mounting.

In addition, at least either resistance elements or capacitor elements can be formed through printing as the electric components 10 at predetermined positions on the base 6 for transcription on which the conductor circuit 5 has been formed at the time when the electric components 10 are mounted. In the case of the formation through printing of resistance elements (printed resistors) for example, elements of high capacities can be formed by applying heat to a resistor material after the resistor material in paste form, which is made of a thermosetting resin in which metal powder has been mixed, has been printed. In addition, in the case of the formation of capacitor elements through printing, elements of high capacities can be formed by applying heat to a dielectric material after the dielectric material in paste form, which is made of a thermosetting resin in which barium titanate, or the like, has been mixed as a high dielectric filler, has been printed. In particular, elements having a higher dielectric constant can be formed by sintering and volatilizing the resin content in the paste so that the elements are converted to ceramic form.

In the case where the electric components 10 are formed through printing as described above, it becomes possible to form very thin elements, and thereby, reduction in the thickness of a wiring board can be implemented. In addition, the electric components are not mounted by means of soldering, and therefore, it becomes possible to process a wiring board in an already existing facility for processing printed wiring boards.

In addition, capacitance values or resistance values are adjusted by trimming the electric components that have been formed through printing using a laser, and in such a case, there may be a risk of negative effects occurring such as damage to the board due to heat, thermal contraction, reduction in the reliability of the board due to thermal deterioration when the elements are formed directly on a wiring board such as FR-4 type, or the like, through printing. Contrarily, a laser process can be carried out in the condition where the electric components 10 are mounted on the base 6 for transcription when the electric components 10 are formed on the base 6 for transcription through printing and the process can be carried out without taking into consideration damage of the base, negative effects on the body of the wiring board sheet due to heat, or the like.

The above described conductive circuit 5 is formed so that the adhesion strength (peel strength) between the base 6 for transcription and conductive circuit 5 becomes preferably in a range of from 0.098 mN/cm to 1.96 mN/cm (10 gf/cm to 200 gf/cm) and more preferably in a range of from 0.294 mN/cm to 0.882 mN/cm (30 gf/cm to 90 gf/cm) and in such a range a sufficient adhesion between the base 6 for transcription and the conductor circuit 5 can be gained and the release properties of the base 6 for transcription from the conductor circuit 5 are enhanced at the time when the conductor circuit 5 is transcribed to the resin layer 4 or insulation layer 16. In addition, in the case where the connections are made using solder 14, the conductor circuit 5 is prevented from being released from the base 6 for transcription so that the mounting can be carried out easily using solder 14 and a high reliability can be gained in the connection between the electric components 10 and the conductor circuit 5 when heat resistance of the base 6 for transcription is high and heat is applied at the time of connection by means of solder 14. In the case where such adhesion strength is too small, adhesion between the conductor circuit 5 and the base 6 for transcription becomes insufficient, while in the case where such adhesion strength is too large there is a risk of a failure in completely releasing the base 6 for transcription from the conductor circuit 5 at the time when the conductor circuit 5 is transcribed to the resin layer 4 from the base 6 for transcription.

It is preferable to use a metal base as the above described base 6 for transcription and in the case where a stainless steel base is used, high releasing properties of the base from the resin layer 4 and from the conductor circuit 5 can be gained at the time of transcription of the conductor circuit 5 so that the conductor circuit 5 can be easily transcribed to the resin layer 4 due to stainless steel having a low adhesiveness vis-à-vis the conductor circuit 5 made of metal such as copper and the resin layer 4. SUS304 and SUS301 are preferable as the stainless steel base, and in particular SUS301 is excellent from the point of view of adhesiveness of plating.

In the case where a stainless steel base is used, it is preferable for the thickness to be from 50 μm to 200 μm and in particular, handling is good when the thickness is approximately 100 μm. That is to say, in the case where a stainless steel base having a thickness of from 50 μm to 200 μm, in particular, a thickness of 100 μm is used, the base 6 for transcription has a high tenacity and an appropriate flexibility so that handling is good because the base 6 for transcription can be easily released from the resin layer 4 while flexing the base 6 for transcription without the curvature of the resin layer 4 at the time when the base 6 for transcription is released from the resin layer 4 in order to transcribe the conductor circuit 5 as described below. In addition, when a stainless steel base is used as described above the tenacity of the base 6 for transcription is enhanced so that the handling becomes good even in the case where a great number of electric components 10 are mounted in a manner where, for example, actions such as carrying the base into and taking the base out from a reflow furnace in the case where a great number of electric components 10 are mounted on the conductor circuit 5 can be easily carried out. In addition, even in the case where the surface of the base becomes dirty at the time of formation of the conductor circuit 5 or at the time of the mounting of the electric components 10, the base can be easily cleaned through degreasing, or the like, after the formation of the conductor circuit 5 or after the mounting of the electric components 10 so that no stains are transcribed to the resin layer 4 preventing a reduction in the reliability.

In the case where such a stainless steel base is used, adhesiveness between the base 6 for transcription and the conductor circuit 5 is secured to a certain degree at the time of the formation of the conductor circuit 5 on the base 6 for transcription by means of plating treatment, or the like, so as to prevent the conductor circuit 5 from being released from the base 6 for transcription in an unprepared manner at the time of heat application during solder reflow and so as to make the conductor circuit 5 remain on the resin layer 4 side without fail after the release of the conductor circuit 5 from the base 6 for transcription at the time of the transcription of the conductor circuit 5 where the base 6 for transcription is released from the resin layer 4. In order to do so, it is preferable to adjust the adhesion strength between the base 6 for transcription and the conductor circuit 5 by carrying out a roughening treatment by means of chemical polishing, for example, by carrying out a soft etching treatment using an etchant, such as a mixed acid of nitric acid and hydrofluoric acid or ferric chloride, on the surface of the base 6 for transcription on which the conductor circuit 5 is to be formed and as a result of such a treatment, the degree of surface roughness, Ra, of the base 6 for transcription is preferably made to be 2 μm or less and the degree of surface roughness, Ra, of the base 6 for transcription is more preferably made to be 0.1 μm to 0.5 μm.

In addition, in the case where the conductor circuit 5 for power supply or for grounding is formed, the conductor circuit 5 may be formed in plain form on the base 6 for transcription and more preferably the conductor circuit 5 is formed in mesh form. In this case, heat stress is relieved at the time when stress is received due to heat even when the coefficients of thermal expansion of the base 6 for transcription made of a stainless steel base, or the like, and of the conductor circuit 5 made of copper, or the like, differ from each other, and thereby, the conductor circuit 5 can be prevented from being released from the base 6 for transcription in an unprepared manner. In the same manner, it is preferable to form independent conductor circuits in advance of which the number is equal to the number of small pieces in the case when the small pieces are cut out from one wiring board.

On the other hand, the resin composite for forming the resin layer 4 contains a resin content and an inorganic filler wherein the resin content contains a thermosetting resin in which a curing agent, a curing accelerator, a surface treatment agent, and the like, are mixed if necessary. In addition, a solvent can be mixed for adjusting the viscosity.

Though the thermosetting resin is not particularly limited, known epoxy resins, phenol resins, cyanate resins and the like, can be cited and one or more types from among these can be used. In addition, though a fire retardant may be added in addition to a thermosetting resin in order to provide fire retardancy, an improvement of fire retardancy can be achieved while maintaining a sufficient heat resistance and mechanical strength when a thermosetting resin of which a portion or the entirety is brominated or is modified by adding phosphorous is particularly used.

In the case where a curing agent or a curing accelerator is mixed, the types of these are not particularly limited, but rather an appropriate amount of appropriate curing agent or curing accelerator is mixed in accordance with the utilized thermosetting resin. In the case where an epoxy resin is mixed as the thermosetting resin, for example, a curing agent of a known epoxy resin such as a phenolic novolac resin or dicyandiamide can be mixed as the curing agent, and a known curing accelerator such as 2-ethyl-4-methyl imidazole or triphenylphosphine can be mixed as the curing accelerator.

In addition, an appropriate coupling agent such as a silane-based coupling agent or a titanate-based coupling agent or an appropriate dispersing agent such as a phosphate ester-based dispersing agent or an ether amine-based dispersing agent can be mixed as the surface treatment agent.

In addition, it is preferable to utilize a solvent having a low boiling point, and in this case, a mixed solvent that is mixed in the resin composition is utilized, and thereby, the surface form of the resin layer 4 that is formed of the resin composition becomes good after being dried. It is especially preferable to utilize methyl ethyl ketone, acetone or the like, as such a solvent. In the case where a solvent having a high boiling point is used, the possibility of the solvent to remain without being sufficiently volatilized at the time of drying is high, and there is a risk of the solvent causing the reduction in the electrical insulation and in the mechanical strength of insulation layer 16 that is formed by curing the resin layer 4.

A high volume of the inorganic filler is filled into the resin composition, and thereby, the rates of thermal expansion of the resin layer 4, that is formed of the resin composition, and of insulation layer 16 that is gained by curing and forming this resin layer 4, are lowered, so that the matching of the coefficients of thermal expansion, vis-à-vis the metal that forms the conductor circuit 5 at the time of the formation of the wiring board or electrical components 10, can be increased. The amount of inorganic filler in the mixture at this time is preferably 80 wt. % to 95 wt. % relative to the entire amount of the composition, excluding the solvent, and thus, the coefficient of thermal expansion of insulation layer 16 becomes 20 ppm/° C. or lower, having an appropriately low level of thermal expansion, and exhibiting better matching of coefficients of thermal expansion vis-à-vis the metal that forms the conductor circuit 5 and the electric components 10, wherein the occurrence of defects such as separation of insulation layer 16 from the conductor circuit 5, damage to the electric components 10, or disconnection of wires, can be prevented when stress due to heat is received.

Aluminum oxide ($Al_2O_3$), magnesium oxide (MgO), boron nitride (BN), aluminum nitride (AlN), silica ($SiO_2$), titanium oxide ($TiO_2$), aluminum borate ($9Al_2O_3 \cdot 2B_2O_3$) or the like can be used as the inorganic filler, where one type of these can be used solely, or two or more types can be combined. A high volume of these inorganic fillers can be easily filled into the composition in accordance with an appropriate grain design in the case where a desired function is selected, providing a high level of freedom in thermal conductivity, dielectric constant, distribution of grain size and color tone. In particular, in the case where inorganic filler, of which the maximum grain diameter is 10 μm or less, is used, shapes of holes and state of wear can be maintained in good condition during the creation of the through holes 3 by means of laser processing, or drill processing. In addition, a good appearance can be achieved even in the case where the resin sheet is a thin film having a thickness of 50 μm or less.

In addition, it is preferable to add an appropriate amount of coupling agent, such as an epoxy silane based coupling agent or a titanate based coupling agent, or an appropriate amount of dispersing agent, such as a phosphate ester based dispersing agent of an ether amine based dispersing agent in order to increase the dispersion of inorganic filler in the composition.

In addition, a thermoplastic resin, such as a phenoxy resin, can be mixed in order to adjust the fluidity or in order to prevent cracking in the resin layer 4 or the insulation layer that is the cured resin.

A thermosetting resin composition can be gained by slurrying all of the above described components using a kneader, and by adjusting their viscosity to the optimal level.

A synthesized resin film, such as a PET film, or a metal foil, can be used as a carrier base 7 for forming the resin layer 4. In the case where a metal foil is used, it is preferable to make the surface on which the resin layer 4 is formed a mirror surface, in order to improve the release properties of the carrier base 7 at the time when the carrier base 7 is released from the resin layer 4. A material that allows for the creation of the through holes 3 by means of laser processing is selected as such a metal foil, and it is preferable to use a rolled copper foil, an electrolytic copper foil, an aluminum foil, a metal alloy foil, a metal clad foil, or the like.

Figure 14:
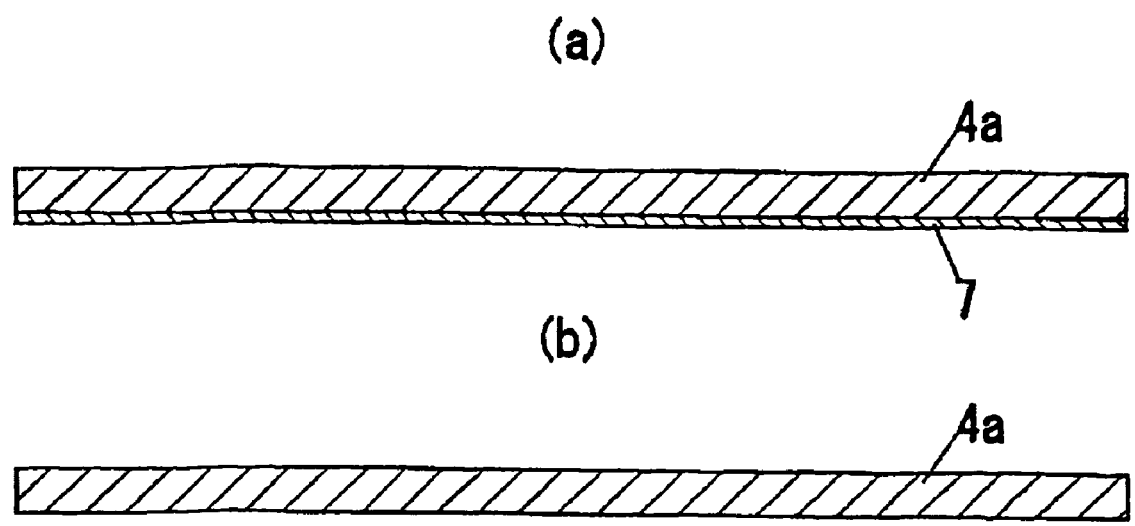
FIGS. 14(*a*) and 14(*b*) are cross sectional views showing a process of forming a resin sheet.

A resin sheet 4a is formed on one surface of this carrier base 7 in order to form the resin layer 4. In order to form resin sheet 4a, as shown in FIG. 14(*a*), the above described resin composition is first applied to one surface of the carrier base 7, which is heated and dried so as to be converted to a semi-cured condition (the B-stage), and thus, the resin sheet 4a is formed on the surface of the carrier base 7. Though the heating and drying conditions at this time depend on the makeup of the resin composition, heating at 130° C. to 170° C. for 2 to 10 minutes is preferable. In addition, it is preferable to form resin sheet 4a so as to have a thickness of 50 μm to 300 μm.

Then, as shown in FIG. 14(*b*), the carrier base 7 is released from the above described formed resin sheet 4a.

In addition, a resin sheet formed by impregnating a resin composition in slurry form into an unwoven cloth, which is then dried, can be used as the resin sheet 4a. An appropriate glass unwoven cloth, an organic fiber unwoven cloth, or the like, can be used as the unwoven cloth.

The above described resin sheet 4a and the base 6 for transcription on a surface of which the conductor circuit 5, to be later transcribed, has been formed, and the electric components 10 have been mounted on this conductor circuit 5 are used so that the conductor circuit 5 can be transcribed from the base 6 for transcription to the resin layer 4, that has been formed from the resin sheet 4a, and thereby, the wiring board sheet 1 is gained, wherein conductor circuits 5 are formed on the two surfaces, and the electric components 10 mounted on these conductor circuits 5 are buried in resin layers 4.

FIGS. 1(*a*) to 1(*c*) show an example of a manufacturing process for the wiring board sheet 1. First, as shown in FIG. 1(*a*), the bases 6 for transcription, where conductor circuits 5 have been formed and the electric components 10 have been mounted on these conductor circuits 5, are placed so that the surfaces on which the conductor circuits 5 have been formed are opposite to each other while resin sheets 4a are placed between these bases, and then, these bases and the resin sheets are layered. There may be one or more resin sheets 4a, and this number is dependent on the dimensions of protrusions of the electric components 10 from the conductor circuits 5. In this condition, heating and pressing molding is carried out so as to integrate the layers.

First, in this molding process, the resin sheets 4a are melted and softened. At this time, in the case where two or more resin sheets 4a are layered, these resin sheets 4a are integrated, and moreover, these melted and softened resin sheets 4a are sufficiently fluidized so that the conductor circuits 5, that have been formed on the bases 6 for transcription, as well as the electric components 10, that have been mounted on the conductor circuits 5, are buried in the resin layer 4 which is formed from the resin sheets 4a. At this time, in the case where no underfill is placed beneath the electric components 10, the process is carried out in a condition where the melted and softened the resin layer 4 are fluidized sufficiently so that an adequate amount of resin is filled between the electric components 10 and the bases 6 for transcription. In addition, the pressure at the time of molding needs to be set in accordance with the fluidity of the resin layer 4 when being melted and softened, and in the case where this level of fluidity when being melted and softened is high, for example, molding can be carried out easily using a vacuum laminator, while in the case where the level of fluidity when being melted and softened is low, molding can be carried out under pressure of up to approximately 2.94 MPa (30 kgf/cm$^2$) In addition, it is preferable to gradually increase the pressure from the point in time when resin sheets 4a have been melted and softened in order for the electric components 10 to be buried in the resin layer 4. Furthermore, it is preferable to carry out this heating and pressing molding under reduced pressure, or in a vacuum, and under such conditions, the possibility of voids being created internally is reduced, enhancing reliability.

Next, as shown in FIG. 1(*c*), the bases 6 for transcription are released from the resin layer 4 while the conductor circuits 5 are made to remain on the resin layer 4, and thereby, the wiring board sheet 1 (the wiring board sheet 1a) is gained. This wiring board sheet 1a is formed so that the conductor circuits 5 are buried in the surface layers on both sides of the resin layer 4, so as to be exposed from the surface of the resin layer 4, where the external surfaces of the resin layer 4 and the exposed surfaces of the conductor circuits 5 are in the same planes having flat surfaces without unevenness. In addition, the electric components 10, which are connected to the respective conductor circuits 5 on both sides, are buried in the resin layer 4.

The bases 6 for transcription can be released from the resin layer 4 by stripping the bases 6 for transcription, starting from edges of the resin layer 4. These bases 6 for transcription, after being released from the resin layer 4, can be utilized again in the manufacturing of the wiring board sheet 1, wherein conductor circuits 5 are formed on these bases after being cleaned by means of acid cleaning.

In the case where the above described heating and pressing molding is carried out, in the condition where the curing response of the resin layer 4 progresses, a wiring board (two-sided board) can be gained wherein conductor circuits 5 are placed on both sides and electrical connections 10, electrically connected to each of the conductor circuits 5, are buried in the insulation layer that is formed of the cured resin layer 4. Though the heating temperature at this time depends on the makeup of the resin composition that forms the resin layer 4, it is preferable to carry out the heating at a temperature ranging from 160° C. to 180° C.

In addition, in the case where the above described heating and pressing molding is carried out under conditions where the resin layer 4 is maintained in the B-stage, the gained wiring board sheet 1a can be utilized in the manufacturing of a multilayer board 11 as described below. Though the molding conditions at this time depend on the makeup of the resin composition that forms the resin layer 4, it is preferable to carry out the heating at a temperature ranging from 100° C. to 140° C. for 2 to 10 minutes. Furthermore, in the case where the wiring board sheet 1a is used as the core material for the formation of a multilayer board, the wiring board sheet 1a can be utilized for the manufacturing of a multilayer board 11 even when the resin layer 4 moves into the C-stage.

Figure 2:
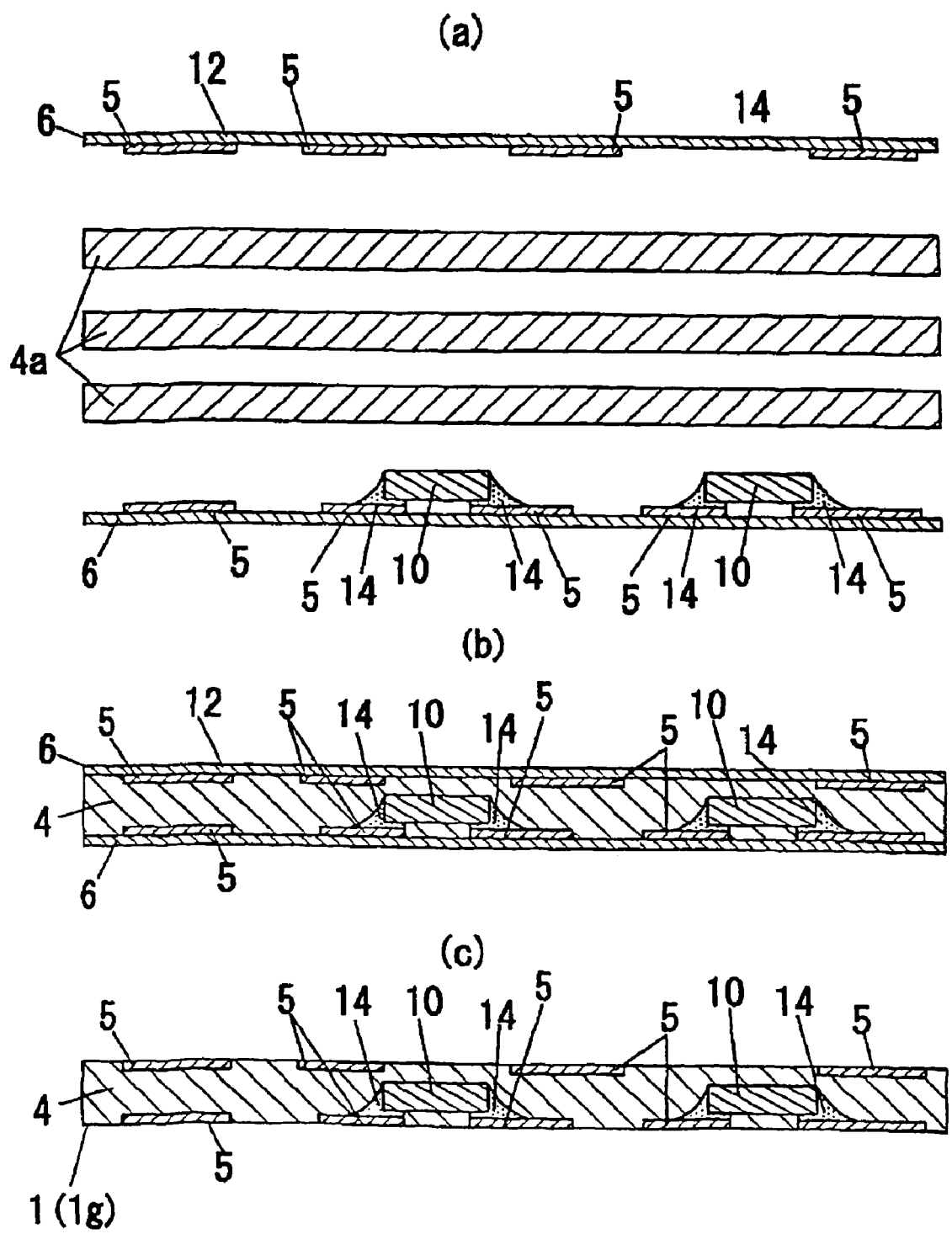
FIGS. 2(*a*) to 2(*c*) are cross sectional views showing another example of a manufacturing process for a wiring board sheet.

FIGS. 2(*a*) to 2(*c*) show another example of a manufacturing process for the wiring board sheet 1, wherein resin sheets 4a; the base 6 for transcription on a surface of which the conductor circuit 5, to be later transcribed, has been formed, and the electric components 10 have been mounted; and the base 6 for transcription on a surface of which the conductor circuit 5, to be later transcribed, has been formed, and no electric components 10 have been mounted, are used so that conductor circuits 5 can be transcribed from the bases 6 for transcription to the resin layer 4 that is formed of resin sheets 4a, and thereby, the wiring board sheet 1 (the wiring board sheet 1g) is formed wherein conductor circuits 5 are formed on both sides of the wiring board sheet, and electrical connections 10, mounted on the conductor circuit 5 on one side, are buried in the resin layer 4.

First, as shown in FIG. 2(*a*), the base 6 for transcription where the conductor circuit 5 has been formed and the electric components 10 have been mounted, and the base 6 for transcription where the conductor circuit 5 has been formed and no electric components 10 have been mounted, are placed so that the surfaces on which conductor circuits 5 have been formed are opposite to each other and resin sheets 4a are placed between the bases, and subsequently, the bases and the resin sheets are layered. One or more resin sheets 4a are placed, and this number is dependent on the dimensions of the electric components 10. Heating and pressing molding is carried out in this condition, and thereby, the layers are integrated. This heating and pressing molding can be carried out in the same conditions as in the above described case.

In this molding process, resin sheets 4a are melted and softened. At this time, in the case where two or more resin sheets 4a are layered, these resin sheets 4a are integrated, and these melted and softened resin sheets are fluidized so that conductor circuits 5 that have been formed on the bases 6 for transcription and the electric components 10 that have been mounted on the conductor circuit 5 are buried in the resin layer 4 which are formed of resin sheets 4a.

Next, as shown in FIG. 2(*c*), the bases 6 for transcription are released from the resin layer 4 while conductor circuits 5 are made to remain on the resin layer 4, and thereby, the wiring board sheet 1 (the wiring board sheet 1g) is gained. This wiring board sheet 1g is formed in a manner where conductor circuits 5 are buried in the surface layers on both sides of the resin layer 4 so that conductor circuits 5 are exposed from the surfaces of the resin layer 4. In addition, the external surfaces of the resin layer 4 and the exposed surfaces of conductor circuits 5 are in the same planes where the surfaces are flat without unevenness. Furthermore, the electric components 10 which are connected to the conductor circuit 5 on one side are buried in the resin layer 4. The bases 6 for transcription can be released from the resin layer 4 by stripping the bases 6 for transcription starting from edges of the resin layer 4.

When the above described heating and pressing molding is carried out under a condition where the curing response of the resin layer 4 progresses, a wiring board (two-sided board) can be gained wherein the conductor circuit 5 is placed on one side and the electric components 10 electrically connected to the conductor circuit 5 are buried in the insulation layer that is formed of the cured resin layer 4. The heating temperature at this time can be made the same as in the above described cases.

In addition, in the case where the above described heating and pressing molding is carried out in the condition where the resin layer 4 is maintained in the B-stage, the gained wiring board sheet 1g can be utilized in the manufacturing of multilayer board 11 as described below. The molding conditions at this time can be made the same as in the above described cases. Furthermore, in the case where the wiring board sheet 1g is used as the core material at the time of the formation of a multilayer board, the wiring board sheet can be utilized for the manufacturing of multilayer board 11 even when the resin layer 4 moves to the C-stage.

In addition, as shown in FIGS. 1(c) and 2(c), the through holes 3 which are filled with conductive material 2 can, additionally, be created after the bases 6 for transcription have been released from the resin layer 4, and thereby, the wiring board sheet 1 (the wiring board sheet 1b) can be gained. One example of such a process is shown in FIGS. 3(a) to 3(d)

Figure 3:
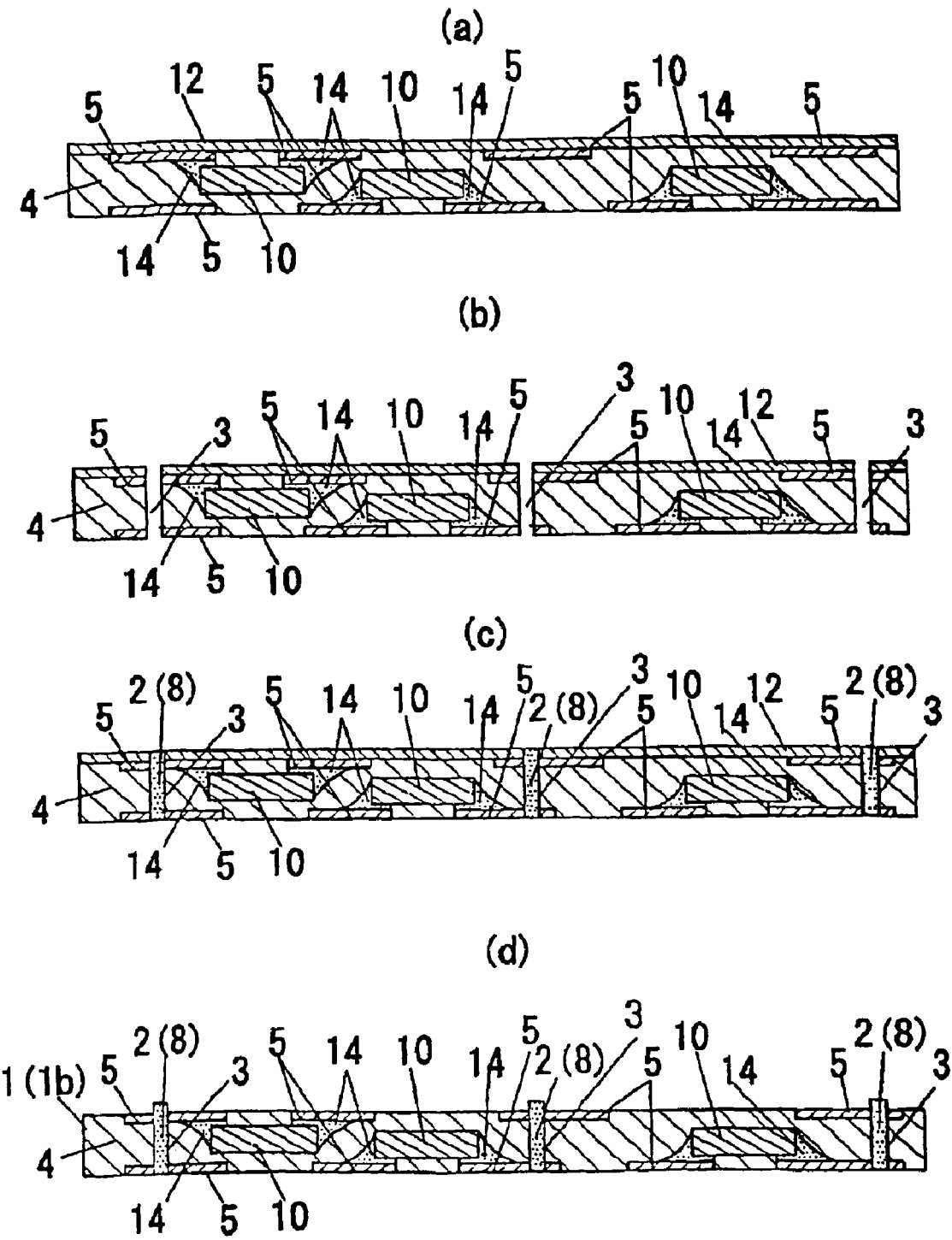
FIGS. 3(*a*) to 3(*d*) are cross sectional views showing another example of a manufacturing process for a wiring board sheet.

First, as shown in FIG. 3(a), a protective film 12 is layered and placed on one surface of the resin layer 4 of the wiring board sheet shown in FIG. 1(c) to which the conductor circuit 5 has been transcribed. A synthesized resin film such as a PET film, or a metal foil, can be used as the protective film 12. In the case where a metal foil is used, it is preferable to make the surface on which the resin layer 4 is formed a mirror surface in order to improve the release properties of the protective film 12 at the time when the protective film 12 is released from the resin layer 4. A material that allows for the creation of the through holes 3 at the time of laser processing is selected as such a metal foil, and it is preferable to use a rolled copper foil, an electrolytic copper foil, an aluminum foil, a metal allow foil, a metal clad foil, or the like, and a foil to which adhesive has been applied to a surface is preferable.

Next, as shown in FIG. 3(b), the through holes 3 are created in predetermined positions of the resin layer 4 for creating via holes by means of laser processing. These through holes 3 are created so as to penetrate predetermined portions of the resin layer 4, the protective film 12 and conductor circuits 5 on both sides of the resin layer 4. At this time, the protective film 12 side is irradiated with a laser beam preventing the resin layer 4 and conductor circuits 5 from being directly irradiated with the laser beam, so that the protective film 12 can be prevented from being released from the resin layer 4 due to the laser beam.

After the creation of the through holes 3, as shown in FIG. 3(c), the through holes 3 are filled in with conductive material 2 from the external surface side of the protective film 12. The conductive paste 8 can be used as this conductive material 2, which is, for example, a thermosetting resin composition into which conductive powder such as silver or copper powder has been mixed. In order to fill the through holes 3 with the conductive paste 8, the conductive paste 8 is applied to the external surface of carrier base 7 so that the conductive paste 8 fills the through holes 3 from the openings of the through holes 3. At this time, the external surface of the resin layer 4 is protected by carrier base 7 by not allowing the conductive paste 8 to adhere to the external surface of the resin layer 4, and subsequently, the protective film 12 to the external surface of which the conductive paste 8 has adhered is released from the resin layer 4 side as shown in FIG. 3(d) after the through holes have been filled with the conductive paste 8. As a result, a condition is achieved wherein the through holes 3 are filled in with the conductive paste 8 and the conductive paste 8 is not adhered to the external surfaces of the resin layer 4 and conductor circuits 5. In addition, the conductive paste 8 that has filled in the through holes 3 of carrier base 7 remains in a manner where the conductive paste 8 protrudes outward from the through holes 3 of the resin layer 4 on the side to which the protective film 12 has been adhered.

Here, the through holes 3 filled with conductive material 2 are created after the conductor circuit 5, on which the electric components 10 have been mounted, has been transferred to the resin layer 4, because the resin layer 4 are fluidized as the electric components 10 are buried into the resin layer 4 at the time when the conductor circuit 5, on which the electric components 10 have been mounted, are transferred to the resin layer 4, and at this time, there is a risk of the shapes of the through holes 3 being deformed in the case where the through holes 3 have been created. In order to prevent deformation of the through holes 3, created in order to form such via holes, the through holes 3 are created after the electric components 10 have been buried in the resin layer 4.

The wiring board sheet 1b is formed as described above, wherein conductor circuits 5 are buried in the surface layers on both sides of the resin layer 4 so that conductor circuits 5 are exposed from the surfaces of the resin layer 4, and in addition, the electric components 10, which are connected to the respective conductor circuits 5 on both sides, are buried in the resin layer 4. Furthermore, the through holes 3 are created so as to penetrate the resin layer 4 and conductor circuits 5, and so as to be filled with the conductive paste 8. The surfaces of this wiring board sheet 1b are formed into a flat state without unevenness except for the conductive paste 8 protruding from the surfaces where the external surfaces of the resin layer 4 and the exposed surfaces conductor circuits 5 are in the same planes.

A single wiring board sheet 1b, gained in the above described manner, can be used in the manufacturing of a wiring board. In this case, the above described heating and pressing molding, at the time of transcription of conductor circuits 5, on which the electric components 10 have been mounted to the resin layer 4, may be carried out in conditions where the curing response of the resin layer 4 progresses, or where such curing response does not progress, and additional heating and pressing molding is carried out on the gained wiring board sheet 1b in order to gain a wiring board (two-sided board) wherein the resin layer 4 is cured in the case that this has been kept in the B-stage, and the conductive paste 8 is cured so that conductor circuits 5 are gained on both sides of the wiring board while the electric components 10, that are electrically connected to the respective conductor circuits 5, are mounted in the insulation layer that is formed of the cured resin layer 4, and in addition, conductor circuits 5, on both sides of the wiring board, are connected to each other through via holes that are formed from the cured conductive paste 8 within the through holes 3.

During this molding process, the protruding portions of the conductive paste 8 are pressed into the through holes 3 by applying pressure so that the conductive paste in the through holes is compressed, and thereby, the reliability of the connections of the via holes is increased.

In addition, in the case where the above described heating and pressing molding at the time when conductor circuits 5 on which the electric components 10 have been mounted are transferred to the resin layer 4, is carried out in the condition where the resin layer 4 and the conductive paste 8 are maintained in the B-stage, the gained wiring board sheet 1b can be utilized for the manufacturing of multilayer board 11 as described below. In this case, the above described protrusions of the conductive paste 8 contribute to the increase in conductivity of via holes 15 in multilayer board 11 as described below. In addition, in the case where the wiring board sheet 1b is used as the core material at the time of the formation of a multilayer board, the wiring board sheet can be utilized for the manufacturing of multilayer board 11 even when the resin layer 4 is in the C-stage.

FIGS. 4(a) to 4(c) shows another example of the manufacturing process for the wiring board sheet 1, wherein resin sheets 4a, and the base 6 for transcription, where the conductor circuit 5, to be later transcribed, has been formed on a surface, are used so that the conductor circuit 5 is transcribed from the base 6 for transcription to the resin layer 4 formed of resin sheets 4a, and thereby, the wiring board sheet 1 (the wiring board sheet 1c) is formed wherein the conductor circuit 5 is formed on one side of the wiring board sheet and the electric components 10, mounted on this conductor circuit 5, are buried in the resin layer 4.

First, as shown in FIG. 4(a), resin sheets 4a are placed and layered on the base 6 for transcription, on which the conductor circuit 5 has been formed, and the electric components 10 have been mounted on this conductor circuit 5 on the side on which this conductor circuit 5 has been formed on the surface. One or more resin sheets 4a are used in accordance with the dimensions of the electric components 10. Heating and pressing molding is carried out in this condition, and thereby, the resin sheets and the conductor circuit are integrated. This heating and pressing molding can be carried out in the same conditions as in the above described cases.

In this molding process, resin sheets 4a are melted and softened. At this time, in the case where two or more resin sheets 4a are layered, these resin sheets 4a are integrated and these melted and softened resin sheets 4a are fluidized, and thereby, the conductor circuit 5, formed on the base 6 for transcription, and the electric components 10, mounted on the conductor circuit 5, are buried in the resin layer 4 formed of resin sheets 4a.

Next, as shown in FIG. 4(c), the base 6 for transcription is released from the resin layer 4 while the conductor circuit 5 is made to remain in the resin layer 4, and thereby, a wiring board sheet 1c is gained. This wiring board sheet 1c is formed in a manner where the conductor circuit 5 is buried in a surface layer on one side of the resin layer 4 so that the conductor circuit 5 is exposed from the surface of the resin layer 4. In addition, the external surface of the resin layer 4, and the exposed surface of the conductor circuit 5, are in the same plane, and are formed into a flat state without unevenness. In addition, the electric components 10, connected to the conductor circuit 5 on one side, are buried in the resin layer 4. The base 6 for transcription can be released from the resin layer 4 by stripping the base 6 for transcription starting from an edge of the resin layer 4.

In the case where the above described heating and pressing molding is carried out in the condition where the curing response of the resin layer 4 progresses, a wiring board (one-sided board) can be gained, wherein the conductor circuit 5 is gained on one side of the wiring board, and the electric components 10, electrically connected to the conductor circuit 5, are buried in the insulation layer formed of the cured resin layer 4. The heating temperature at this time can be set at the same temperature as in the above described cases.

In addition, in the case where the above described heating and pressing molding is carried out in the condition where the resin layer 4 is maintained in the B-stage, the gained wiring board sheet 1 can be utilized for the manufacturing of multilayer board 11 as described below. The molding conditions at this time can be set at the same levels as in the above described cases. Furthermore, in the case where the wiring board sheet 1 is used as the core material at the time of forming a multilayer board, the wiring board sheet can be utilized for the manufacturing of multilayer board 11, even when the resin layer 4 is in the C-stage.

In addition, as shown in FIG. 4(c), the wiring board sheet 1 (the wiring board sheet 1d) can be gained where the through holes 3 are created in the resin layer 4, to which the conductor circuit 5, on which the electric components 10 have been mounted, has been transferred, and furthermore, the through holes 3 are filled with conductive material 2. An example of this process is shown in FIG. 5.

First, as shown in FIG. 5(a), the protective film 12 is layered and placed on the side of the resin layer 4, to which the conductor circuit 5 has been transcribed, where the conductor circuit 5 has not been formed on the surface. The same protective film as described above can be used as the protective film 12.

Next, as shown in FIG. 5(b), the through holes 3 are created in predetermined positions where via holes are to be formed on the resin layer 4 by means of laser processing. These through holes 3 are created so as to penetrate predetermined positions of the resin layer 4, the protective film 12 and the conductor circuit 5 on one side of the resin layer 4. At this time, the protective film 12 side is irradiated with a laser beam, and thereby, the protective film 12 can be prevented from being released from the resin layer 4 due to the laser beam.

After the creation of the through holes 3, as shown in FIG. 5(c), the through holes 3 are filled with conductive material 2 from the external surface side of the protective film 12. The conductive paste 8 can be used as this conductive material 2, which is, for example, a thermosetting resin composition into which conductive powder, such as silver or copper powder, has been mixed. The through holes 3 are filled with the conductive paste 8 from the openings of the through holes 3, by applying the conductive paste 8 to the external surface of carrier base 7, in order to fill the through holes with the conductive paste 8. At this time, the external surface of the resin layer 4 is protected by carrier base 7 by not allowing the conductive paste 8 to adhere to the external surface of the resin layer 4, and subsequently, as shown in FIG. 5(d), the protective film 12, where the conductive paste 8 has adhered to the external surface, is released from the resin layer 4 side after the through holes have been filled with the conductive paste 8, and thereby, a condition is achieved where the through holes 3 are filled with the conductive paste 8, and no conductive paste 8 is adhered to the external surfaces of the resin layer 4 and the conductor circuit 5. In addition, the conductive paste 8 that has filled in the through holes 3 of carrier base 7 remains, and therefore, the conductive paste 8 protrudes outward from the through holes 3 of the resin layer 4 on the surface, on the side where the protective film 12 has been adhered (the surface on the side where the conductor circuit 5 has not been formed).

In the wiring board sheet 1d that is gained as described above, the conductor circuit 5 is buried in a surface layer on one side of the resin layer 4 so that the conductor circuit 5 is exposed from the surface of the resin layer 4 and the electric components 10 are connected to the conductor circuit 5 on one side of the resin layer 4 and are buried in the resin layer 4, wherein the through holes 3 are created so as to penetrate the resin layer 4 and the conductor circuit 5 on one side of the resin layer 4, and are filled in with the conductive paste 8. The surface of this wiring board sheet 1b is formed into a flat state without unevenness, except for the protruding conductive paste 8, where the external surface of the resin layer 4 and the exposed surface of the conductor circuit 5 are in the same plane.

Here, after the conductor circuit 5, on which the electric components 10 have been mounted, has been transcribed to the resin layer 4, the through holes 3 filled with conductive material 2 are created, because the resin layer 4 is fluidized as the electric components 10 are buried into the resin layer 4 at the time when the conductor circuit 5, on which the electric components 10 have been mounted, is transcribed to the resin layer 4, and at this time, in the case where the through holes 3 have been created, there is a risk of the shapes of the through holes 3 being deformed to a large extent. In order to prevent such deformation of the through holes 3, created to form via holes 15, the through holes 3 are created after the electric components 10 have been buried in the resin layer 4.

Here, in the case where the above described heating and pressing molding is carried out in the condition where the resin layer 4 is maintained in the B-stage, this wiring board sheet 1d can be utilized for the manufacturing of multilayer board 11 as described below. The molding conditions at this time can be set at the same levels as in the above described cases. In addition, in the case where the wiring board sheet 1d is used as the core material for forming a multilayer board, the wiring board sheet can be utilized for the manufacturing of multilayer board 11, even when the resin layer 4 is in the C-stage.

In addition, as shown in FIG. 5(d), the metal foil 9 can be layered on the surface of the resin layer 4, to which the conductor circuit 5, on which the electric components 10 have been mounted, has been transcribed, where the conductor circuit has not been formed so that the wiring board sheet 1 (the wiring board sheet 1e) can be gained. FIGS. 6(a) and 6(b) show an example of such a process.

First, as shown in FIG. 6(a), the metal foil 9 is layered and placed on the surface of the resin layer 4 on the side where the conductor circuit 5 has not been formed. An appropriate metal foil, for example, a copper foil, can be used as the metal foil 9. It is preferable for the thickness of this foil to be in the range of 10 µm to 150 µm. In addition, it is preferable for the surface of this metal foil 9 on which the resin layer 4 is formed to be a rough surface in order to ensure the adhesiveness vis-à-vis the resin layer 4. In the case where an electrolytic copper foil, for example, is used as the metal foil 9, the resin layer 4 can be formed on the rough surface of the electrolytic copper foil, which has been originally formed having a rough surface. In addition, a surface roughening treatment by means of, for example, a blackening treatment or an alumite treatment can be cited as this surface treatment. Heating and pressing molding is carried out in this condition, and thereby, the metal foil and the resin layer are layered and integrated as shown in FIG. 6(b).

In this molding process, the metal foil 9 is electrically connected to the conductive paste 8 that has filled the through holes 3. In addition, the portions of the conductive paste 8 protruding from the through holes 3 are pressed into the through holes 3 by applying pressure so as to compress the conductive paste within the through holes 3, and thereby, the conductivity of the conductive paste 8 within the through holes 3 increases.

In the wiring board sheet 1e that is gained as described above, the conductor circuit 5 is buried in a surface layer on one side of the resin layer 4 so that the conductor circuit 5 is exposed from the surface of the resin layer 4, and the metal foil 9 is layered on the other side, wherein the electric components 10 connected to the conductor circuit 5 on one side of the resin layer 4 is buried in the resin layer 4. In addition, the external surface of the resin layer 4 and the exposed surface of the conductor circuit 5 are in the same plane so that the surface of the wiring board sheet 1e is formed into a flat state without unevenness. Furthermore, the through holes 3 are created so as to penetrate the resin layer 4 and the conductor circuit 5 and are filled in with the conductive paste 8 so as to be connected to the metal foil 9.

In the case where the heating and pressing molding at the time of forming the above described layer of the metal foil 9 is carried out in the condition where the curing response of the resin layer 4 and the conductive paste 8 progresses, a wiring board can be gained, wherein the metal foil 9 is placed on one surface, and the conductor circuit 5 is placed on the other surface while the electric components 10, which are electrically connected to the conductor circuit 5, are buried in the insulation layer formed of the cured resin layer 4, and furthermore, the conductor circuit 5 and the metal foil 9 are connected through via holes made of the through holes 3 and filled with a conductive layer formed of the cured conductive paste 8. These molding conditions can be set at the same levels as in the above described cases. In addition, circuits can be formed from the metal foil 9 of this wiring board by carrying out an etching treatment.

In addition, in the case where the above described heating and pressing molding, at the time of forming the layered metal foil 9, is carried out in the condition where the resin layer 4 and the conductive paste 8 are maintained in the B-stage, the gained wiring board sheet 1 can be utilized for the manufacturing of multilayer board 11 as described below. These molding conditions can be set at the same levels as in the above described cases. Furthermore, in the case where the wiring board sheet 1 is used as the core material, at the time of forming a multilayer board, the wiring board sheet can be utilized for the manufacturing of multilayer board 11 even when the resin layer 4 is in the C-stage.

In addition, the wiring board sheet 1 (the wiring board sheet 1f) can be gained by forming, through transcription, an additional conductor circuit 5 on the surface, on which the conductor circuit 5 has not been formed, of the resin layer 4 shown in FIG. 5(d) to which the conductor circuit 5, on which the electric components 10 have been mounted, has been transcribed. FIGS. 7(a) and 7(b) show an example of such a process.

First, as shown in FIG. 7(a), a base 6 for transcription on which a conductor circuit 5 has been formed is layered and placed on the surface of a resin layer 4, on the side where no conductor circuit 5 has been formed, in the condition where the through holes 3 and the conductor circuit 5 are positioned on each other, so that the surface on which the conductor circuit has been formed is opposed to resin layer 4. A base for transcription that has been formed as described above is used as the base 6 for transcription on which the conductor circuit 5 has been formed.

Heating and pressing molding is carried out in this condition, and thereby, the base for transcription and the resin layer are layered and integrated, wherein the conductor circuit 5 and the through holes 3 are positioned on each other so that predetermined portions of the conductor circuit 5 are placed at the positions of the openings of the through holes 3.

In this molding process, the conductor circuit 5, placed on the base 6 for transcription, is electrically connected to the conductive paste 8 that fills the through holes 3. In addition, the portions of the conductive paste 8 protruding from the through holes 3 are pressed into the through holes 3 by applying pressure so that the conductive paste is compressed within the through holes 3, and thereby, the conductivity of the conductive paste 8 within the through holes 3 is enhanced.

Next, as shown in FIG. 7(b), the base 6 for transcription is released from resin layer 4 while the conductor circuit 5 is made to remain in the resin layer 4, and thereby, a wiring board sheet 1f is gained.

In the wiring board sheet 1f that is gained as described above, the conductor circuits 5 are buried in the surface layers on both sides of the resin layer 4 so that the conductor circuits 5 are exposed from the surfaces of the resin layer 4, and the electric components 10, connected to the conductor circuit 5 on one side of the resin layer 4, is buried in the resin layer 4. Furthermore, through holes 3 are created so as to penetrate the resin layer 4 and the conductor circuit 5 on one side of the resin layer 4, and so as to be filled in with the conductive paste 8 that is connected to the conductor circuit 5 on the other side of the resin layer 4. The surfaces of this wiring board sheet 1f are formed into a flat state without unevenness in a manner where the external surfaces of the resin layer 4 and the exposed surfaces of the conductor circuits 5 are in the same planes.

In the case wherein the above described heating and pressing molding at the time of forming the conductor circuits 5 through transcription is carried out in the condition where the curing response of resin layer 4 and the conductive paste 8 progresses, a wiring board can be gained wherein conductor circuits 5 are placed on both sides and the electric components 10, that are electrically connected to the conductor circuit 5 on one side of the resin layer 4, are buried in the insulation layer formed of the cured resin layer 4, and wherein the conductor circuits 5 are connected to each other through the via holes made by having through holes 3 being filled with conductive layers formed of the cured conductive paste 8. These molding conditions can be set at the same levels as in the above described cases.

In the case where the heating and pressing molding at the time of forming the above described layer of the metal foil 9 is carried out in the condition where the resin layer 4 and the conductive paste 8 are maintained in the B-state, the gained wiring board sheet 1 can be utilized for the manufacturing of multilayer board 11 as described below. These molding conditions can be set at the same levels as in the above described cases. In addition, in the case where the wiring board sheet 1 is used as the core material at the time of forming a multilayer board, the wiring board sheet can be utilized for the manufacturing of multilayer board 11 even when the resin layer 4 is in the C-stage.

FIGS. 8(a) to 8(c) show another example of a manufacturing process for a wiring board sheet 1, wherein resin sheets 4a; a base 6 for transcription where a conductor circuit 5, to be later transcribed, has been formed on a surface and the electric components 10 have been mounted; and a metal foil 9, such as a copper foil, are used in a manner where the conductor circuit 5 is transcribed from the base 6 for transcription to a resin layer 4 that is formed of the resin sheets 4a, and thereby, a wiring board sheet 1 (wiring board sheet 1h) is formed, wherein the conductor circuit 5 is formed on one surface of the resin layer, and the electric components 10, that have been mounted on this conductor circuit 5 on the surface, are buried in the resin layer 4 while the metal foil 9 is layered on and integrated with the other surface of the resin layer.

An appropriate metal foil, for example, a copper foil, can be used as the metal foil 9. It is preferable for the thickness of this metal foil to be in the range of 10 μm to 150 μm. In addition, it is preferable for the surface of this metal foil 9, on which the resin layer 4 is formed, to be a rough surface in order to ensure the adhesiveness vis-à-vis the resin layer 4. In the case where an electrolytic copper foil, for example, is used as the metal foil 9, the resin layer 4 can be formed on the rough surface of the electrolytic copper foil that has been originally formed having a rough surface. In addition, a surface treatment can be carried out on the metal foil 9 and a surface roughening treatment by means of, for example, a blackening treatment or an alumite treatment can be cited as this surface treatment.

First, as shown in FIG. 8(a), a base 6 for transcription, where a conductor circuit 5 is formed and the electric components 10 have been mounted, and a metal foil 9, are placed so that the surface of the base 6 for transcription on which the conductor circuit 5 has been formed is opposed to (the rough surface of) the metal foil 9 and resin sheets 4a are placed between the base for transcription and the metal foil, and then, the base for transcription, the resin sheets and the metal foil are layered. One or more resin sheets 4a are used in accordance with the dimensions of the electric components 10. Heating and pressing molding is carried out in this condition, and thereby, the base for transcription, the resin sheets and the metal foil are integrated. This heating and pressing molding can be carried out in the same conditions as in the above described cases.

In this molding process, resin sheets 4a are melted and softened. At this time, in the case where two or more resin sheets 4a are layered, these resin sheets 4a are integrated and these melted and softened resin sheets 4a are fluidized, and thereby, the conductor circuit 5 formed on the base 6 for transcription and the electric components 10, formed on the conductor circuit 5, are buried in the resin layer 4 formed of the resin sheets 4a.

Next, as shown in FIG. 8(c), the base 6 for transcription is released from the resin layer 4 while the conductor circuit is made to remain in the resin layer 4, and thereby, a wiring board sheet 1h is gained. This wiring board sheet 1h is formed in a manner where the conductor circuit 5 is buried in a surface layer on one side of the resin layer 4 so that the conductor circuit 5 is exposed from the surface of the resin layer 4 while a metal foil 9 is formed on and integrated with the entire surface on the other side of the resin layer. In addition, the external surface of the resin layer 4 and the exposed surface of the conductor circuit 5 are in the same plane, and the surfaces are formed into a flat state without unevenness. Furthermore, the electric components 10, that have been connected to the conductor circuit 5 on one side of the resin layer 4, is buried in the resin layer. The base 6 for transcription can be released from the resin layer 4 by stripping the base 6 for transcription from the resin layer 4 starting from an edge of the resin layer 4.

In the case where the above described heating and pressing molding is carried out in the condition where the curing response of the resin layer 4 progresses, the conductor circuit 5 is placed on the surface of one side of the resin layer and the metal foil 9 is formed on the entire surface of the other side so that a wiring board can be gained where the electric components 10, which are electrically connected to the conductor circuit 5, are buried in the insulation layer formed of the cured resin layer 4. The heating temperature at this time can be set at the same temperature as in the above described cases.

In addition, in the case where the above described heating and pressing molding is carried out in the condition where the resin layer 4 is maintained in the B-stage, the gained wiring board sheet 1h can be utilized for the manufacturing of the multilayer board 11 as described below. The molding conditions at this time can be set at the same levels as in the above described cases. Furthermore, in the case where the wiring board sheet 1h is used as the core material at the time of forming a multilayer board, the wiring board sheet can be utilized for the manufacturing of the multilayer board 11 even when the resin layer 4 is in the C-stage.

FIGS. 9(a) to 9(c) shows another example of a manufacturing process for a wiring board sheet 1, wherein resin sheets 4a; a base 6 for transcription where a conductor circuit 5, to be later transcribed, is formed on a surface and electric components 10 are mounted; and a metal foil 17 with resin are used so that the conductor circuit 5 is transcribed from the base 6 for transcription to the resin layer 4 formed of the resin sheets 4a, and thereby, a wiring board sheet 1 (wiring board sheet 1i) is formed where the conductor circuit 5 is formed on one surface and the electric components 10 mounted on this conductor circuit 5 on the surface are buried in the resin layer 4 and the metal foil 9 is layered on and integrated with the other surface.

An appropriate metal foil, for example, a copper foil, can be used for the metal foil 9 that forms the metal foil 17 with resin. It is preferable for the thickness of this foil to be in the range of 10 µm to 150 µm. In addition, it is preferable for the surface of this metal foil 9 on which the resin layer 4 is formed to be a rough surface in order to ensure the adhesiveness vis-à-vis the resin layer 4. In the case where an electrolytic copper foil, for example, is used as the metal foil 9, the resin layer 4 can be formed on the rough surface of the electrolytic copper foil, which has originally been formed having a rough surface. In addition, a surface treatment can be carried out on the metal foil 9 and a surface roughening treatment by means of, for example, a blackening treatment or an alumite treatment can be cited as this surface treatment.

In addition, the resin layer 4b that forms the metal foil 17 with resin can be formed using a resin composition that is similar to the resin composition for forming the above described resin layer 4 and, for example, such a resin composition is applied to one surface (rough surface) of the metal foil 9 and is then dried so as to be converted to the B-stage so that the resin layer 4b is formed and the metal foil 17 with resin can be gained.

First, as shown in FIG. 9(a), the base 6 for transcription where the conductor circuit 5 has been formed and the electric components 10 have been mounted; and the metal foil 17 with resin are placed so that the surface of the base 6 for transcription on which the conductor circuit 5 has been formed and the resin 4b of the metal foil 17 with resin are opposite to each other and one or more resin sheets 4a are placed between the base for transcription and the metal foil so that the base for transcription, the resin sheets and the metal foil are layered. One or more resin sheets 4a are used in accordance with the dimensions of the electric components 10. Heating and pressing molding is carried out in this condition so that the layers are integrated. This heating and pressing molding can be carried out in the same conditions as in the above described cases.

In this molding process, the resin sheets 4a and the resin layer 4b of the metal foil 17 with resin are melted and softened so as to be integrated to form the resin layer 4. At this time, in the case where two or more resin sheets 4a are layered, these resin sheets 4a are integrated and the conductor circuit 5 formed on the base 6 for transcription and the electric components 10 mounted on the conductor circuit 5 are buried in the resin layer 4 that is formed of the resin sheets 4a due to the fluidity of these melted and softened resin sheets 4a.

Next, as shown in FIG. 9(c), the base 6 for transcription is released from the resin layer 4 while the conductor circuit 5 is made to remain in the resin layer 4, and thereby, a wiring board sheet 1i is gained. This wiring board sheet 1i is formed in a manner where the conductor circuit 5 is buried in a surface layer on one side of the resin layer 4 so that the conductor circuit 5 is exposed from the surface of the resin layer 4 and the metal foil 9 is formed on and integrated with the entire surface on the other side. Furthermore, the external surface of the resin layer 4 and the exposed surface of the conductor circuit 5 are in the same plane and the surfaces are formed into a flat state without unevenness. In addition, the electric components 10 connected to the conductor circuit 5 on one side of the resin layer 4 are buried in the resin layer 4. The base 6 for transcription can be released from the resin layer 4 by stripping the base 6 for transcription from the resin layer 4 starting from an edge of the resin layer 4.

The above described heating and pressing molding is carried out in the condition where the curing response of the resin layer 4 progresses so that a wiring board can be gained wherein the conductor circuit 5 placed on a surface on one side of the resin layer 4 and the metal foil 9 is formed on the entire surface on the other side and wherein the electric components 10 that are electrically connected to the conductor circuit 5 are buried in the insulator layer that is formed of the cured resin layer 4. The heating temperature at this time can be set at the same temperature as in the above described cases.

In addition, in the case where the above described heating and pressing molding can be carried out in the condition where the resin layer 4 is maintained in the B-stage, the gained wiring board sheet 1 can be utilized for the manufacturing of a multilayer board 11 as described below. The molding conditions at this time can be set at the same levels as in the above described cases. In addition, in the case where the wiring board sheet 1 is used as the core material at the time of forming a multilayer board, the wiring board sheet can be utilized for the manufacturing of the multilayer board 11 even when the resin layer 4 is in the C-stage.

With regards to the wiring board sheet 1h, 1i that has been formed in this manner, in the case where wiring board sheets 1 having resin layers 4 in which electric components 10 have been buried are layered so as to become multilayered, metal foils 9 of the wiring board sheets 1h, 1i are formed as the earth layer between the layers for preventing the occurrence of the interaction between electric components 10 in separate layers adjacent to each other so that the electric components 10 can function exhibiting predetermined standard values. In addition, particularly in the case of wiring board sheets 1i, the fluidity of the resin layers 4b are controlled when the curing of the resin layers 4b of the metal foil 17 with resin has been made to progress to a certain extent before the wiring board sheets are layered in the layer forming process so that it becomes easy to secure the dimensions between the electric components 10 and the metal foils 9, and the distance between the electric components 10 and the earth layer made of the metal foils 9 can be secured at the time when the layers are formed of the above described wiring board sheets 1 in a manner where the occurrence of the interaction between the electric components 10 in separate layers adjacent to each other can be prevented without fail. In order to make the curing of the resin layer 4b of a metal foil 17 with resin progress to a certain extent, this resin layer 4b is for example, dried in advance for approximately five minutes at 160° C.

In addition, through holes 3 filled with conductive material 2 are additionally created in a wiring board sheet 1 as shown in FIG. 8(c) or FIG. 9(c), and thereby, a wiring board sheet 1 (wiring board sheet 1j) can be gained. FIGS. 10(a) to 10(d) show an example of such a process.

First, as shown in FIG. 10(a), a protective film 12 is layered and placed on a surface on one side, to which the conductor circuit 5 has been transcribed, of the resin layer 4 where the conductor circuit 5 has been transcribed to one surface and the metal foil 9 has been formed on the other side of the surface. The same protective films as described above are used as the protective film 12.

Figure 10:
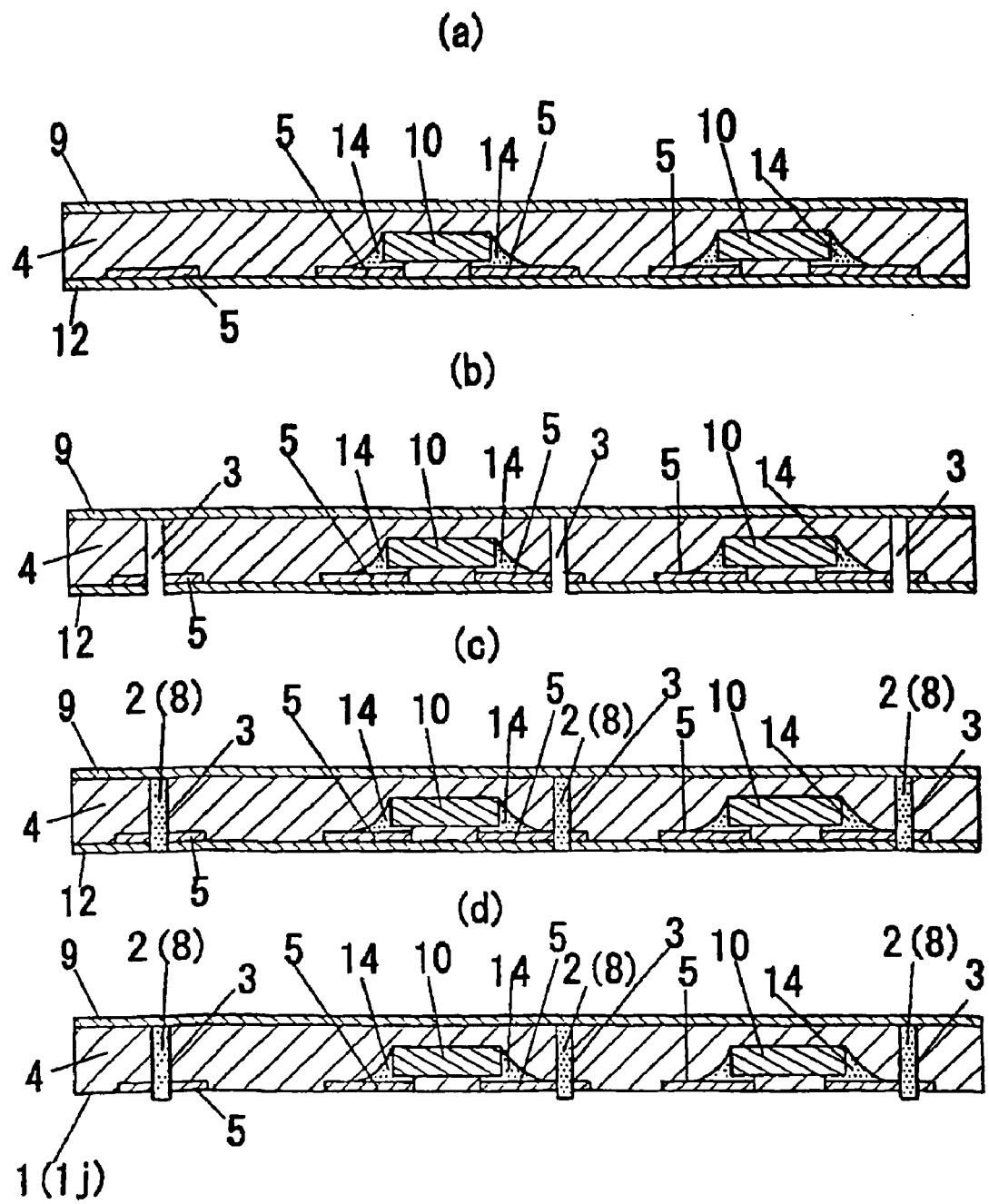
FIGS. 10(*a*) to 10(*d*) are cross sectional views showing still another example of a manufacturing process for a wiring board sheet.

Next, as shown in FIG. 10(*b*), through holes 3 are created in predetermined positions for forming via holes of the resin layer 4 by means of laser processing. These through holes 3 are created so as to penetrate predetermined portions of the resin layer 4, the protective film 12 and the conductor circuit 5 on one side of the resin layer 4 and so as not to penetrate the metal foil 9. At this time, the protective film 12 side is irradiated with a laser beam so that the laser beam does not penetrate the metal foil 9 and the protective film 12 can be prevented from being released from the resin layer 4 due to the laser beam.

After the creation of through holes 3, as shown in FIG. 10(*c*), through holes 3 are filled with conductive material 2 from the external, surface side of the protective film 12. The above described conductive paste 8 can be used as this conductive material 2. The through holes 3 are filled in with the conductive paste 8 by applying the conductive paste 8 to the external surface of the carrier base 7 so that the through holes 3 are filled in with the conductive paste 8 from the openings of the through holes 3. At this time, the external surface of the resin layer 4 is protected by the carrier base 7 so that the conductive paste 8 is not adhered to the external surface of the resin layer 4 and subsequently, as shown in FIG. 10(*d*), the protective film 12 where the conductive paste 8 has been adhered to the external surface is released from the resin layer 4 side after the through holes are filled in with the conductive paste 8, and thereby, a condition is achieved where the through holes 3 are filled in with the conductive paste 8 and the conductive paste 8 is not adhered to the external surfaces of the resin layer 4 and the conductor circuit 5. In addition, the conductive paste 8 that has filled the through holes 3 of the protective film 12 remains, and therefore, the wiring board sheet is formed where the conductive paste 8 protrudes outward from the through holes 3 of the resin layer 4 on the surface to which the protective film 12 has been adhered (the surface on the side where the conductor circuit 5 has been formed).

In the wiring board sheet 1*j* gained in this manner, the conductor circuit 5 is buried in a surface layer on one side of resin layer 4 so that the conductor circuit 5 is exposed from the surface of resin layer 4 and the metal foil 9 has been formed on and integrated with the entire surface on the other side. In addition, the external surface of the resin layer 4 and the external surface of the conductor circuit 5 are in the same plane and the surfaces are formed into a flat state without unevenness. Furthermore, electric components 10 connected to the conductor circuit 5 on one side of the resin layer 4 are buried in the resin layer 4. The through holes 3 are additionally created so as to penetrate the resin layer 4 and the conductor circuit 5 on one side of the resin layer 4 and so as not to penetrate the metal foil 9 and these through holes 3 are filled with the conductive paste 8. The surface of this wiring board sheet 1*j* on which the conductor circuit 9 has been formed is made up of the external surface of the resin layer 4 and the exposed surface of the conductor circuit 5, which are in the same plane, and are formed into a flat state without unevenness except the protrusions of the conductive paste 8.

Here, after the conductor circuit 5 on which the electric components 10 have been mounted has been transcribed to the resin layer 4, the through holes 3 filled with the conductive material 2 are created because the resin layer 4 is fluidized as the electric components 10 are buried in the resin layer 4 at the time when the conductor circuit 5 on which the electric components 10 have been mounted is transcribed to the resin layer 4 and, in the case where the through holes 3 are created, there is a risk of the shapes of the through holes 3 being greatly deformed. In order to prevent such a deformation of the through holes 3 for forming the via holes 15, the through holes 3 are created after the electric components 10 have been buried in the resin layer 4.

Here, in the case where the above described heating and pressing molding is carried out in the condition where the resin layer 4 is maintained in the B-stage, this wiring board sheet 1*j* can be utilized for the manufacturing of the multilayer board 11 as described below. The molding condition at this time can be set at the same levels as in the above described cases. In addition, in the case where the wiring board sheet 1*j* is used as the core material at the time of forming a multilayer board, the wiring board sheet can be utilized for the manufacturing of the multilayer board 11 even when the resin layer 4 is in the C-stage.

Figure 11:
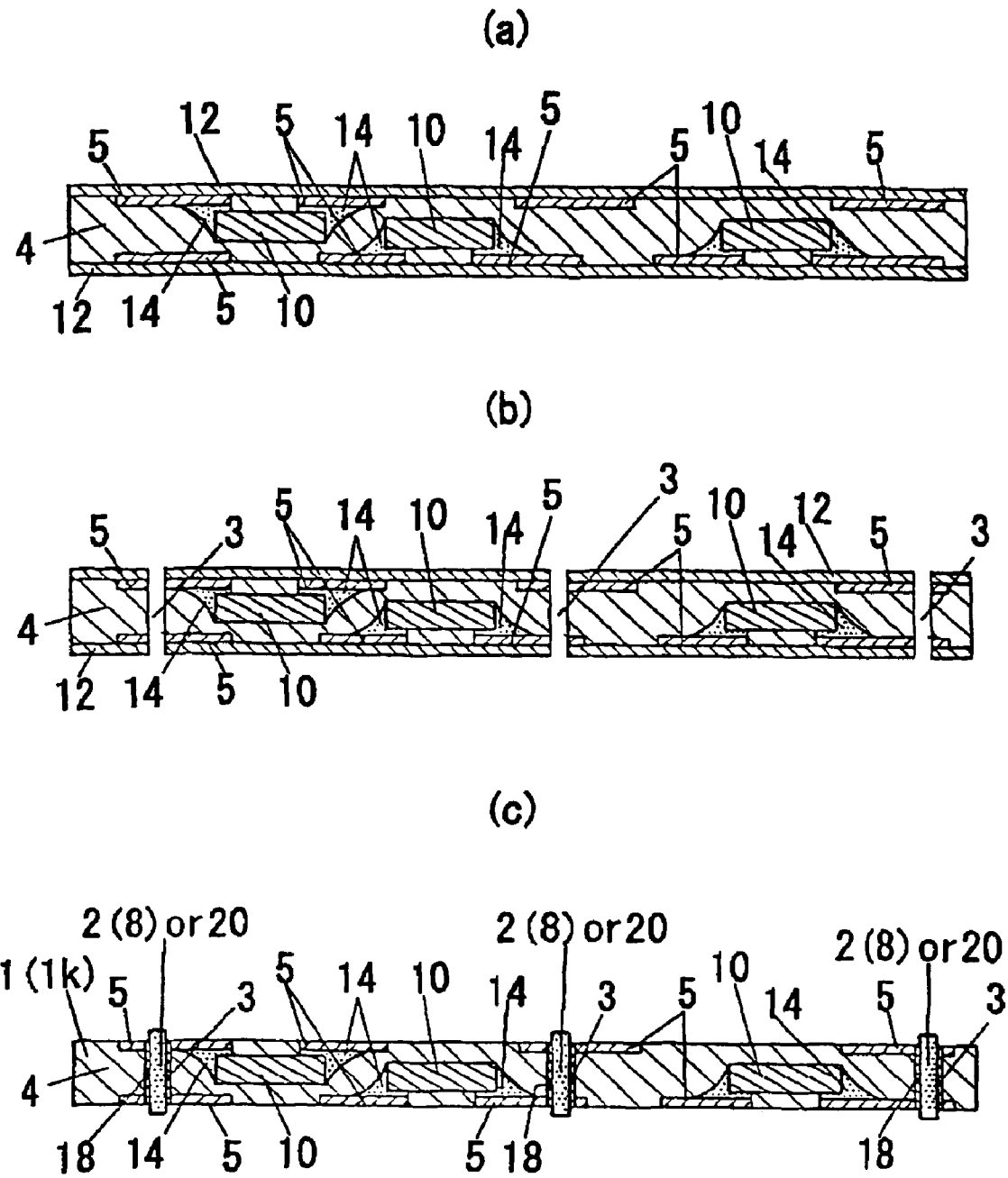
FIGS. 11(*a*) to 11(*c*) are cross sectional views showing still another example of a manufacturing process for a wiring board sheet.

In addition, through holes 3 filled with conductive material 2 and having hole plating 18 are created in the wiring board sheet 1 in which no through holes 3 have been created so that a wiring board sheet 1 (wiring board sheet 1*k*) can be gained. FIGS. 11(*a*) to 11(*c*) show an example of such a process.

Though in the illustrated example, the through holes 3 filled with the conductive material 2 and having the hole plating 18 are created in the wiring board sheet 1*a* shown in FIG. 1(*c*), the invention is not limited to such an embodiment, but rather through holes 3 filled with conductive material 2 and having hole plating 18 can be created, in accordance with a similar method, in any wiring board sheet 1 according to the present invention where no through holes 3 have been created as shown in FIGS. 2(*c*), 4(*c*), 8(*c*), and 9(*c*).

First, as shown in FIG. 11(*a*), a protective film 12 is layered and placed on one or two surfaces (two surfaces in the figures) to which a conductor circuit 5 of a resin layer 4 has been transcribed. The protective films as described above are used as the protective film 12.

Next, as shown in FIG. 11(*b*), through holes 3 are created in predetermined positions for forming via holes of the resin layer 4 by means of laser processing. These through holes 3 are created so as to penetrate predetermined portions of the resin layer 4, the protective film 12 and the conductor circuits 5 on both sides of the resin layer 4. At this time, the protective film 12 side is irradiated with the laser beam, and thereby, the protective film 12 can be prevented from being released from the resin layer 4 due to the laser beam.

After the through holes 3 have been created, the hole plating 18 is formed on the inner surfaces of the through holes 3 in the condition where the protective film 12 is adhered, and then, the through holes 3 are filled in with the conductive material 2 from the external surface side of the protective film 12. A conductive paste 8 as described above can be used as this conductive material 2. The through holes 3 are filled in with the conductive paste 8 by applying the conductive paste 8 to the external surface of the protective film 12 so that the through holes 3 are filled in with the conductive paste 8 from the openings of the through holes 3. At this time, the external surface of the resin layer 4 is protected by the protective film 12 so that the conductive paste 8 is not adhered to the external surface of the resin layer 4.

Next, the protective film 12 where the conductive paste 8 has been adhered to the external surface is released from the resin layer 4 side as shown in FIG. 11(*c*) after the through holes have been filled in with the conductive paste 8, and thereby, a condition is achieved wherein the hole plating 18 is formed inside of the through holes 3 which are filled in with the conductive paste 8 and no conductive paste 8 is adhered to the external surface of the resin layer 4 and the conductor circuits 5. In addition, the conductive paste 8 that has filled the through holes 3 of the protective film 12 remains so that the wiring board sheet is formed in a manner where the conductive paste 8 protrudes outward from the through holes 3 of the resin layer 4 on the surface on the side to which the protective film 12 has been adhered (the surface on the side where the conductor circuit 5 is formed).

In the wiring board sheet 1*k* gained in this manner, the conductor circuits 5 are buried in the surface layers on both sides of the resin layer 4 so that the conductor circuits 5 are exposed from the surfaces of the resin layer 4 and electric components 10 buried in the resin layer 4 are mounted on the conductor circuits 5 on one or both sides of the resin layer. In addition, the external surfaces of the resin layer 4 and the exposed surfaces of the conductor circuits 5 are in the same panes and the surfaces are formed into a flat state without unevenness. Furthermore, the through holes 3 are created so as to penetrate the resin layer 4 and the conductor circuits 5 and hole plating 18 is formed inside of these through holes 3 which are filled in with the conductive paste 8. In particular, though the resin layer 4 incorporating components has a great thickness and in some cases, the reliability of the conductivity of the through holes having only the conductive paste 8 becomes insufficient, a high reliability of the conductivity can be gained by forming hole plating 18 even in the case of the resin layer 4 having a great thickness. The surface of this wiring board sheet 1*k* on which the conductor circuit 9 has been formed is formed of the external surface of the resin layer 4 and the external surface of the conductor circuit 5, which are in the same plane, and is formed into a flat state without unevenness except the protrusions of the conductive paste 8.

Copper plating or the like can be formed as the above described hole plating 18 which can be formed by appropriately combining an electroless plating treatment and an electrolytic plating treatment. In particular, in the case where the hole plating 18 is formed only in accordance with an electroless plating treatment, an increase in the thickness of the hole plating 18 can be restricted so that the hole plating 18 can be prevented from being stripped together with the plating film formed on the protective film 12 at the time when the protective film 12 is released from the resin layer 4 side, and thereby, the reliability of the conductivity can be improved. At this time, even in the case where the hole plating 18 is formed into a thin film only in accordance with the electroless plating treatment, a high reliability of the conductivity can be secured by the hole plating 18 and the conductive paste 8 since the through holes 3 are filled in with the conductive paste 8.

In addition, in the case where there is no risk of stripping the hole plating 18 at the time when the protective film 12 is released as described above, the hole plating 18 is formed by carrying out an electrolytic plating treatment after an electroless plating treatment, and thereby, the reliability of the conductivity in the hole plating 18 can be increased. In the case where the thickness of the hole plating 18 is increased by means of electroless plating and electrolytic plating treatments in the above described manner, a resin paste 20 made of a thermosetting resin composition that does not include conductive powder such as silver powder or copper powder is used in place of the above described conductive paste 8 in the embodiment shown in FIGS. 11(*a*) to 11(*c*), and thereby, the reliability of the conductivity in the via holes can be secured only by the hole plating 18.

Here, after the conductor circuits 5 on which the electric components 10 have been mounted have been transcribed to the resin layer 4, the through holes 3 filled in with the conductive material 2 are created because the resin layer 4 is fluidized as the electric components 10 are buried in the resin layer 4 at the time when the conductor circuits 5 on which electric components 10 have been mounted are transcribed to the resin layer 4 and at this time, in the case where through holes 3 have been created, there is a risk of the shapes of the through holes 3 being greatly deformed. In order to prevent such a deform of the shapes of the through holes 3 for forming the via holes 15 as described above, the through holes 3 are created after the electric components 10 have been buried in the resin layer 4.

Here, in the case where the above described heating and pressing molding is carried out in the condition where the resin layer 4 is maintained in the B-stage, this wiring board sheet 1*k* can be utilized for the manufacturing of a multilayer board 11 as described below. The molding conditions at this time can be set at the same levels as in the above described cases. In addition, in the case where the wiring board sheet 1*k* is used as the core material at the time of forming the multilayer board, the wiring board sheet can be utilized for the manufacturing of the multilayer board 11 even when the resin layer 4 is in the C-sheet.

In each of the wiring board sheets 1 as described above, the conductor circuit 5 is formed through transcription to the resin layer 4 and the electric components 10 mounted on the conductor circuit 5 are buried and placed in the resin layer 4 due to the fluidity of the resin layer 4 as the resin layer is melted and softened, and therefore, the electric components 10 can be placed inside the resin layer 4 in a manner where the fluidity of the resin layer 4 at this time prevents no air spaces from being generated around the electric components 10. Therefore, in the case where the insulation layer is formed of the cured resin layer 4, a wiring board can be gained where the electric components 10 are placed inside the insulation layer so that the amounts of components mounted on the wiring board can be increased and the miniaturization of the wiring board can be achieved by restricting the protrusions of the electric components 10 from the wiring board and in addition, there is more freedom in the wiring design due to the expansion of the areas where the electric components 10 can be mounted. Furthermore, the electric components 10 are placed inside the insulating layer without the existence of air spaces around the electric components, and therefore, no air remains around the electric components 10 so that cracking of the insulation layer, damages to the electric components and the occurrence of the defects, such as, a wire disconnection can be restricted even in the case where stress is received due to heat. Furthermore, the electric components 10 can be placed at arbitrary positions due to the fluidity of the resin layer 4 that has been melted and softened regardless of the amount of mounting or the positions of mounting of the electric components 10 and electric components 10 can be placed at arbitrary portions inside the resin layer 4 or inside the insulation layer gained by curing the resin layer 4 without undergoing a complicated process.

In addition, in order to gain a wiring board, each of the above described wiring board sheets 1 is formed in a manner where the resin layer 4 is maintained in the B-stage and collective molding is carried out by curing the respective resin layers in the condition where two or more wiring board sheets 1 are layered, and thereby, the multilayer board 11 can be gained. In addition, a wiring board sheet 1 where the resin layer 4 is in the C-stage is used as the core material on which another wiring board sheet 1 where the resin layer 4 is in the B-stage is layered, and then, the respective resin layer 4 are cured so that the multilayer board 11 can be gained. Furthermore, the multilayer board 11 can be gained in accordance with a build-up manufacturing method wherein layering of a wiring board sheet 1 where the resin layer 4 is maintained in the B-stage on a wiring board sheet 1 where the resin layer 4 is in the C-stage as well as the formation of a conductor circuit and via holes, if necessary, are repeated.

In addition, the multilayer board 11 can be gained by using a wiring board sheet 1 as described above and a sheet 13 having a resin layer 4 where no electronic materials are buried in this resin layer 4. In this case, one or more wiring board sheets 1 and one or more other sheets 13 having a resin layer 4 in the B-stage are layered so that collective molding can be carried out in this condition where the respective resin layers are cured, and thereby, the multilayer board 11 can be gained. In addition, a wiring board sheet 1 where the resin layer 4 is in the C-stage or another sheet 13 is used as the core material on which another wiring board sheet 1 where the resin layer 4 is maintained in the B-stage or another sheet 13 where the resin layer 4 is maintained in the B-stage is layered, and then, the respective resin layers 4 are cured, and thereby, the multilayer board 11 can be gained. Furthermore, the multilayer board 11 can be gained in accordance with a build-up manufacturing method wherein layering of a wiring board sheet 1 or a sheet 13 where the resin layer 4 is maintained in the B-stage on a wiring board sheet 1 or a sheet 13 where the resin layer 4 is maintained in the C-stage, curing of the resin layers 4 as well as the formation of a conductor circuit and via holes, if necessary, are repeated for the formation of a multilayer.

A known metal foil with resin, a prepreg, a resin sheet, an unclad board or the like which are utilized at the time of the manufacture of a multilayer board can be utilized as the sheet 13 and additionally, a resin sheet where a circuit has been formed or a resin sheet where via holes have been created can also be utilized.

In particular, in the case where a sheet where a conductor circuit 5, a metal foil 9 or through holes 3 filled with conductive material 2 are provided to the resin layer 4 is used as the sheet 13, the formations of an insulation layer, a conductor circuit 5, via holes and the like can be carried out on the sheet 13. Such a sheet 13 is described below.

Figure 15:
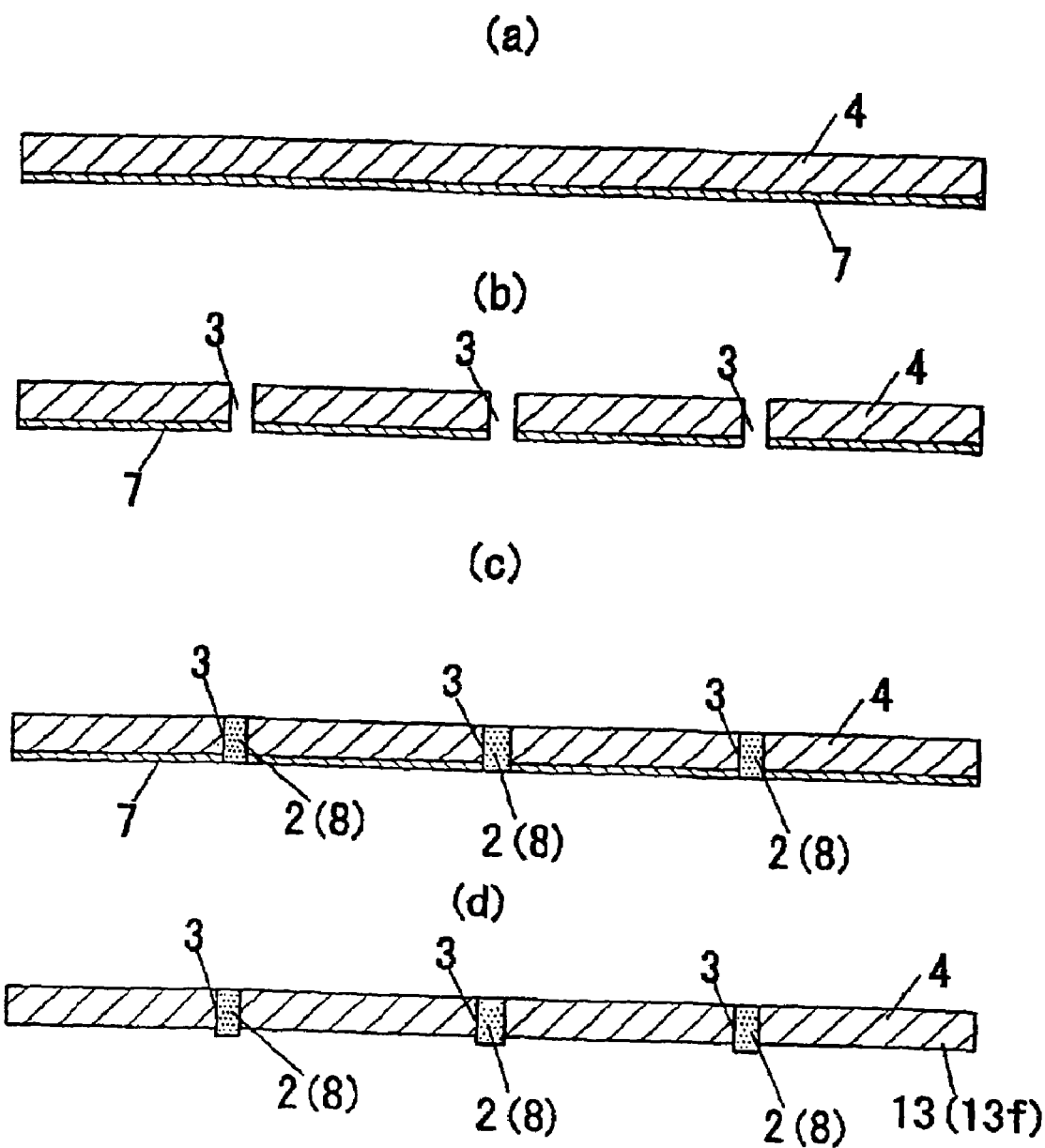
FIGS. 15(*a*) to 15(*d*) are cross sectional views showing a process of forming a resin layer having through holes in which a conductive material is filled.

FIGS. 15(*a*) to 15(*d*) show the formation process for a resin layer 4 that is used for the manufacture of a sheet 13 and first, as shown in FIG. 15(*a*), the above described resin composition is applied to one surface of the carrier base 7 and is heated and dried so as to be converted to the semi-cured condition (B-stage), and thus, the resin layer 4 is formed on the surface of the carrier base 7.

The same resin composition as described above is used. In addition, a synthesized resin film such as a PET film, or a metal foil, can be used as the carrier base 7. In the case where a metal foil is used, it is preferable for the surface on which the resin layer 4 is formed a mirror surface in order to enhance the release properties at the time when the carrier base 7 is released from the resin layer 4. A material that allows the creation of through holes 3 at the time of laser processing is selected for such a metal foil and it is preferable to use a rolled copper foil, an electrolytic copper foil, an aluminum foil, a metal alloy foil, a metal clad foil or the like.

The heating and drying conditions at this time can be set at the same levels as in the case of the formation of a resin sheet 4*a*. In addition, it is preferable for the resin layer 4 to have a thickness in the range of 50 μm to 300 μm.

Laser processing is carried out on the resin layer 4 that has been formed as described above by irradiating the resin layer with a laser beam such as a YAG laser or a carbonic acid gas laser in the condition where the resin layer is supported by the carrier base 7, and thereby, through holes 3 are created at predetermined positions for forming via holes 15 as shown in FIG. 15(*b*). These through holes 3 are created so as to penetrate both the resin layer 4 and the carrier base 7 and at this time, in the case where the carrier base 7 side is irradiated with the laser beam, the resin layer 4 can be prevented from being released from the layer of the carrier base 7.

After the creation of through holes 3, the through holes 3 are filled in with conductive material 2 from the external surface side of the carrier base 7 as shown in FIG. 15(*c*). A conductive paste 8 as described above can be used as this conductive material 2. The through holes 3 are filled in with the conductive paste 8 by applying the conductive paste 8 to the external surface the carrier base 7 so that the through holes 3 are filled in with the conductive paste 8 from the openings of the through holes 3. At this time, the external surface of the resin layer 4 is protected by the carrier base 7 so that no conductive paste 8 is adhered to the external surface of the resin layer 4 and subsequently, the carrier base 7 where the conductive paste 8 has been adhered to the external surface is released from the resin layer 4 as shown in FIG. 15(*d*) after the through holes have been filled in with the conductive paste 8, and thereby, a condition is achieved wherein the through holes 3 are filled in with the conductive paste 8 and no conductive paste 8 is adhered to the external surface of the resin layer 4. In addition, the conductive paste 8 that has been filled in the through holes 3 of the carrier base 7 remains so that the sheet is formed where the conductive paste 8 protrudes outward from the through holes 3 of the resin layer 4 on the side to which the carrier base 7 has been adhered.

As a result of this, a sheet 13 (sheet 13*f*) having through holes 3 filled with conductive material 2 is gained.

In addition, a resin layer formed by impregnating an unwoven cloth with a resin composition in slurry form, which is then dried, can be used as the resin layer 4. An appropriate glass unwoven cloth, an organic fiber unwoven cloth or the like can be used as the unwoven cloth. In the case where the resin layer 4 that has been formed in this manner is used, a protective film 12 is adhered to one surface of the resin layer 4 in place of the carrier base 7 in FIGS. 15(*a*) to 15(*d*) while the other parts are made to remain the same as described above, and thereby, the sheet 13 (sheet 13*f*) having the through holes 3 filled with the conductive material 2 is gained.

The through holes 3 filled with the conductive material 2 in this sheet 13*f* are created as vias (via holes) for electrically connecting the conductor circuits 5 on both sides of resin layer 4 at the time of manufacturing of a multilayer board. Here, the resin layer 4 of the sheet 13*f* is in the B-stage, and therefore, is easily compressed when being layered at the time of the manufacturing of a multilayer board so that the through holes 3 are filled with the conductive material 2 (the conductive paste 8), which is compressed, and a sufficient electric connection vis-à-vis the conductor circuits 5 on both sides of the resin layer can be secured, wherein a high reliability of the conductivity can be maintained.

The above described sheet 13 is formed so that the resin layer 4 is in the B-stage while the resin layer 4 may be in the C-stage in the case where this sheet 13 is used as the core material at the time of the manufacturing of the multilayer board 11.

No electronic elements 10 are buried in the resin layer 4 of this sheet 13 so that the resin layer 4 can be formed to have a small thickness, and therefore, the conductance between the layers can be secured only by means of the conductive past 8 without forming the hole plating 18 inside the through holes 3 for forming vias. Here, hole plating can be formed on the inner surfaces of the through holes 3 prior to the filling of the through holes 3 with the conductive material 2 (the conductive paste 8).

In addition, in the case where the resin layer 4 is particularly in the C-stage, in order to secure the reliability of the conductivity, the hole plating 18 is carried out on the inner surfaces of the through holes 3 after the through holes 3 have been created as FIG. 15(b) and, subsequently, the through holes 3 are filled in with the conductive material 2 (the conductive paste 8) as shown in FIG. 15(c) so that the sheet 13f shown in FIG. 15(d) can be gained.

In addition, the sheet 13f having the through holes 3 filled with the conductive material 2 as described above and the base 6 for transcription where the conductor circuit 5, to be later transcribed, is formed on a surface are used so that the conductor circuit 5 is transcribed to the resin layer 4 of the sheet 13f from the base 6 for transcription, and thereby, the sheet 13 where the conductor circuit 5 is formed on one side (sheet 13a with a circuit on one side) can be gained.

FIGS. 16(a) to 16(c) show an example of a manufacturing process for a sheet 13a with a circuit on one side. First, as shown in FIGS. 16(a) and 16(b), a base 6 for transcription on which a conductor circuit 5 has been formed is layered and placed on one surface of a sheet 13f made of a resin layer 4 having through holes 3 filled with conductive material 2 so that the surface on which the conductor circuit has been formed is opposite to the resin layer 4 in a condition where the positions of the through holes 3 and the conductor circuit 5 are adjusted, and then, heating and pressing molding is carried out so that the sheet and the base for transcription are integrated. At this time, the conductor circuit 5 and the through holes 3 are positioned so that predetermined portions of the conductor circuit 5 are placed on the positions of the openings of the through holes 3.

A base for transcription that has been formed as described above is used for the base 6 for transcription on which the conductor circuit 5 has been formed. At this time, the base 6 for transcription may be formed of a metal material such as stainless steal in the same manner as the base for transcription that is used for the manufacturing of the wiring board sheet 1, or the base 6 for transcription can be formed of a resin film. That is to say, particularly in the case where a conductor circuit 5, to be later transcribed, is formed on the base 6 for transcription, and electric components 10 are mounted at the time of the manufacturing of the wiring board sheet 1, the temperature of the base 6 for transcription becomes very high due to the soldering processing at the time of mounting of the electric components 10, and sometimes it becomes necessary to apply a large amount of heat to the resin layer 4 in order to sufficiently melt and soften the resin layer 4 at the time when the electric components 10 are buried in the resin layer 4, and therefore, a high resistance to heat is required for the base 6 for transcription. However, the electric components 10 are not mounted on the base 6 for transcription at the time when the sheet 13 is formed, and therefore, a resistance to heat that is not as high as that of the time of manufacture of the wiring board sheet 1 is required at the time when the sheet 13 is formed because the electric components 10 are not mounted on the base 6 for transcription, and as a result, the base 6 for transcription can be formed of a resin film. In this case, a resin film such as a known PET film or a fluoride based film that has an adhesive allowing release from the conductor circuit 5 by means of heat application or UV light application can be used.

This heating and pressing molding is carried out in a condition where the resin layer 4, after being formed, is maintained in the B-stage, in a condition where the resin layer 4 is in the C-stage, or preferably in a condition where the conductive paste 8 that has filled the through holes 3 is maintained in the B-stage.

In this molding process, the resin layer 4 is melted and softened so as to be fluidized, and thereby, the conductor circuit 5 formed on the base 6 for transcription is buried in the resin layer 4. In addition, at this time, predetermined portions of the conductor circuit 5 for creating the through holes 3 are buried in the resin layer 4, and thereby, are electrically connected to the conductive paste 8 that has filled the through holes 3. In addition, the portions of the conductive paste 8 that protrude from the through holes 3 are pressed into the through holes 3 by applying pressure and the predetermined portions of the conductor circuit 5 for the creation of the through holes 3 are further pressed so as to be buried in the resin layer 4, and are further compressed within the through holes 3. As a result of this, the conductivity of the conductive layers within the through holes 3 formed of the conductive paste 8 increases so as to enhance the reliability of the connection between the conductor circuits 5 through the via holes at the time of the manufacturing of the multilayer board 11.

It is preferable to carry out the above described heating and pressing molding of the sheet 13a with a circuit on one side under reduced pressure or in a vacuum, and in such cases, it becomes difficult for voids to be included inside the sheet, increasing the reliability. In addition, in the case where this heating and pressing molding is carried out in a condition where the curing response of the resin layer 4 and the conductive paste 8 does not progress in a manner where the resin layer 4 and the conductive paste 8 within the through holes 3 after being formed are maintained in the B-stage, it is preferable to heat at a temperature of 100° C. to 140° C. for approximately 10 minutes though these conditions depend on the makeup of the resin composition that forms the resin layer 4 and depend on the makeup of the conductive paste 8. In addition, it is necessary to set the pressure at the time of the molding in accordance with the fluidity of the resin layer 4 when being melted and softened, and for example, in the case where the fluidity when melted and softened is high, an easy molding is possible by means of a vacuum laminator while in the case where the fluidity when melted and softened is low, the molding can be carried out by a applying pressure to approximately 2.94 MPa (30 kgf/cm2).

Next, as shown in FIG. 16(c), the base 6 for transcription is released from the resin layer 4 while the conductor circuit 5 is made to remain in the resin layer 4, and thereby, a sheet 13a with a circuit on one side is gained. This sheet 13a with a circuit on one side is formed in a manner where the conductor circuit 5 is buried in a surface layer on one side of the resin layer for in the B-stage or in the C-stage having through holes 3 filled with conductive material 2 so that the conductor circuit 5 is exposed from the surface of the resin layer 4, and the external surface of the resin layer 4 and the exposed surface of the conductor circuit 5 are in the same plane where the surfaces are formed into a flat state without unevenness.

The base 6 for transcription can be released from the resin layer 4 by stripping the base 6 for transcription from the resin layer 4 starting from an edge of the resin layer 4. At this time, in the case where stainless steal having a thickness of 50 μm to 200 μm, in particular a thickness of 100 μm, is used, the base 6 for transcription has a high tenacity and an appropriate flexibility so that the base 6 for transcription can be easily released from the resin layer 4, which does not bend, due to the flexibility of the base 6 for transcription, and thus, it is easy to handle the base 6 for transcription. The base 6 for transcription, after being released in this manner, can be utilized for the manufacturing of a sheet 13a with a circuit on one side by forming a conductor circuit 5 again on the base 6 for transcription after being cleaned by means of degreasing.

In addition, a sheet 13f made of a resin layer 4 having through holes 3 filled with conductive material 2 as described above, and a base 6 for transcription where a conductor circuit 5, to be later transcribed, is formed on a surface are used so that the conductor circuit 5 is transcribed from the base 6 for transcription to the resin layer 4, and thereby, a sheet 13 where the conductor circuits 5 are formed on the two surfaces (sheet 13b with circuits on both sides) can be gained.

Figure 17:
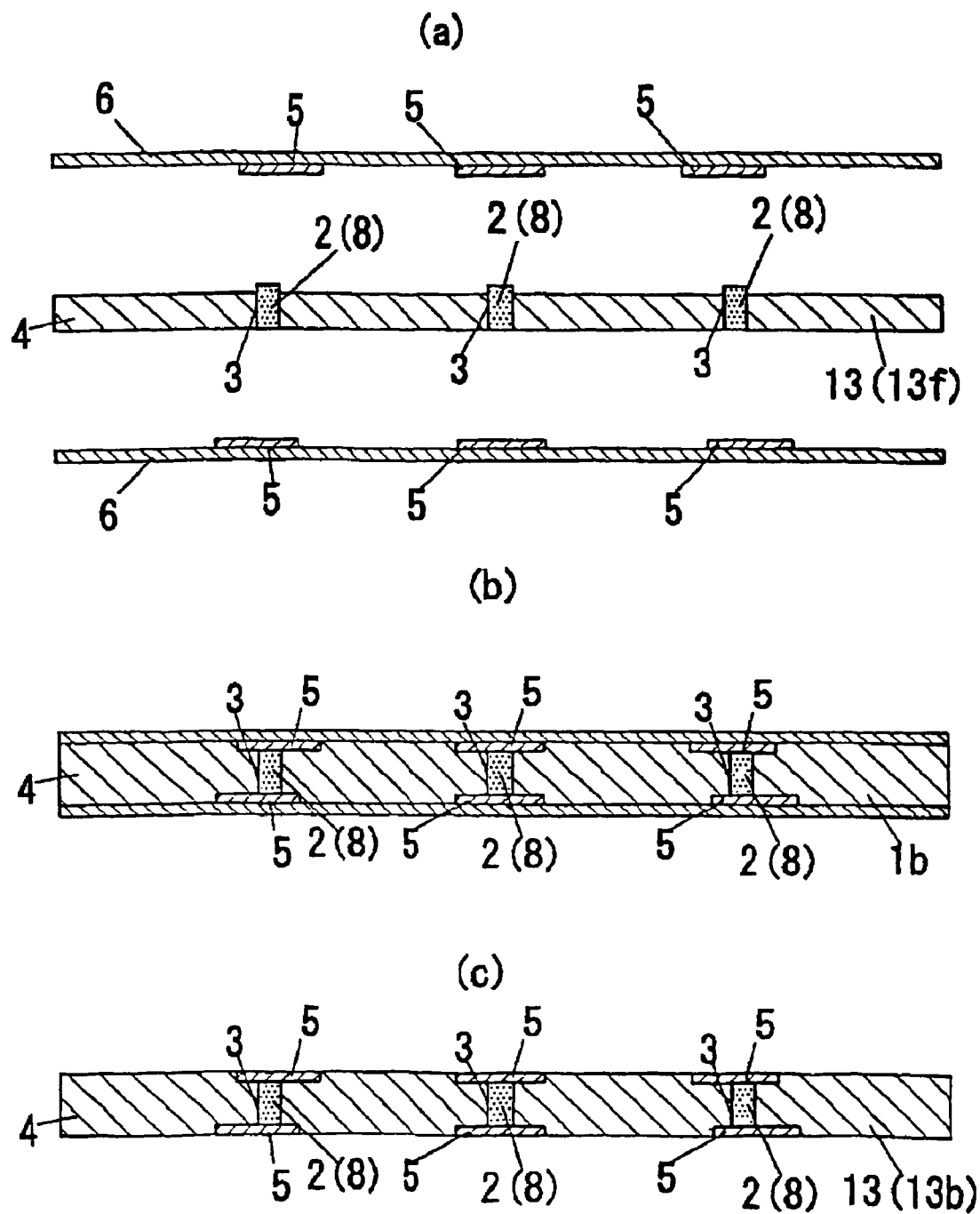
FIGS. 17(*a*) to 17(*c*) are cross sectional views showing another example of a manufacturing process for a sheet.

FIGS. 17(a) to 17(c) show an example of a manufacturing process for a sheet 13b with circuits on both sides. First, as shown in FIGS. 17(a) and 17(b), the bases 6 for transcription where the conductor circuits 5 have been formed as described above are respectively layered and placed on both sides of the sheet 13f made of the resin layer 4 having the through holes 3 filled with conductive material 2 so that the surfaces on which the conductor circuits have been formed are opposite to the resin layer 4 in the condition where the positions of the through holes 3 and the conductor circuits 5 are adjusted, and then, heating and pressing molding is carried out in the same conditions as in the manufacturing of the above described sheet 13a with a circuit on one side; and thereby, the bases for transcription and the resin layer are integrated; and at this time, the conductor circuits 5 and the through holes 3 are positioned so that the predetermined portions of the conductor circuit 5 are placed on the positions of the openings of the through holes 3. This heating and pressing molding is carried out in a condition where the resin layer 4 after being formed is maintained in the B-stage, in a condition where the resin layer 4 is in the C-stage, or preferably in a condition where the conductive paste 8 within the through holes 3 is maintained in the B-stage.

In this molding process, the resin layer 4 is melted and softened so as to be fluidized so that the conductor circuits 5 formed on the bases 6 for transcription are buried in the resin layer 4. In addition, at this time, predetermined portions of conductor circuit 5 are buried in the resin layer 4 at the positions for the creation of through holes 3, and thereby, are electrically connected to the conductive paste 8 that has filled the through holes 3. In addition, the portions of the conductive paste 8 protruding from the through holes 3 are pushed into through holes 3 by applying pressure and predetermined portions of the conductor circuits 5 are buried in the resin layer 4 from both sides of the through holes 3 so as to be further pushed into the through holes 3 so that the conductive paste 8 is compressed within the through holes 3, and thereby, the conductivity of the conductive layers within the through holes 3 formed of the conductive paste 8 is increased, enhancing the reliability of the connection between the conductor circuits 5 through the via holes at the time of the manufacturing of the multilayer board 11.

Next, as shown in FIG. 17(c), the bases 6 for transcription are released from the resin layer 4 while the conductor circuits 5 are made to remain in the resin layer 4, and thereby, a sheet 13b with circuits on both sides is gained. This sheet 13b with circuits on both sides is formed in a manner where the conductor circuits 5 are buried in the surface layers on both sides of the resin layer 4 in the B-stage or in the C-stage having the through holes 3 filled with conductive material 2 so that the conductor circuits 5 are exposed from the surfaces of the resin layer 4 where the external surface of the resin layer 4 and the exposed surface of the conductor circuits 5 are in the same plane and the surfaces are formed into a flat state without unevenness.

Figure 18:
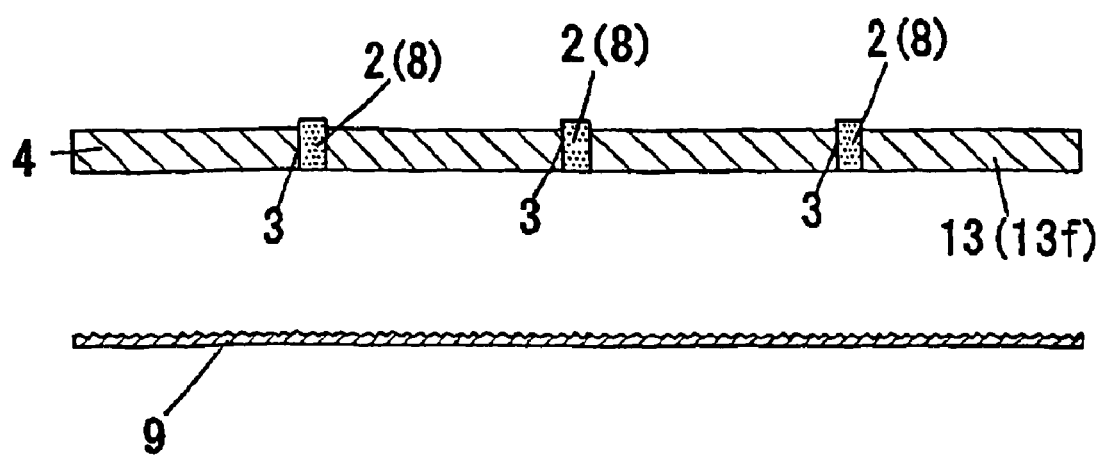
FIGS. 18(*a*) and 18(*b*) are cross sectional views showing still another example of a manufacturing process for a sheet.
Figure 18:
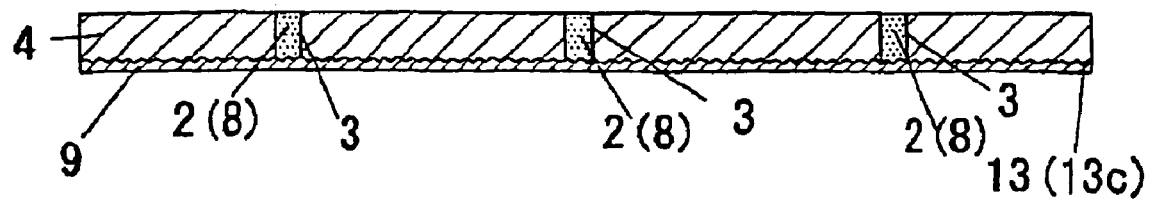

According to the manufacturing process for a sheet 13 (sheet 13c with a metal foil) shown in FIG. 18, a sheet 13f made of the resin layer 4 having the through holes 3 filled with conductive material 2 as described above and a metal foil 9 are used so as to gain a sheet 13c with a metal foil where the metal foil 9 is placed on one surface of the resin layer 4.

Here, the metal foil 9 is layered and placed on one side of the sheet 13f made of the resin layer 4 having the through holes 3 filled with the conductive material 2 so as to be opposite to the resin layer 4, and then, heating and pressing molding is carried out in the same conditions as in the above described cases so that the metal foil and the sheet are integrated. This heating and pressing molding is carried out in a condition where the resin layer 4 after being formed is maintained in the B-stage, in a condition where the resin layer 4 is in the C-stage, or preferably in a condition where the conductive paste 8 within the through holes 3 is also maintained in the B-stage.

The metal foils as described above can be used as the metal foil 9. In addition, it is preferable for the surface of this metal foil 9 on which the resin layer 4 is formed to be a rough surface in order to ensure the adhesiveness vis-à-vis the resin layer 4. In the case where an electrolytic copper foil is used as the metal foil 9, for example, the resin layer 4 can be formed on the rough surface that has originally been formed on the electrolytic copper foil. In addition, a surface treatment can be carried out on the metal foil 9 and a surface roughening treatment by means of, for example, a blackening treatment or an alumite treatment can be cited as this surface treatment.

In this molding process, the metal foil 9 is electrically connected to the conductive paste 8 that has filled the through holes 3. In addition, the portions of the conductive paste 8 protruding from the through holes 3 are pressed into the through holes 3 by a applying pressure so as to be compressed within the through holes 3, and thereby, the conductivity of the conductive layers within the through holes 3 formed of the conductive paste 8 is increased, enhancing the reliability of the connection between the conductor circuits 5 through via holes 15 at the time of the manufacturing of the multilayer board 11.

Figure 19:
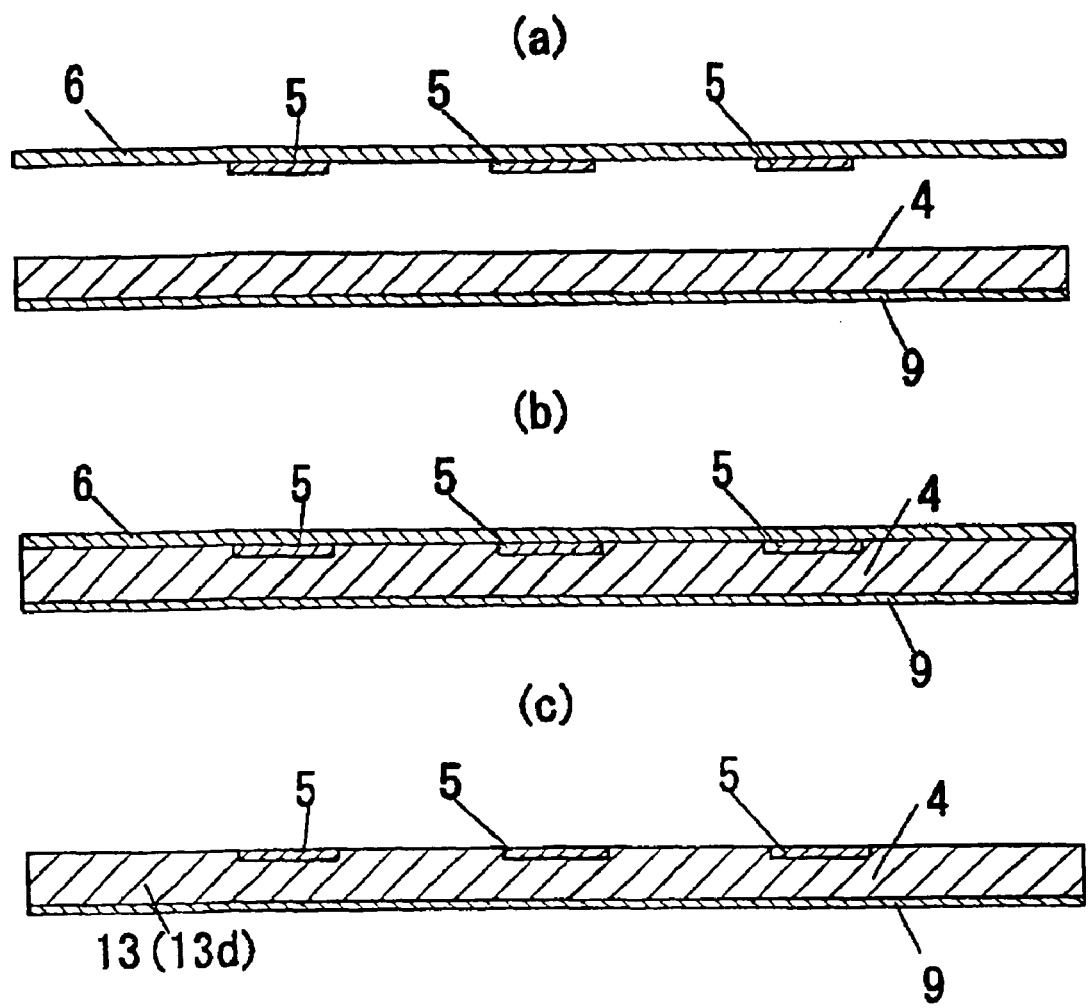
FIGS. 19(*a*) to 19(*c*) are cross sectional views showing still another example of a manufacturing process for a sheet.

FIGS. 19(a) to 19(c) show another example of a manufacturing process for a sheet 13. This sheet 13 (sheet 13d with a metal foil and a circuit) is formed in a manner where a resin layer 4 in the B-stage or in the C-stage is formed on one surface of a metal foil 9 and furthermore a conductor circuit 5 is transcribed to this resin layer 4.

First, the resin layer 4 in the B-stage is formed on a surface of the metal foil 9. This resin layer 4 is formed by a applying the same resin composition as described above to the metal foil 9, which is then heated and dried.

The same metal foils as described above can be used as the metal foil 9 and it is preferable for the surface on which the resin layer 4 is formed to be a rough surface in order to ensure the adhesiveness vis-à-vis the resin layer 4. In the case where an electrolytic copper foil is used as the metal foil 9, for example, the resin layer 4 can be formed on the rough surface that has originally been formed on the electrolytic copper foil. In addition, a surface treatment can be carried out on the metal foil 9 and a surface roughening treatment by means of, for example, a blackening treatment or an alumite treatment can be cited as this surface treatment. Furthermore, it is preferable for this metal foil 9 to have a thickness of 10 μm to 150 μm. In addition, it is preferable for the thickness of the resin layer 4 to be 50 μm to 300 μm.

Next, the conductor circuit 5 is transcribed to the resin layer 4 from the base 6 for transcription by using the base 6 for transcription where the conductor circuit 5, to be later transcribed, is formed on the surface as described above. At this time, as shown in FIGS. 19(a) and 19(b), the base 6 for transcription on which the conductor circuit 5 has been formed is layered and placed on one surface (surface on the side on which the metal foil 9 is not placed) of the resin layer 4 so that the surface on which the conductor circuit 5 has been formed is opposite to the resin layer 4, and then, heating and pressing molding is carried out so that the base for transcription and the resin layer are integrated. This heating and pressing molding is carried out in a condition where the resin layer 4, after being formed, is maintained in the B-stage or in a condition where resin layer 4 is in the C-stage.

In this molding process, the resin layer 4 is melted and softened so as to be fluidized and the conductor circuit 5 formed on the base 6 for transcription is buried in the resin layer 4.

Next, as shown in 19(c), the resin layer 4 is released from the base 6 for transcription while the conductor circuit 5 is made to remain in the resin layer 4, and thereby, a sheet 13d with a metal foil and a circuit is gained. This sheet 13d with a metal foil and a circuit is formed in a manner where the conductor circuit 5 is buried in a surface layer of the resin layer 4 in the B-stage or in the C-stage so that the conductor circuit 5 is exposed from the surface of the resin layer 4 where the external surface of the resin layer 4 and the exposed surface of the conductor circuit 5 are in the same plane and the surfaces are formed into a flat state without unevenness.

Figure 20:
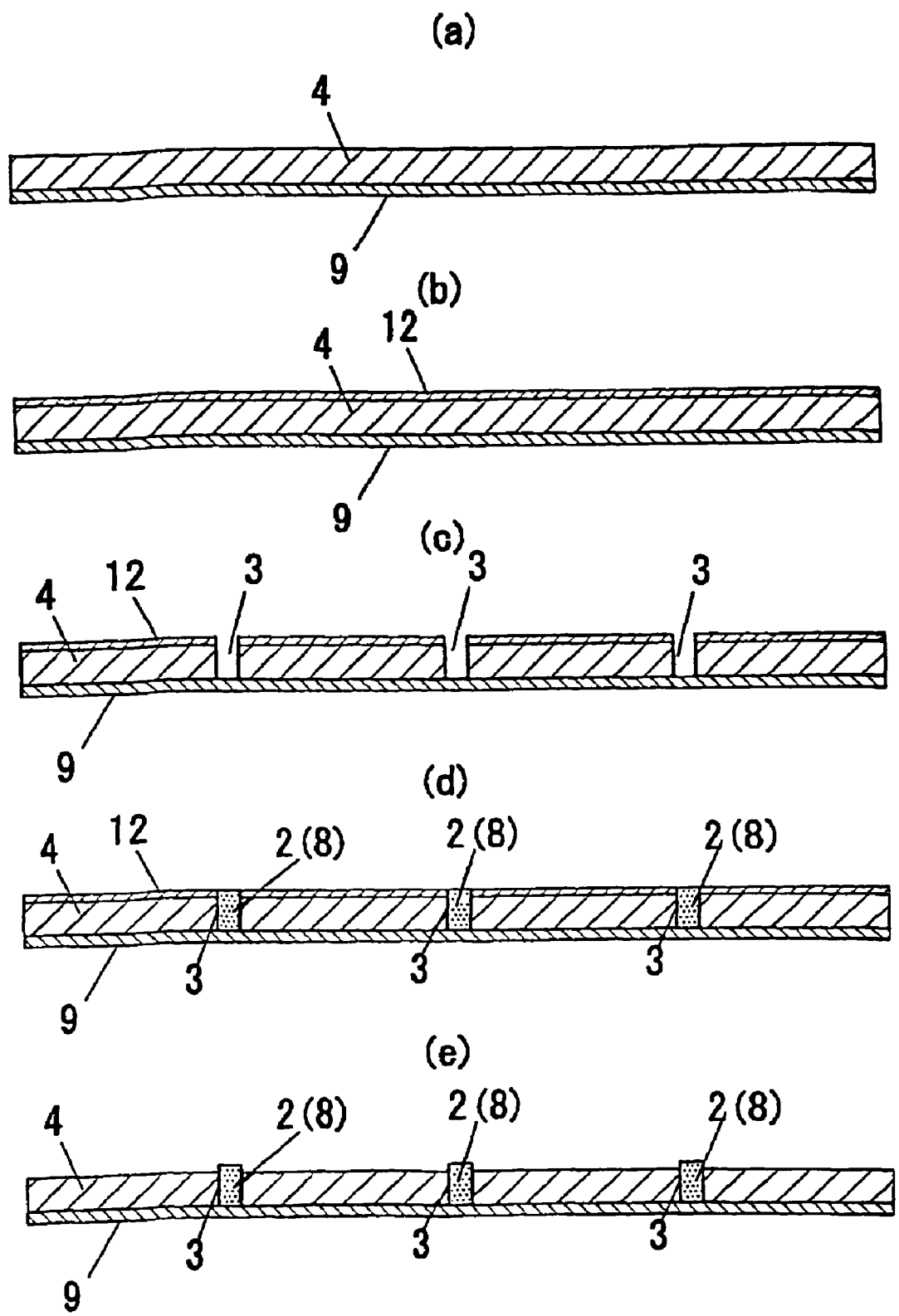
FIGS. 20(*a*) to 20(*e*) are cross sectional views showing still another example of a manufacturing process for a sheet.

In the manufacturing process for a sheet 13 (sheet 13e with a metal foil and a circuit) shown in FIGS. 20(a) to 20(e) and 21(a) to 21(c), first, after the resin layer 4 has been formed on the surface of the metal foil 9 in the same manner as in the above described cases, as described in FIG. 20(b), a protective film 12 is placed on a surface of the resin layer 4 on the side opposite to the side where the metal foil 9 has been placed before the conductor circuit 5 is formed. The same protective films as described above can be used as the protective film 12.

Next, as shown in FIG. 20(c), through holes 3 are created in predetermined positions of the resin layer 4 for forming via holes 15 by means of laser processing. These through holes 3 are created so as to penetrate both the resin layer 4 and the protective film 12. At this time, the protective film 12 side is irradiated with a laser beam, and thereby, the resin layer 4 can be prevented from being released from the layer of the protective film 12. In addition, the resin layer is irradiated with the laser beam in a condition where no openings are created in the metal foil 9.

After the through holes 3 have been created, as shown in FIG. 20(d), the through holes 3 are filled in with conductive material 2 from the external surface side of the protective film 12. Hole plating may be formed on the inner surfaces of the through holes 3 prior to the filling of the through holes with conductive material 2. The conductive paste 8, similar to those in the above described cases, can be used as this conductive material 2. The through holes 3 are filled in with the conductive paste 8 from the openings of the through holes 3 by applying the conductive paste 8 to the external surface of the protective film 12. At this time, the external surface of the resin layer 4 is protected by the protective film 12 so that no conductive paste 8 is adhered to the external surface of the resin layer 4.

Next, after the through holes have been filled in with the conductive paste 8, as shown in FIG. 20(e), the protective film 12 where the conductive paste 8 has been attached to the external surface is released from the resin layer 4, and thereby, a condition is achieved wherein the through holes 3 of the resin layer 4 are filled in with the conductive paste 8 and no conductive paste 8 is adhered to the external surface of the resin layer 4. In addition, the conductive paste 8 that has filled the through holes 3 of the protective film 12 remains so that the conductive paste 8 protrudes outward from the through holes 3 of the resin layer 4 on the surface of the side where the protective film 12 has been adhered.

Next, as shown in FIGS. 21(a) to 21(c), a base 6 for transcription where a conductor circuit 5, to be later transcribed, has been formed on a surface as described above, is used so that the conductor circuit 5 is transcribed to the resin layer 4 from the base 6 for transcription. At this time, as shown in FIGS. 21(a) and 21(b), the base 6 for transcription on which the conductor circuit 5 has been formed as described above is layered and placed on one surface (surface on the side where the metal foil 9 is not placed) of the resin layer 4, having the through holes 3 filled with conductive material 2 so that the surface on which the conductor circuit 5 has been formed is opposite to the resin layer 4 in the condition where the positions of the through holes 3 and of the conductor circuit 5 are adjusted, and then, heating and pressing molding is carried out in the same conditions as in the above described cases so that the base for transcription and the resin layer are integrated. At this time, the conductor circuit 5 and the through holes 3 are positioned so that the predetermined portions of the conductor circuit 5 are placed on the positions of the openings of the through holes 3. This heating and pressing molding is carried out in a condition where the resin layer 4 after being formed is maintained in the B-stage, in a condition where the resin layer 4 is in the C-stage or preferably in a condition where the conductive paste 8 within the through holes is maintained in the B-stage.

In this molding process, the resin layer 4 is melted and softened so as to be fluidized and the conductor circuit 5 formed on the base 6 for transcription is buried in the resin layer 4. In addition, at this time, predetermined portions of the conductor circuit 5 are buried in the resin layer 4 in positions for the creation of through holes 3, and thereby, are electrically connected to the conductive paste 8 that has filled the through holes 3. In addition, the portions of the conductive paste 8 protruding from the through holes 3 are pressed into the through holes 3 by applying pressure and predetermined portions of the conductor circuit 5 are buried in the resin layer 4 in positions for the creation of the through holes 3, and thereby, the predetermined portions of the conductor circuit 5 are further pressed into the through holes 3 so as to be compressed in the through holes 3. As a result of this, the conductivity of the conductive layers within the through holes 3 formed of the conductive paste 8 is increased, enhancing the reliability of the connection between the conductor circuits 5 through via holes 15 at the time of the manufacturing of the multilayer board 11.

Figure 21:
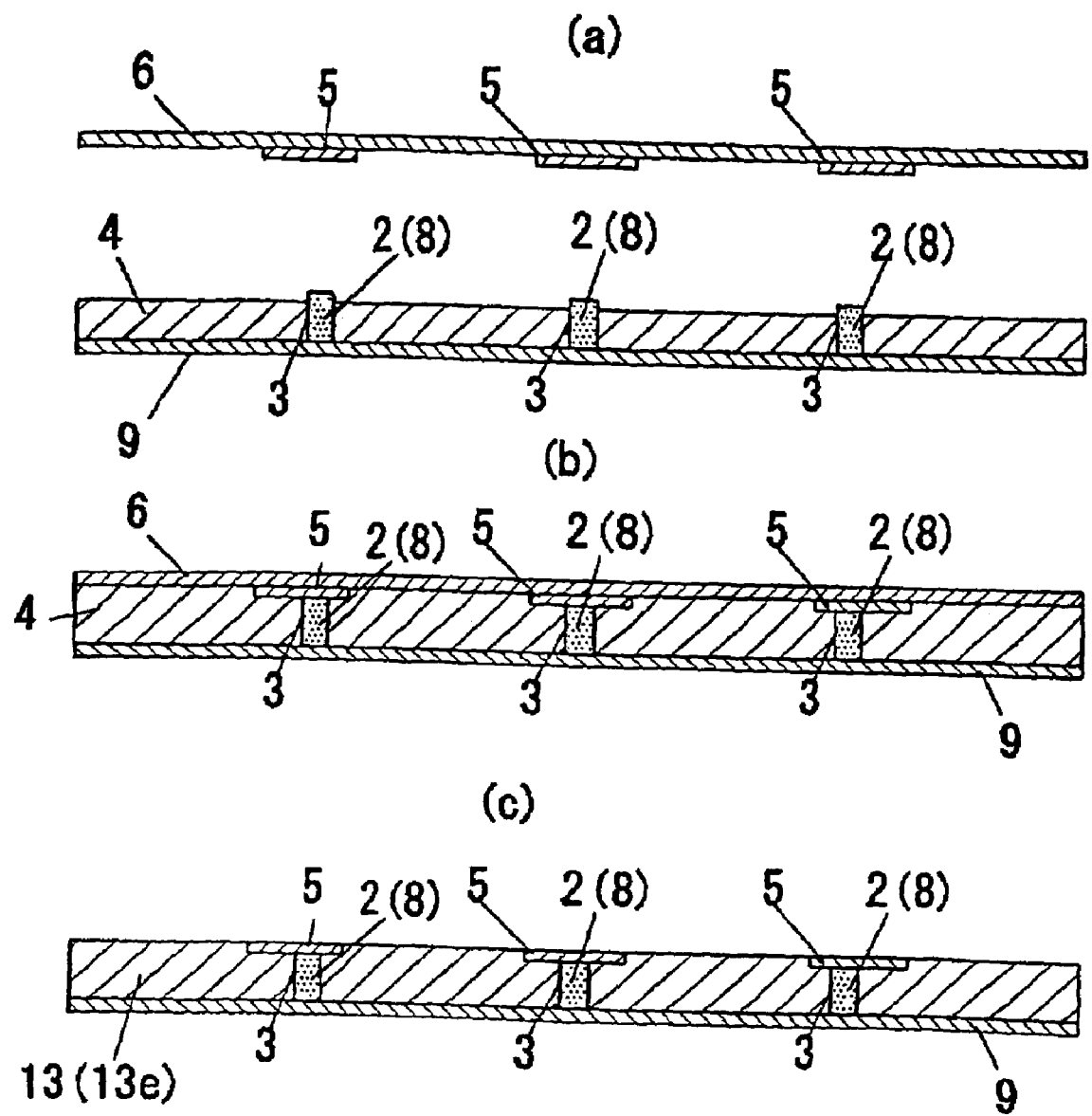
FIGS. 21(*a*) to 21(*c*) are cross sectional views showing the steps following the step shown in FIG. 20(*e*)

Next, as shown in FIG. 21(*c*), the base 6 for transcription is released from the resin layer 4 while the conductor circuit 5 is made to remain in the resin layer 4, and thereby, a sheet 13*e* with a metal foil and a circuit is gained. This sheet 13*e* with a metal foil and a circuit is formed in a manner where the conductor circuit 5 is buried in a surface layer of the resin layer 4 in the B-stage or in the C-stage having the through holes filled with conductive material 2 so that the conductor circuit 5 is exposed from the surface of the resin layer 4 where the external surface of the resin layer 4 and the exposed surface of the conductor circuit 5 are in the same plane and the surfaces are formed into a flat state without unevenness.

Though a concrete manufacturing process for a multilayer board 11, using a wiring board sheet 1 and a sheet 13 as described above, is shown in the following, the multilayer board 11 according to the present invention is not limited to the multilayer board manufactured in accordance with the following process, but rather a multilayer board having a variety of configurations can be gained by appropriately combining two or more wiring board sheets 1, or at least one wiring board sheet 1 and another sheet 13 as described above, so as to form an integrated multilayer. At this time, wiring board sheets 1 and other sheets 13 can be layered in a manner where the surface on which the conductor circuit 5 or the metal foil 9 is formed, is opposite to the surface on which the metal foil 9 or the conductor circuit 5 is formed, the surface on which the openings of the through holes 3 are created, or the surface on which neither the metal foil 9 or the conductor circuit 5 have been formed.

Figure 4:
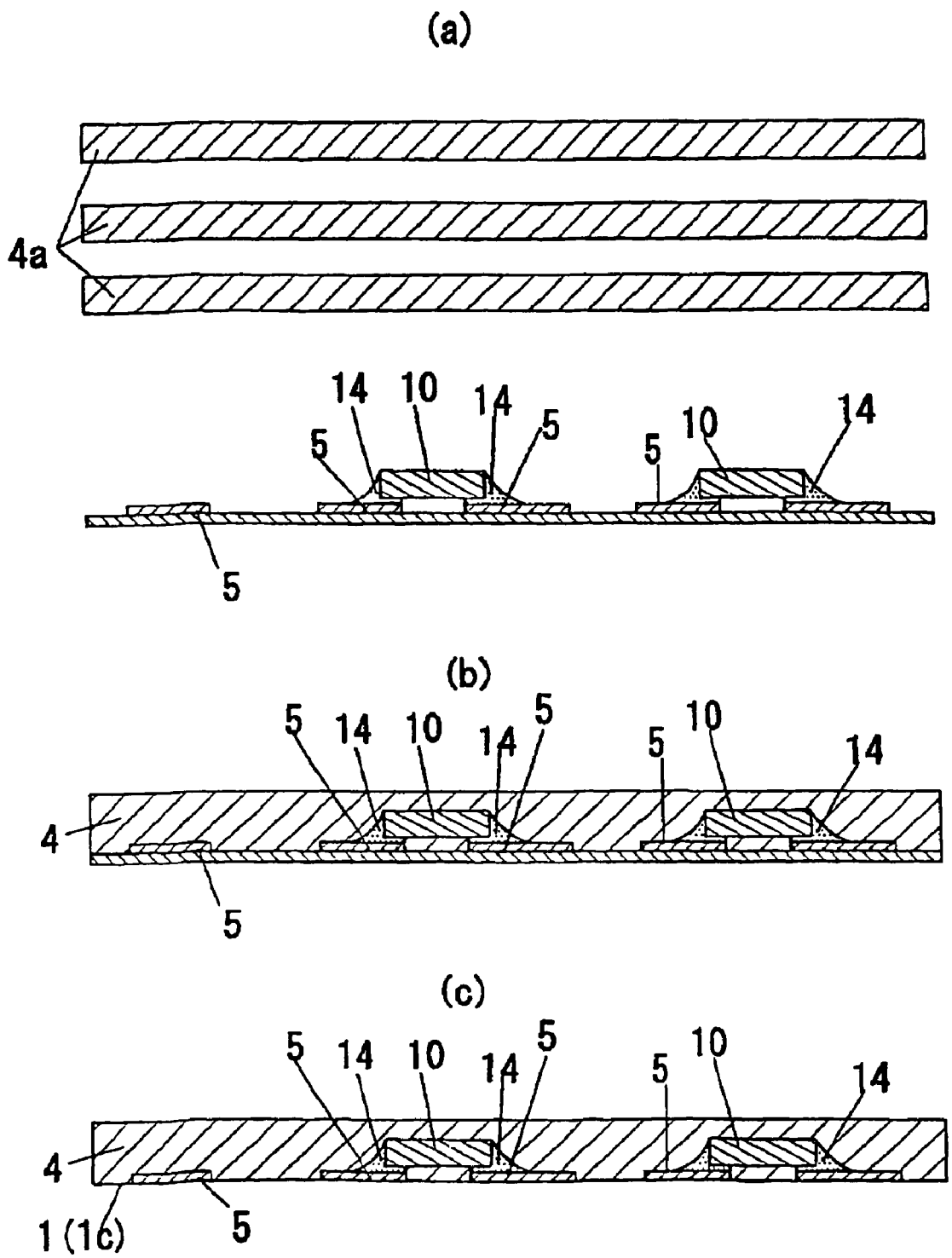
FIGS. 4(*a*) to 4(*c*) are cross sectional views showing still another example of a manufacturing process for a wiring board sheet.
Figure 5:
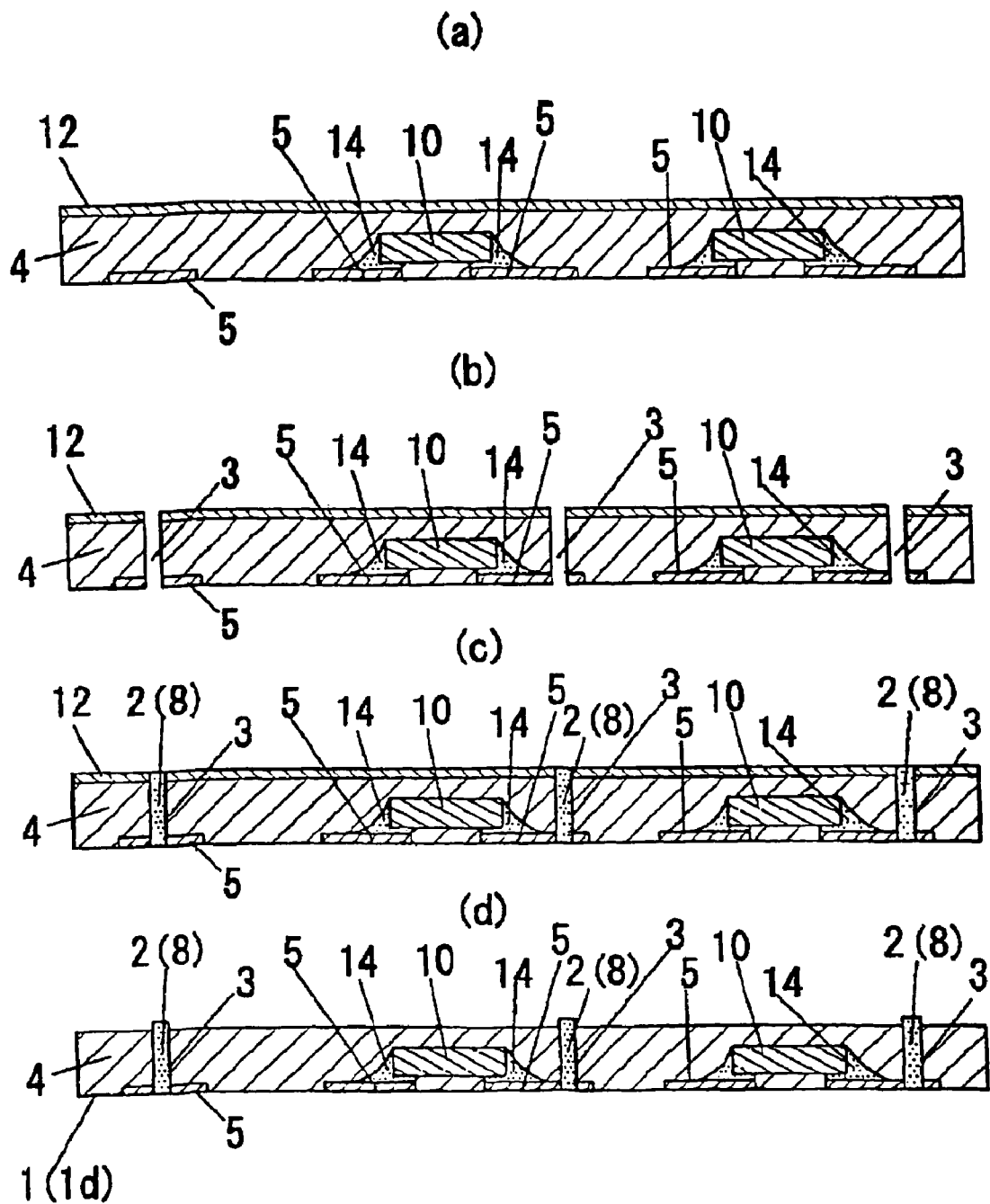
FIGS. 5(*a*) to 5(*d*) are cross sectional views showing still another example of a manufacturing process for a wiring board sheet.
Figure 22:
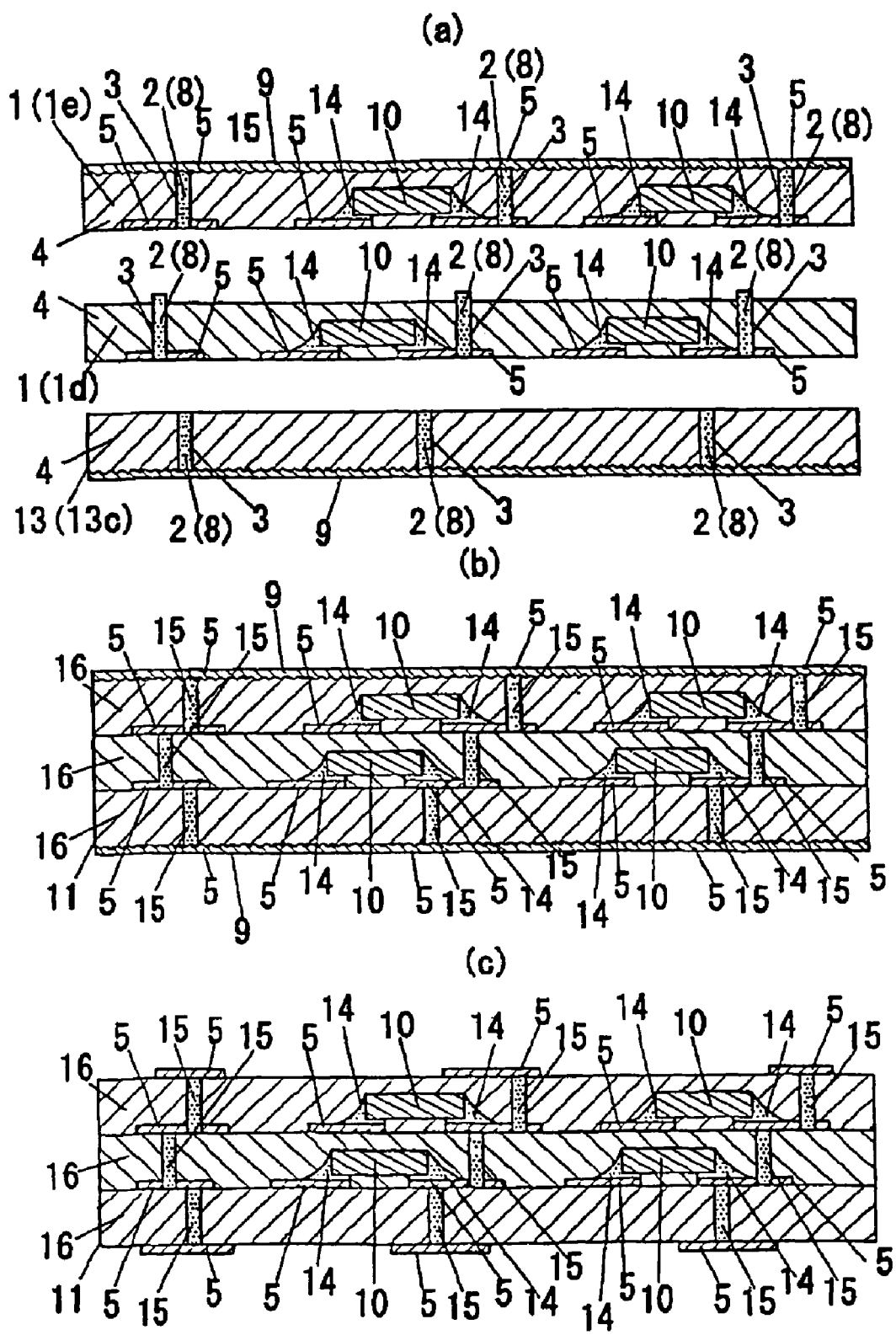
FIGS. 22(*a*) to 22(*c*) are cross sectional views showing an example of a manufacturing process for a multilayer board.

In an example shown in FIGS. 22(*a*) to 22(*c*), one wiring board sheet 1*d* gained in accordance with the process shown in FIGS. 4(*a*) to 4(*c*), one wiring board sheet 1*e*, gained in the accordance with the process shown in FIGS. 5(*a*) to 5(*d*), and one sheet 13*c* with a metal foil gained in accordance with the process shown in FIGS. 18(*a*) and 18(*b*), are used so that these sheets are layered and integrated.

In an example shown in FIGS. 22(*a*) to 22(*c*), first, the wiring board sheet 1*e*, the wiring board sheet 1*d* and the sheet 13*c* with a metal foil are layered and placed on each other in the condition where the surface of the wiring board sheet 1*e*, on which the conductor circuit 5 has been formed, and the surface of the wiring board sheet 1*d*, on which the conductor circuit 5 has not been formed, are opposite to each other, and the surface of the wiring board sheet 1*d*, on which the conductor circuit 5 has not been formed, and the surface of the sheet 13*c* with a metal foil, on which the metal foil 9 has not been placed, are opposite to each other. At this time, the respective opposite surfaces are positioned so that predetermined portions of the conductor circuits 5 are placed on the positions of the openings of the through holes 3.

Heating and pressing molding is carried out in this condition, and thereby, the wiring board sheets 1*d*, 1*e*, and the sheet 13*c* with a metal foil are collectively layered and integrated.

In this molding process, the resin layer 4 in the B-stage is cured after being melted, and thereby, the interfaces between the wiring board sheets 1*e* and 1*d* and between the wiring board sheet 1*d* and the sheet 13*c* with a metal foil are joined so that these sheets are layered and integrated, and insulation layers 16 are formed from the cured resin layers 4. In addition, conductive layers are formed of the cured conductive paste 8 in the through holes 3 filled with the conductive paste 8, and thereby, via holes 15 are formed so as to electrically connect the conductor circuits 5, and so as to electrically connect the metal foil 9 and the conductor circuit 5. At this time, the conductive paste 8 that has filled the through holes 3 of the sheet 1*e* has electrically connected the conductor circuit 5 and the metal foil 9 in advance, as described above, and the conductive paste 8 is cured in this condition so as to form conductive layers, and thereby, via holes 15 are formed. In addition, the predetermined portions of the conductor circuit 5 of the sheet 1*c* are connected to the conductive paste 8 that has filled the through holes 3 of the sheet 1*d* in the interface between the sheets 1*c* and 1*d* at the time when the above described integration is carried out, and thereby, this conductive paste 8 electrically connects the conductor circuits 5, and the conductive paste 8 is cured in this condition so as to form conductive layers, and thereby, via holes 15 are formed. Furthermore, predetermined portions of the conductor circuit 5 of the sheet 1*d* are connected to the conductive paste 8 that has filled the through holes 3 of the sheet 13*c* with a metal foil, at the time when the above described integration is carried out, in the interface between the sheet 1*d* and the sheet 13*c* with a metal foil, and thereby, this conductive paste 8 connects the conductor circuit 5 and the metal foil 9 and the conductive paste 8 is cured in this condition so as to form the conductive layer, and thus, via holes 15 are formed.

At this time, the conductive paste 8 has been compressed in the through holes 3 of the wiring board sheet 1*e* and of the sheet 13*c* with a metal foil, in advance, as described above. Via holes 15 having a high conductivity and highly reliable connections are formed. In addition, the conductive paste 8 protruding from the openings of the through holes 3 in the wiring board sheet 1*d*, and these protruding portions of the conductive paste 8 are pressed into the through holes 3 by applying pressure at the time of the above described integration so as to be compressed, and thereby, via holes 15, having a high conductivity and highly reliable connections, are formed.

This heating and pressing molding is carried out in a condition where the curing response of the resin layer 4 in the B-stage and of the conductive paste 8 progresses, and though this condition depends on the makeup of the resin composition that forms the resin layer 4, it is preferable to carry out the molding for 60 to 90 minutes under the condition where the heating temperature is 160° C. to 185° C. and the applied pressure is 0.3 MPa to 5 MPa. In the multilayer board 11 that has been gained in such a manner, as shown in FIG. 22(*b*), metal foils 9 are placed on the outermost layers on both sides of the multilayer board, and a two-layered conductor circuit 5 is placed inside the multilayer board where via holes 15 are formed so as to electrically connect the respective layers. In addition, electric components 10 are placed inside the two layers from among the three insulation layers 16.

Furthermore, an etching treatment is carried out on the metal foils 9 on the external surfaces so as to form the conductor circuits 5 on the respective external layers on both sides of the multilayer board, and thereby, as shown in FIG. 22(*c*), a multilayer board 11, having a four-layered conductor circuit 5, can be gained.

Figure 7:
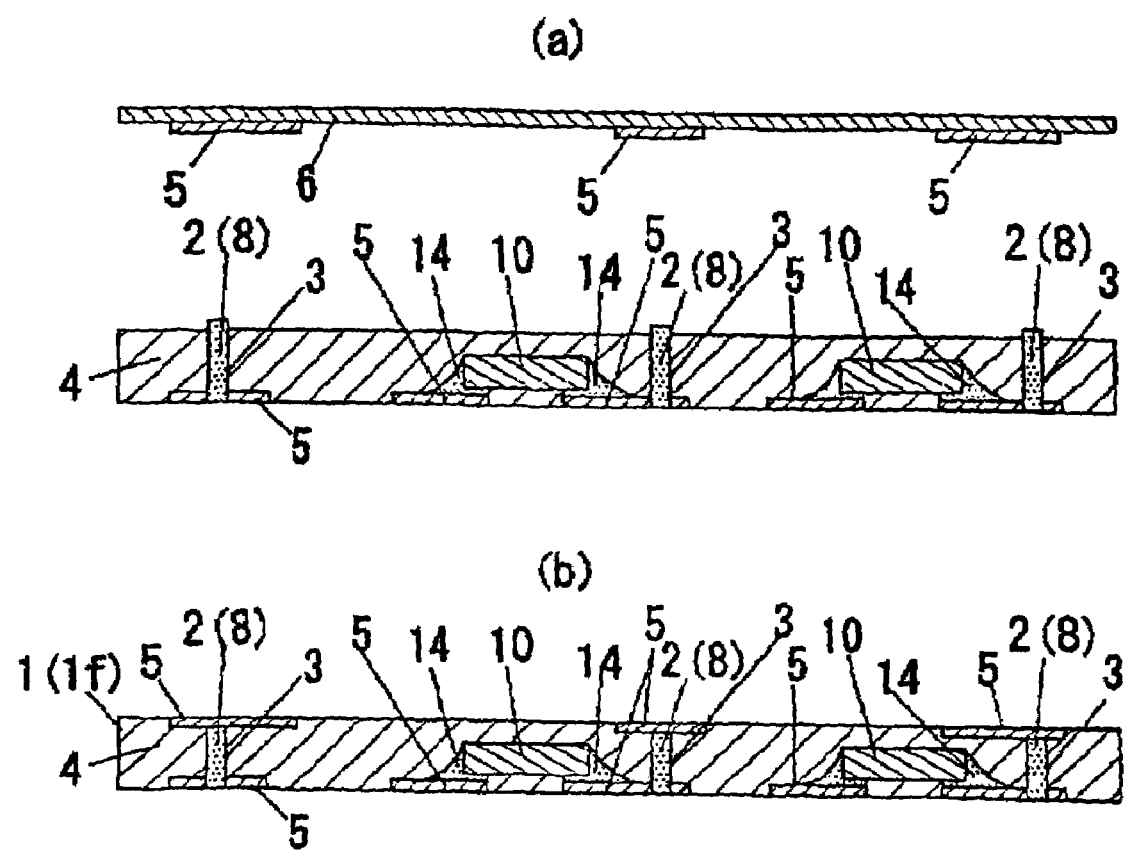
FIGS. 7(*a*) and 7(*b*) are cross sectional views showing still another example of a manufacturing process for a wiring board sheet.
Figure 16:
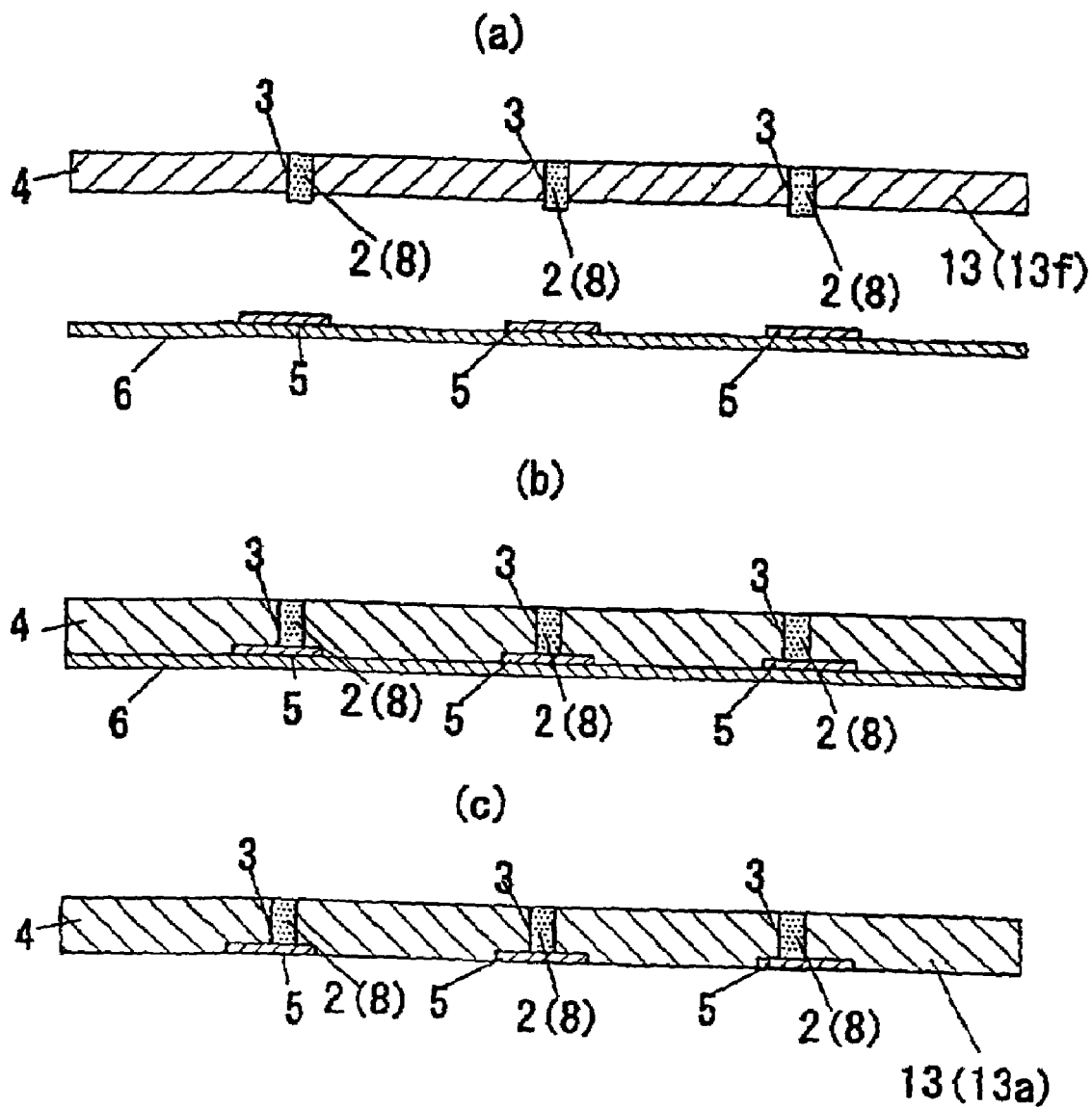
FIGS. 16(*a*) to 16(*c*) are cross sectional views showing an example of a manufacturing process for a sheet.
Figure 23:
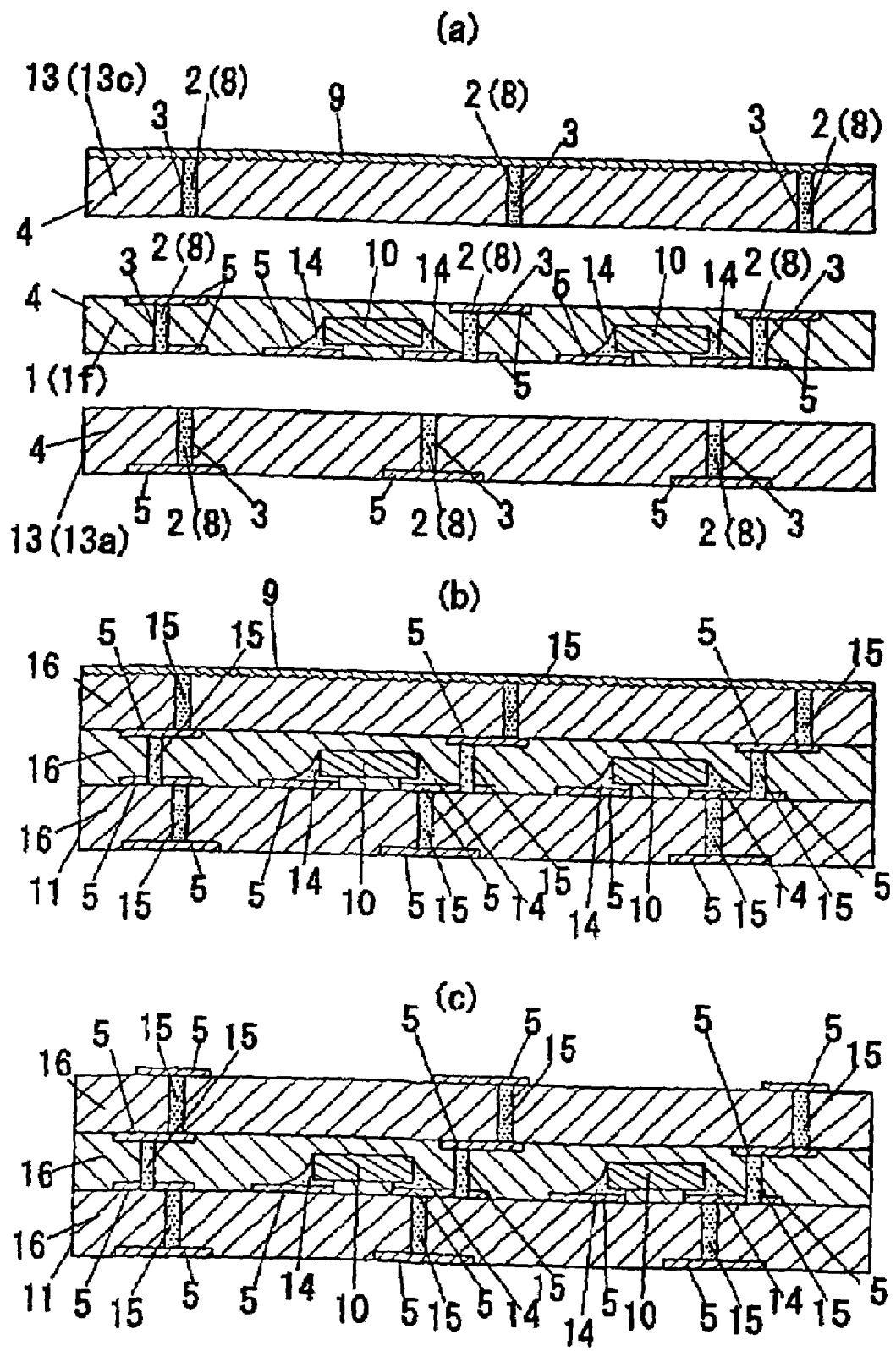
FIGS. 23(*a*) to 23(*c*) are cross sectional views showing another example of a manufacturing process for a multilayer board.

In an example shown in FIGS. 23(*a*) to 23(*c*), one wiring board sheet 1*f* gained in accordance with the process shown in FIGS. 7(*a*) and 7(*b*), one sheet 13*a* with a circuit on one side that is gained in accordance with the process shown in FIGS. 16(*a*) to 16(*c*), and one sheet 13*c* with a metal foil that is gained in accordance with the process shown in FIGS. 18(*a*) and 18(*b*) are used and these sheets are layered and integrated.

In the example shown in FIGS. 23(a) to 23(c), a condition is achieved where the surface of the sheet 13c with a metal foil on which the metal foil 9 has not been formed, and one surface of the wiring board sheet 1f (surface on which a conductor circuit 5, on which no electric components 10 have been mounted, has been formed) are opposite to each other, and the other surface of the wiring board sheet 1f (the surface on which a conductor circuit 5, on which electric components 10 have been mounted, has been formed) and the surface of the sheet 13a, with a circuit on one side on which no conductor circuit 5 has been formed, are opposite to each other, and these sheets are layered. At this time, the respective surfaces that are opposite to each other are positioned so that the predetermined portions of the conductor circuits 5 are placed on the positions of the openings of the through holes 3.

Heating and pressing molding is carried out in this condition, and thereby, the wiring board sheet 1f, the sheet 13a with a circuit on one side, and the sheet 13c with a metal foil, are collectively layered.

In this molding process, the resin layer 4 in the B-stage is cured after being melted, and thereby, the interfaces between the sheet 13c with a metal foil and the wiring board sheet 1f, and between the wiring board sheet 1f and the sheet 13a with a circuit on one side, are joined, so that these sheets are layered and integrated where the insulation layers 16 are formed of the cured resin layers 4. In addition, the conductive paste 8 is cured to form the conductive layers in the through holes 3 filled with the conductive paste 8, and thereby, via holes 15, for electrically connecting the conductor circuits 5, and for electrically connecting the metal foil 9 to the conductor circuit 5, are formed. At this time, the conductive paste 8, that has filled the through holes 3 of the sheet 1f, has connected the conductor circuits 5 in advance, as described above, and the conductive paste 8, is cured in this condition so as to form the conductive layers, and thus, the via holes 15 are formed. In addition, in the interface between the wiring board sheet 1f and the sheet 13c with a metal foil, predetermined portions of the conductor circuit 5 of the wiring board sheet 1f are connected to the conductive paste 8 that has filled the through holes 3 of the sheet 13c with a metal foil at the time of the above described integration, and thereby, this conductive paste 8 connects the conductor circuits 5, and the conductive paste 8 is cured in this condition so as to form the conductive layers, and thus, the via holes 15 are formed. Furthermore, in the interface between the wiring board sheet 1f and the sheet 13a with a circuit on one side, predetermined portions of the conductor circuit 5 of the wiring board sheet 1f are connected to the conductive paste 8, that has filled the through holes 3 of the sheet 13a with a circuit on one side, at the time of the above described integration, and thereby, this conductive paste 8 connects the conductor circuit 5 and the metal foil 9, so that the conductive paste 8 is cured in this condition so as to form the conductive layers, and thus, the via holes 15 are formed.

In addition, at this time, the through holes 3 of the wiring board sheet 1f, the sheet 13a with a circuit on one side, and the sheet 13c with a metal foil, have been filled in with the conductive paste 8 in a highly compressed manner, in advance, as described above, and therefore, via holes 15, having a high conductivity and highly reliable connections, are formed.

This heating and pressing molding is carried out in a condition where the curing response of the resin layer 4 in the B-stage and of the conductive paste 8 progresses, and this condition can be set at the same levels as in the above described cases.

In the multilayer board 11 gained in the above described manner, as shown in FIG. 23(b), the metal foil 9 is placed on one of the outermost layers, and the conductor circuit 5 is placed on the other outermost layer while the two-layered conductor circuit 5 is placed inside the multilayer board and the via holes 15 for electrically connecting the respective layers are formed. In addition, the electric components 10 are placed inside one layer from among the three insulation layers 16.

In addition, an etching treatment can be carried out on the metal foils 9 on the external surfaces so that conductor circuits 5 are formed on the external layers on both sides of the multilayer board, and a multilayer board 11 having a 4-layered conductor circuit 5 can be gained as shown in FIG. 23(c).

Figure 24:
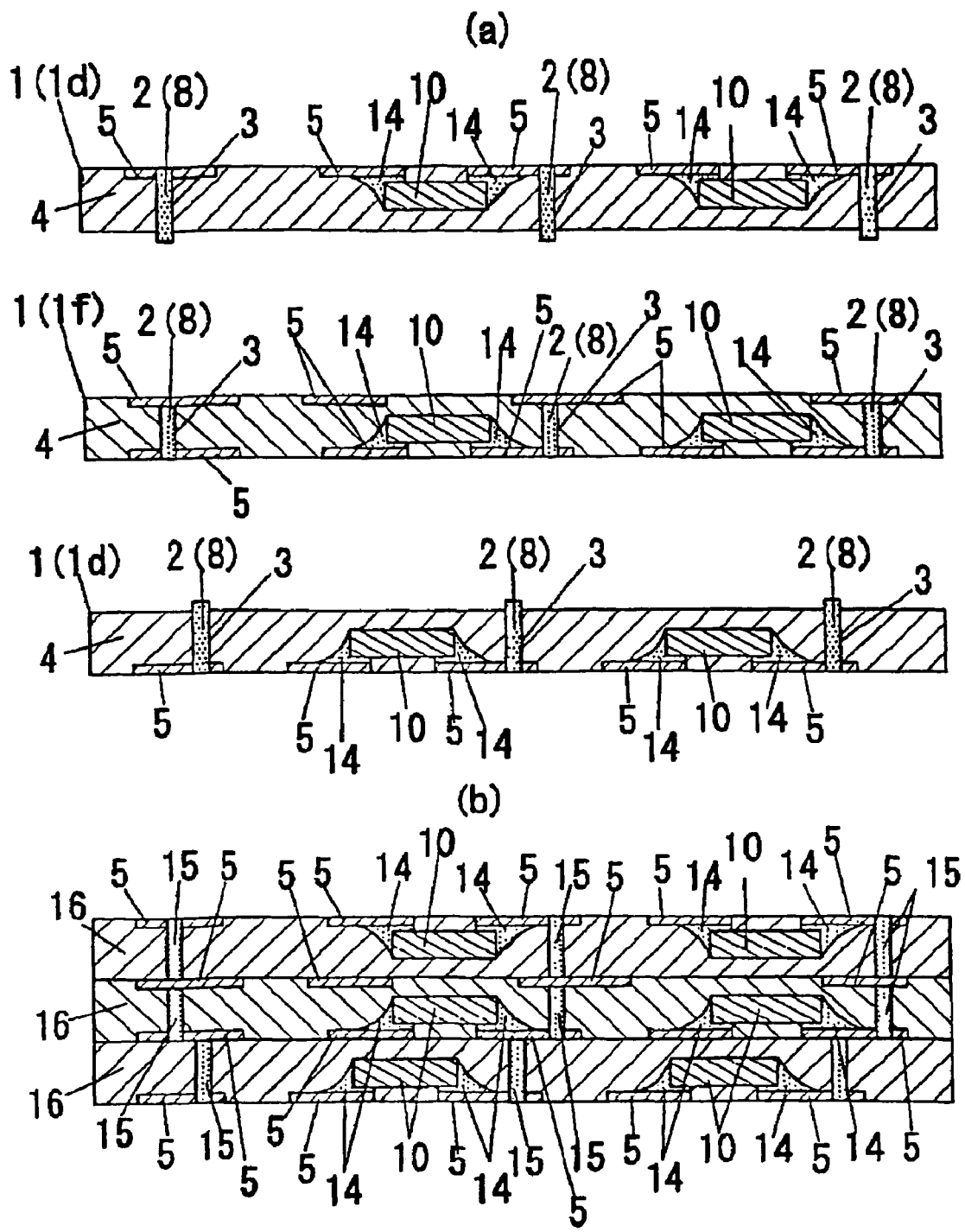
FIGS. 24(*a*) and 24(*b*) are cross sectional views showing still another example of a manufacturing process for a multilayer board.

In an example shown in FIGS. 24(a) and 24(b), two wiring board sheets 1d gained in accordance with the process shown in FIG. 5(a) to 5(d), and one wiring board sheet 1f gained in accordance with the process shown in FIGS. 7(a) and 7(b), are layered and integrated.

In the example shown in FIGS. 24(a) and 24(b), first, a condition is achieved where the surface of one of the wiring board sheets 1d on which the conductor circuit 5 has not been formed, and the surface of the wiring board sheet 1f (the surface on which the conductor circuit 5, on which the electric components 10 have not been mounted, has been mounted) are opposite to each other, and the other surface of the wiring board sheet 1f (the surface on which the conductor circuit 5, on which the electric components 10 have been mounted, has been formed) and the surface of the other wiring board sheet 1d, on which the conductor circuit 5 has not been formed, are opposite to each other, and then, these sheets are layered. At this time, on the respective surfaces that are opposite to each other, predetermined portions of the conductor circuits 5 are positioned so as to be placed on the positions of the openings of the through holes 3.

Heating and pressing molding is carried out in this condition, and thereby, the two wiring board sheets 1d and the one wiring board sheet 1f are collectively layered and integrated.

In this molding process, the resin layer 4 in the B-stage is cured after being melted, and thereby, the interfaces between one of the wiring board sheets 1d and the wiring board sheet 1f, and between the wiring board sheet 1f and the other wiring board sheet 1d, are joined, so that these sheets are layered and integrated, and the insulation layers 16 are formed of the cured resin layers 4. In addition, the conductive layers are formed of the cured conductive paste 8 in the through holes 3 filled with the conductive paste 8, and thereby, via holes 15, for electrically connecting the conductor circuits 5, are formed. At this time, the conductive paste 8, that has filled the through holes 3 of the wiring board sheet 1f, has connected the conductor circuits 5, in advance, as described above, and the conductive paste 8 is cured in this condition so as to form the conductive layers, and thus, via holes are formed. In addition, in the respective interfaces between the wiring board sheet 1f and the wiring board sheets 1d, predetermined portions of the conductor circuit 5 of the wiring board sheet 1f are connected to the conductive paste 8 that has filled the through holes 3 of the wiring board sheets 1d at the time of the above described integration, and thereby, this conductive paste 8 connects the conductor circuits 5, and the conductive paste 8 is cured in this condition so as to form the conductive layers, and thus, the via holes 15 are formed.

In addition, at this time, the through holes 3 of the wiring board sheet 1f have been filled with the conductive paste 8 in advance, as described above, and therefore, via holes 15, having a high conductivity and highly reliable connections, are formed. Furthermore, the conductive paste 8 protrudes from the openings of the through holes 3 in the wiring board sheets 1d, and these protruding portions of the conductive paste 8 are pressed into the through holes 3, by applying pressure at the time of the above described collective integration, so that the conductive paste is compressed, and thereby, via holes 15, having a high conductivity and highly reliable connections, are formed.

This heating and pressing molding is carried out in a condition where the curing response of the resin layer 4 in the B-stage and of the conductive paste 8 progresses, and this condition can be set at the same levels as in the above described cases.

In the multilayer board 11 that is gained in such a manner, as shown in FIG. 24(b), the conductor circuits 5 are placed on the outermost layers on both sides of the multilayer board, and a two-layered conductor circuit 5 is placed inside the multilayer board, and in addition, via holes 15 for electrically connecting the respective layers are formed. Furthermore, the electric components 10 are placed inside all of the three insulation layers 16.

Figure 25:
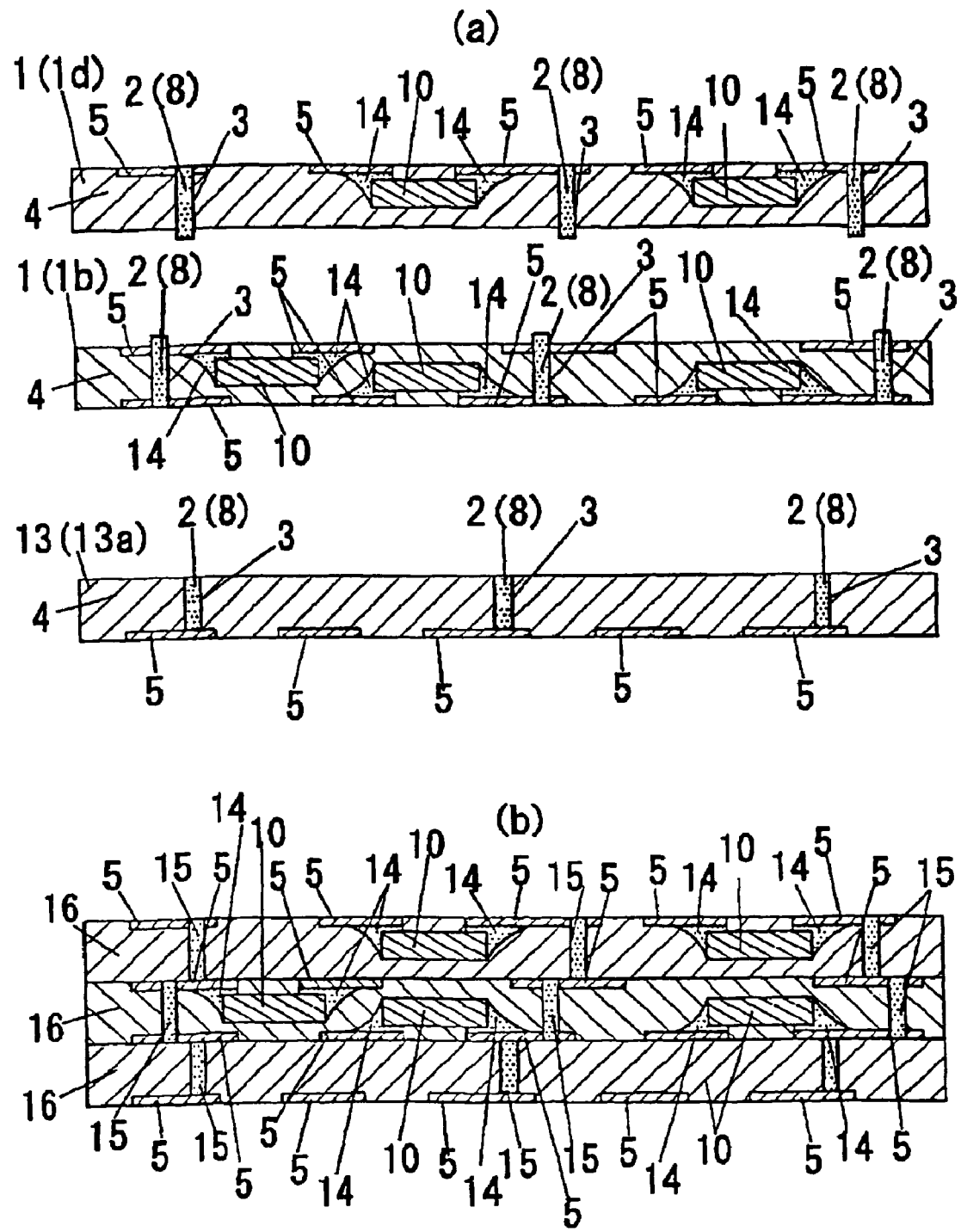
FIGS. 25(*a*) and 25(*b*) are cross sectional views showing still another example of a manufacturing process for a multilayer board.

In an example shown in FIGS. 25(a) and 25(b), one wiring board sheet 1b, gained in accordance with the process shown in FIGS. 3(a) to 3(d), one wiring board sheet 1d, gained in accordance with the process shown in FIGS. 5(a) to 5(d), and one sheet 13a with a circuit on one side, gained in accordance with the process shown in FIGS. 16(a) to 16(c), are used and these sheets are layered and integrated.

In the example shown in FIGS. 25(a) and 25(b), first, a condition is achieved where the surface of the wiring board sheet 1d, on which the conductor circuit 5 has not been formed, and one surface of the wiring board sheet 1b (the surface where the conductive paste 8 protrudes from the through holes 3) are opposite to each other, and the other surface of the wiring board sheet 1b (the surface where the conductive paste 8 does not protrude from the through holes 3) and the surface of the sheet 13a with a circuit on one side, on which the conductor circuit 5 has not been formed, are opposite to each other, and then, these sheets are layered. At this time, on the respective surfaces that are opposite to each other, predetermined portions of the conductor circuits 5 are positioned so as to be placed on the positions of the openings of the through holes 3.

Heating and pressing molding is carried out in this condition, and thereby, the wiring board sheet 1d, the wiring board sheet 1b, and the sheet 13a with a circuit on one side, are collectively layered and integrated.

In this molding process, the resin layer 4 in the B-stage is cured after being melted, and thereby, the interfaces between the wiring board sheet 1d and the wiring board sheet 1b, and between the wiring board sheet 1b and the sheet 13a with a circuit on one side, are joined so that these sheets are layered and integrated where the insulation layers 16 are formed of the cured resin layers 4. In addition, the conductive layers are formed of the cured conductive paste 8 in the through holes 3 filled with the conductive paste 8, and thereby, via holes 15 for electrically connecting the conductor circuits 5 are formed. At this time, the conductive paste 8 that has filled the through holes 3 of the wiring board sheet 1b, has connected the conductor circuits 5 in advance, as described above, and the conductive paste 8 is cured in this condition so as to form the conductive layers, and thus, via holes 15 are formed. Furthermore, in the interface between the wiring board sheet 1d and the wiring board sheet 1b, predetermined portions of the conductor circuit 5 of the wiring board sheet 1b are connected to the conductive paste 8 that has filled the through holes 3 of the wiring board sheet 1d at the time of the above described integration, and thereby, this conductive paste 8 connects the conductor circuits 5, and the conductive paste 8 is cured in this condition so as to form the conductive layers, and thus, the via holes 15 are formed. Additionally, in the interface between the wiring board sheet 1b and the sheet 13a with a circuit on one side, predetermined portions of the conductor circuit 5 of the wiring board sheet 1b are connected to the conductive paste 8 that has filled the through holes 3 of the sheet 13a with a circuit on one side at the time of the above described integration, and thereby, this conductive paste 8 connects the conductor circuits 5 and the conductive paste 8 is cured in this condition so as to form the conductive layers, and thus, the via holes 15 are formed.

In addition, at this time, the through holes 3 of the sheet 13a with a circuit on one side has been filled with the conductive paste 8 in a condensed manner, in advance, as described above, and therefore, the via holes 15, having a high conductivity and highly reliable connections, are formed. Furthermore, the conductive paste 8 protrudes from the openings of the through holes 3 of the wiring board sheets 1b and 1d, and these protruding portions of the conductive paste 8 are pressed into the through holes 3 by applying pressure at the time of the above described collective integration so as to be compressed, and thereby, the via holes 15, having a high conductivity and highly reliable connections, are formed.

This heating and pressing molding is carried out in a condition where the curing response of the resin layer 4 in the B-stage and the conductive paste 8 progresses, and this condition can be set at the same level as in the above described cases.

In the multilayer board 11, gained in the above described manner, as shown in FIG. 25(b), the conductor circuits 5 are placed on the outermost layers on both sides of the multilayer board, respectively, and a two-layered conductor circuit 5 is placed inside the multilayer board where the via holes 15 for electrically connecting the respective layers are formed. In addition, the electric components 10 are placed inside the two layers from among the three insulation layers 16.

Figure 26:
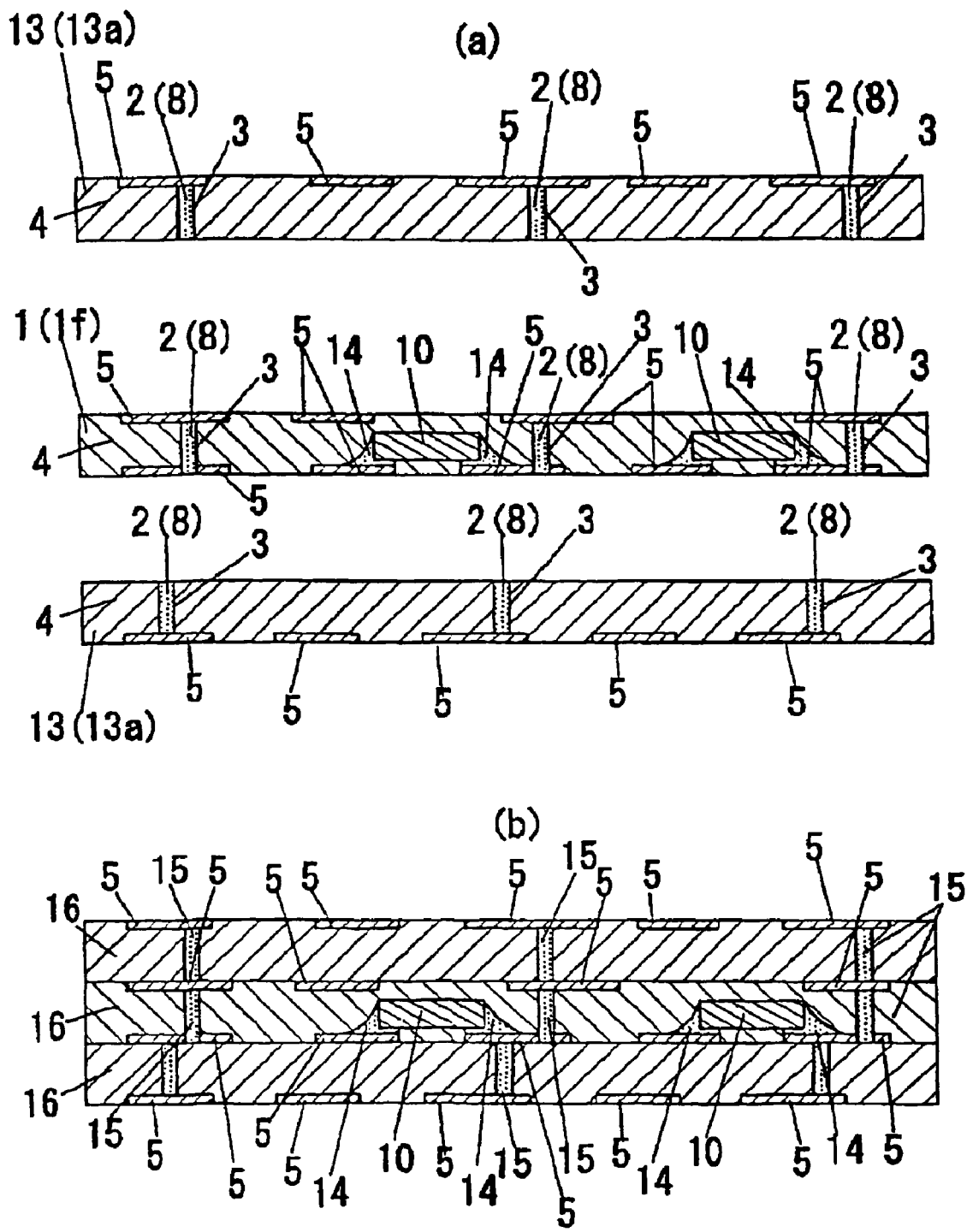
FIGS. 26(*a*) and 26(*b*) are cross sectional views showing still another example of a manufacturing process for a multilayer board.

In an example shown in FIGS. 26(a) and 26(b), one wiring-board sheet 1f gained in accordance with the process shown in FIGS. 7(a) and 7(b) and two sheets 13a with a circuit on one side gained in accordance with the process shown in FIG. 16 are layered and integrated.

In the example shown in FIGS. 26(a) and 26(b), first, a condition is achieved where the surface of one of the sheets 13a with a circuit on one side on which the conductor circuit 5 has not been formed and a surface of the wiring board sheet 1f (the surface on which the conductor circuit 5 on which the electric components 10 have not been mounted has been formed) are opposite to each other and the other surface of sheet 1f with a circuit on one side (the surface on which the conductor circuit 5 on which the electric components 10 have been mounted has been formed), and the surface of the sheet 13a with a circuit on one side on which the conductor circuit 5 has not been formed are opposite to each other, and then, these sheets are layered. At this time, on the respective surfaces that are opposite to each other, predetermined portions of the conductor circuits 5 are positioned so as to be placed on the positions of the openings of the through holes 3.

Heating and pressing molding is carried out in this condition, and thereby, the two sheets 13a with a circuit on one side and the one wiring board sheet 1f are collectively layered and integrated.

In this molding process, the resin layer 4 in the B-stage is cured after being melted, and thereby, the interfaces between one of the sheets 13a with a circuit on one side and the wiring board sheet 1f, and between the wiring board sheet 1f and the other sheet 13a with a circuit on one side are joined so that the sheets are layered and integrated where the insulation layers 16 are formed of the cured resin layers 4. In addition, the conductive paste 8 is cured so as to form the conductive layers in the through holes 3 filled with the conductive paste 8, and thereby, via holes 15 for electrically connecting the conductor circuits 5 are formed. At this time, the conductive paste 8 that has filled the through holes 3 of the wiring board sheet 1f has electrically connected the conductor circuits 5 in advance as described above, and the conductive paste 8 is cured in this condition so as to form the conductive layers, and thus, the via holes 15 are formed. In addition, in the interfaces between the respective sheets 13a with a circuit on one side and the wiring board sheet 1f, predetermined portions of the conductor circuit 5 of the wiring board sheet 1f are connected with the conductive paste 8 that has filled the through holes 3 of the respective sheets 13a with a circuit on one side at the time of the above described integration, and thereby, this conductive paste connects the conductor circuits 5 and the conductive paste 8 is cured in this condition so as to form the conductive layers, and thus, the via holes 15 are formed.

In addition, at this time, the through holes 3 of the wiring board sheet 1f and the respective sheets 13a with a circuit on one side have been filled with the conductive paste 8 that is compressed in advance as described above, and therefore, the via holes 15 having a high conductivity and high reliable connections are formed.

This heating and pressing molding is carried out in a condition where the curing response of the resin layer 4 in the B-stage and of the conductive paste 8 progresses, and this condition can be set at the same level as in the above described cases.

In the multilayer board 11 gained in the above described manner, as shown in FIG. 26(b), the conductor circuits 5 are placed on the outermost layers on both sides respectively, and a two layered conductor circuit 5 is placed inside the multilayer board, and in addition, the via holes 15 for electrically connecting the respective layers are formed. Furthermore, the electric components 10 are placed inside one layer from among the three insulation layers 16.

In the case where the multilayer board is manufactured as described above, the surfaces of the multilayer board become flat and components in sheet form made of the resin layer 4 in the B-stage are layered so that no deformation of the insulation layers 16 occurs in the portions where the conductor circuits 5 have been formed in the molding process in a manner where the insulation layers 16 have highly reliable insulation. Furthermore, the two or more components in sheet form are collectively layered and integrated, and therefore, it is possible to simplify the molding process, saving time and effort for a complicated molding process, and no difference occurs in the thermal histories of the conductor circuits 5 in the respective layers at the time of molding, making the correction based on the contraction ratios of the conductor circuits 5 due to the difference in the thermal histories unnecessary.

In addition, the conductor circuits 5 can be formed in arbitrary portions of the insulation layers 16 in which the via holes 15 have been formed so that there is more freedom in the wiring design and a via-on-via structure and a pad-on-via structure can be easily formed, making the miniaturization of the circuits and an increase in the density easy, and thereby, miniaturization and reduction in the thickness of the wiring board can be achieved and the signal paths can be shortened.

In addition, the wiring board sheet 1 where conductor circuits have been formed on both sides, the sheets 13 and the metal foils 9 are used so that at least one sheet 13 is layered on both sides of the wiring board sheet 1 and the metal foils 9 are placed on the outermost layers, and after the sheets and foils have been layered and integrated, through holes are created so as to penetrate the layered body after being cured, and then, hole plating 18 is formed inside the through holes and subsequently an etching treatment is carried out on the surfaces of the metal foils 9 on the outermost layers so that the conductor circuits 5 are formed, and thereby, the multilayer board 11 can be manufactured. FIGS. 27(a) to 27(c) show one such example.

In an example shown in FIGS. 27(a) to 27(b), one wiring board sheet 1a gained in accordance with the process shown in FIGS. 1(a) to 1(c), two sheets 13f gained in accordance with the process shown in FIGS. 15(a) to 15(d), and two metal foils 9 are used and these sheets and foils are layered and integrated.

Figure 6:
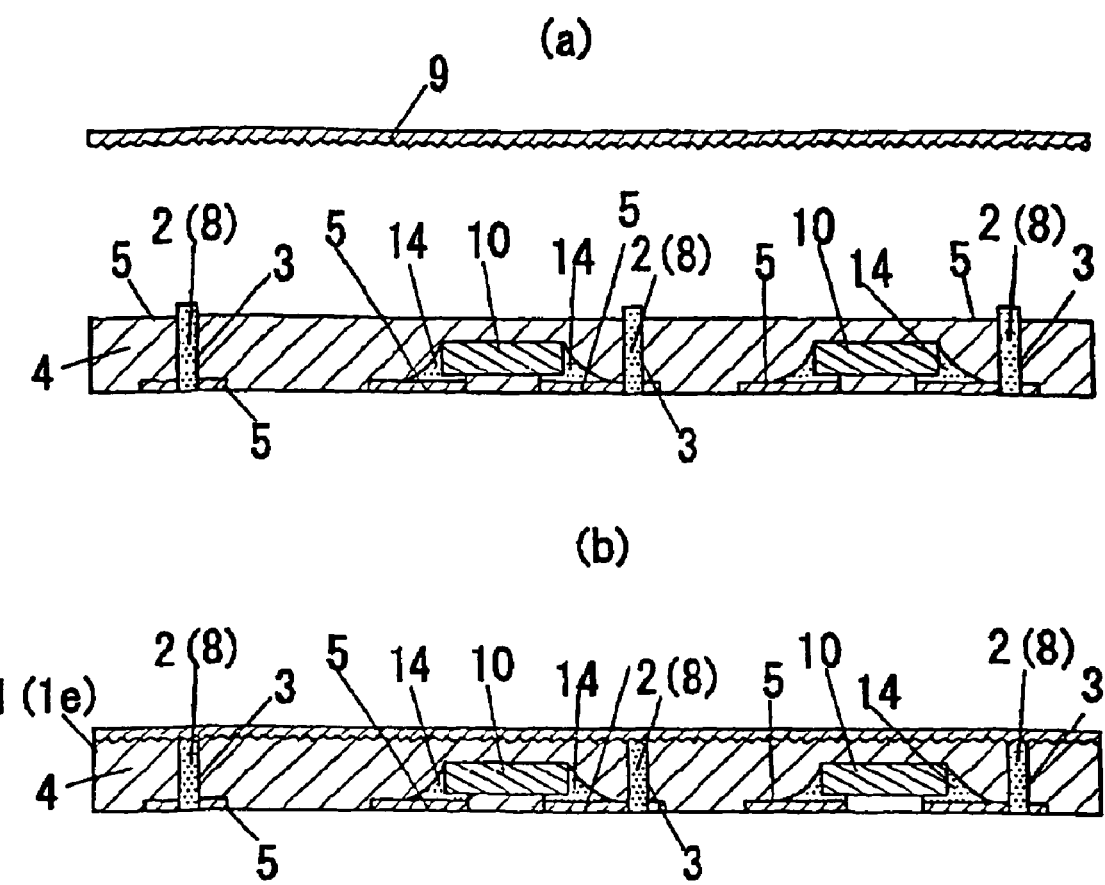
FIGS. 6(*a*) and 6(*b*) are cross sectional views showing still another example of a manufacturing process for a wiring board sheet.

An appropriate metal foil such as a copper foil is used for the metal foil 9 and, for example, the same metal foil as in the case where the wiring board sheet 1e shown in FIG. 6 is manufactured can be used.

In the example shown in FIGS. 27(a) to 27(b), first, the sheets 13f are placed on both sides of the wiring board sheet 1a so that the surfaces of the wiring board sheet 1a on which the conductor circuits 5 have been formed, and one surface of each of the sheets 13f (the surfaces where the conductor paste 8 protrudes from the through holes 3) are opposite to each other and the metal foils 9 are placed on the outer sides of the respective sheets 13f so that the other surface of each of the sheets 13f (the surfaces where the conductor paste 8 does not protrude from the through holes 3) and the rough surfaces of the metal foils 9 are opposite to each other, and then, these sheets and foils are layered. At this time, on the respective surfaces of the wiring board sheet 1a and of the sheets 13f that are opposite to each other, predetermined portions of the conductor circuits 5 are positioned so as to be placed on the positions of the openings of the through holes 3.

Heating and pressing molding is carried out in this condition, and thereby, the wiring board sheet 1a, the sheets 13f and the metal foils 9 are collectively layered and integrated.

In this molding process, the resin layer 4 in the B-stage is cured after being melted, and thereby, the interfaces between the wiring board sheet 1a and the sheets 13f, and between the sheets 13f and the metal foils 9 are joined so as to be layered and integrated where the insulation layers 16 are formed of the cured resin layers 4. In addition, the conductive paste 8 is cured so as to form the conductive layers in the through holes 3 filled with the conductive paste 8, and thereby, the via holes 15 for electrically connecting the conductor circuits 5 are formed. In addition, in the interfaces between the wiring board sheet 1a and the sheets 13f, predetermined portions of the conductor circuits 5 of the wiring board sheet 1a are connected to the conductive paste 8 that has filled the through holes three of the sheets 13f at the time of the above described integration, while in the interfaces between the sheets 13f and the metal foils 9, the metal foils 9 are connected to the conductive paste 8 that has filled the through holes three of the sheets 13*f*, and thereby, the conductive circuits 5 and the metal foils are connected to each other, and the conductive paste 8 is cured in this condition so as to form the conductive layers, and thus, the via holes 15 are formed.

This heating and pressing molding is carried out in a condition where the curing response of the resin layer 4 in the B-stage and of the conductive paste 8 progresses, and this condition can be set at the same level as in the above described cases.

Subsequently, through holes 19 are created in predetermined portions of the gained layered body so as to penetrate the layered body in the direction of layering by means of laser processing. These through holes 19 are created so as to penetrate the respective resin layers 4 (insulation layers 16) and the metal foils 9, and are created so as to penetrate predetermined portions of the conductor circuits 5 in the inner layers (conductor circuits 5 that have been transcribed to the wiring board sheet 1*a*) if necessary.

Figure 27:
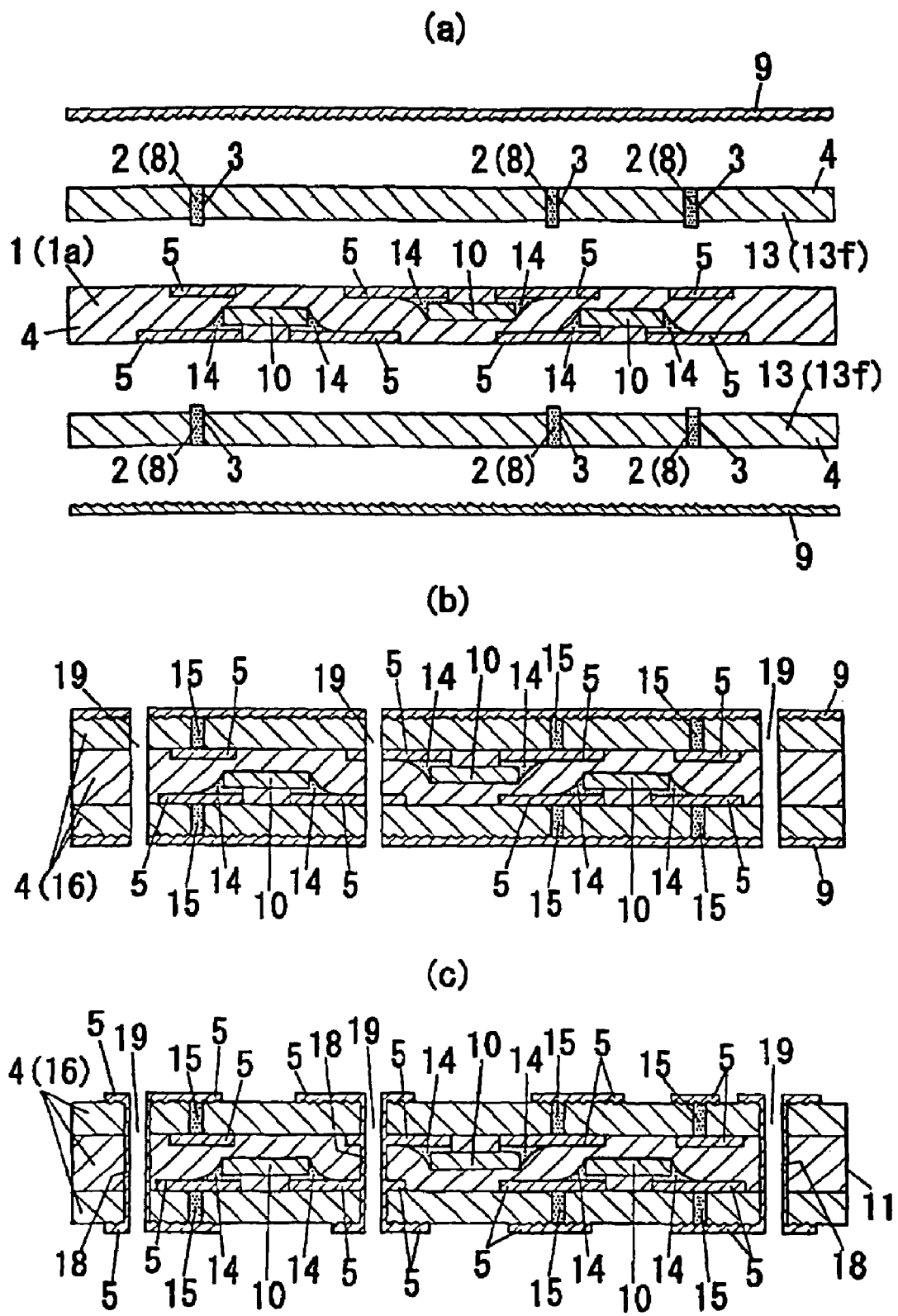
FIGS. 27(*a*) to 27(*c*) are cross sectional views showing still another example of a manufacturing process for a multilayer board.

Next, an electroless plating treatment is carried out on the inner surfaces of the created through holes 19 and electrolytic plating treatment is carried out, if necessary, so that hole plating 18 such as copper plating is formed, and after that, an etching treatment is carried out on the metal foils 9 on the outermost layers so as to form the conductor circuits 5 on the outermost layers (FIG. 27(*c*)).

In the multilayer board 11 gained in this manner, as shown in FIG. 27(*c*), the conductor circuits 5 are placed on the outermost layers on both sides of the multilayer board by carrying out an etching treatment on the respective metal foils 9, and the two layered conductor circuit 5 has been formed inside the multilayer board through transcription from the bases 6 for transcription where the via holes 15 for electrically connecting the respective layers are formed. In addition, the electric components 10 are placed inside one layer from among the three insulation layers 16.

In the case where the multilayer board is manufactured as described above, the surfaces of the multilayer board become flat and components in sheet form made of the resin layer 4 in the B-stage are layered so that no deformation of the insulation layers 16 occurs in the portions where the conductor circuits 5 have been formed in the molding process in a manner where the insulation layers 16 have highly reliable insulation. Furthermore, the two or more components in sheet form are collectively layered and integrated, and therefore, it is possible to simplify the molding process, saving time and effort for a complicated molding process, and no difference occurs in the thermal histories of the conductor circuits in the respective layers at the time of molding, making the correction based on the contraction ratios of the conductor circuits 5 due to the difference in the thermal histories unnecessary.

In addition, the conductor circuits 5 can be formed in arbitrary portions of the insulation layers 16 in which the via holes 15 have been formed so that there is more freedom in the wiring design and a via-on-via structure and a pad-on-via structure can be easily formed, making the miniaturization of the circuits and an increase in the density easy, and thereby, miniaturization and reduction in the thickness of the wiring board can be achieved and the signal paths can be shortened.

In addition, the conductor circuits 5 on the external layers are formed by carrying out an etching treatment on the metal foils 9 after the insulation layers 16 have been formed of the cured resin layers 4, and therefore, the peel strength of the conductor circuits 5 on these external layers is increased, leading to an increase in the land strength, and as a result, the ability of holding the components mounted on the conductor circuits 5 on these external layers is enhanced.

In addition, additional through holes can be created after the integration of the layers so as to penetrate the entirety of the multilayer board 11, which makes more freedom in the wiring design.

Such a creation of through holes that penetrate the entirety of the multilayer board 11 after the integration of the layers is not limited to the present embodiment, but rather such through holes can be created in any combination of the wiring board sheets 1 and the sheets 13 for manufacturing a multilayer board 11.

Figure 28:
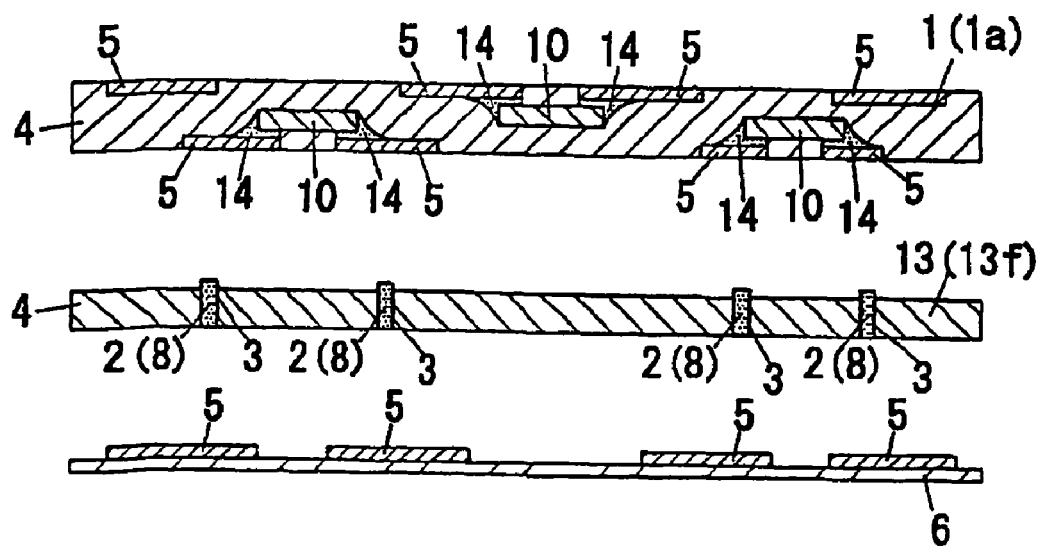
FIGS. 28(*a*) to 28(*c*) are cross sectional views showing still another example of a manufacturing process for a multilayer board.
Figure 28:
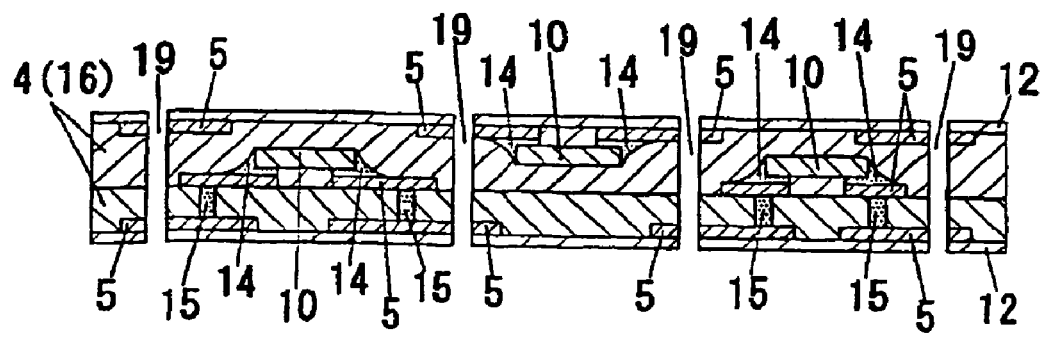
Figure 28:
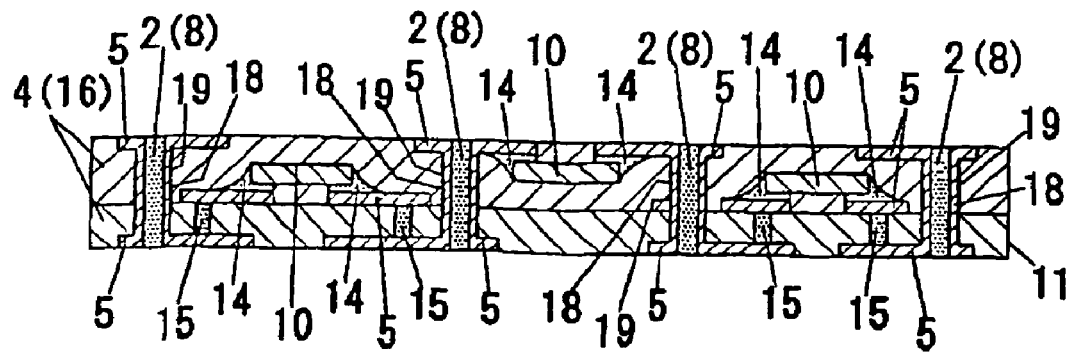

In addition, the through holes 19 are created so as to penetrate the layered body after the integration of the layers so that the hole plating 18 is carried out on the inner surface of the through holes 19, and after that, these through holes 19 are filled in with the conductive paste 8, and thereby, the through holes can be created so as to penetrate the entirety of the multilayer board 11. In this case, the wiring board sheet 1 where the conductor circuits 5 are formed on both surfaces, the sheets 13 having the through holes 3 filled with the conductive paste 8 and the bases 6 for transcription where the conductor circuits 5 are placed on the surfaces, for example, are used so that at least 1 sheet 13 is layered on one or two surfaces of the wiring board sheet 1 and bases 6 for transcription are layered on the external layers of the sheets 13 so that the conductor circuit 5 and the sheets 13 are opposite to each other, and after the sheets and bases have been layered and integrated, the bases 6 for transcription are released, and subsequently the protective films 12 are layered on both surfaces of the layered body. In this condition, the layered body is cured, and after that, the through holes 19 are created so as to penetrate the layered body where the hole plating 18 is carried out inside the through holes 19 and the through holes are filled in with the conductive paste 8, and then, the protective films 12 are released, and thereby, the multilayer board 11 can be gained. FIGS. 28(*a*) to 28(*c*) show such a example.

In an example shown in FIGS. 28(*a*) to 28(*c*) the wiring board sheet 1 where the conductor circuits 5 have been formed on both sides (the wiring board sheet 1*a* gained in accordance with the process shown in FIGS. 1(*a*) to 1(*c*) in the illustrated example), the sheet 13*f* gained in accordance with the process shown in FIGS. 15(*a*) to 15(*b*) and the base 6 for transcription where the conductor circuit 5 has been formed on a surface are used and these sheets and the base are layered and integrated.

The base 6 for transcription on which the conductor circuit 5 has been formed which is the same as described above is herein used. At this time, the base 6 for transcription may be formed of a metal material such as stainless steel, which is the same material as is used in the manufacture of the wiring board sheet 1, or the base 6 for transcription can be formed of a resin film. That is to say, particularly in the case where the conductor circuit 5, to be later transcribed, is formed on the base 6 for transcription and the electric components 10 are mounted at the time of manufacturing the wiring board sheet 1, the temperature of the base 6 for transcription becomes high due to the soldering process at the time of mounting of electric components 10 and sometimes it becomes necessary to apply a large amount of heat so that the resin layer 4 is sufficiently melted and softened at the time when the electric components 10 are buried in the resin layer 4, and therefore, a high resistance to heat is required for the base 6 for transcription while no electric components 10 are mounted on the base 6 for transcription at the time of the formation of this multilayer board 11 where a resistance to heat that is not as high as that at the time of the manufacturing of the wiring board sheet 1 is required, and as a result, the base 6 for transcription can be formed of a resin film. In this case, resin films having an adhesive allowing for a release from the conductor circuit 5 by means of heating or UV light application such as, for example, a known PET film and a fluoride based film can be used.

In the illustrated example, first, the sheet 13f is placed on one or two sides (one side in the illustration) of the wiring board sheet 1a so that the surface of the wiring board sheet 1a on which the conductor circuit 5 has been formed and a surface of the sheet 13f (the surface where the conductive paste 8 protrudes from the through holes 3) are opposite to each other, and the base 6 for transcription on which the conductor circuit 5 has been formed is placed on the outside of the sheet 13f so that the other surface of the sheet 13f (the surface where the conductive paste 8 does not protrude from the through holes 3) and the conductor circuit 5 placed on the base 6 for transcription are opposite to each other, and then, these sheets and the base are layered. At this time, on the surfaces of the wiring board sheet and of the sheet 13f that are opposite to each other, predetermined portions of the conductor circuit 5 are positioned so as to be placed on the positions of the openings of the through holes 3, and on the surfaces of the sheet 13f and of the conductor circuit 9 placed on the base 6 for transcription that are opposite to each other, predetermined portions of the conductor circuit 5 are positioned so as to be placed on the positions of the openings of the through holes 3.

Heating and pressing molding is carried out in this condition, and thereby, the wiring boarding sheet 1a, the sheet 13f and the conductor circuit 5 that has been placed on the base 6 for transcription are collectively layered and integrated.

In this molding process, the resin layer 4 in the B-stage is cured after being melted, and thereby, the interfaces between the wiring board sheet 1a and the sheet 13f, and between the sheet 13f and the conductor circuit 5 (placed on the base 6 for transcription) are joined so that the sheets and the circuit are layered and integrated where the insulation layers 16 are formed of the cured resin layers 4. At this time, the resin layer 4 of the sheet 13f is melted and softened so as to be fluidized and the conductor circuit 5 that has been placed on the base 6 for transcription is buried in this resin layer 4.

In addition, the conductive paste 8 is cured so as to form the conductive layers in the through holes 3 filled with the conductive paste 8, and thereby, the via holes 15 for electrically connecting the conductor circuits 5 are formed. In addition, in the interface between the wiring board sheet 1a and the sheet 13f, predetermined portions of the conductor circuit 5 of the wiring board sheet 1a are connected to the conductive paste 8 that has filled the through holes 3 of the sheet 13f at the time of the above described integration while in the interface between the sheet 13f and the conductor circuit 5 (placed on the base 6 for transcription), predetermined portions of the conductor circuit 5 are connected to the conductive paste 8 that has filled the through holes 3 of the sheet 13f, and thereby, the conductor circuits 5 are connected to each other and the conductive paste 8 is cured in this condition so as to form the conductive layers, and thus, the via holes 15 are formed. In addition, the portions of the conductive paste 8 that protrude from the through holes 3 are pressed into the through holes 3 by applying pressure and predetermined portions of the conductor circuit 5 are buried in the resin layer 4 in the positions where the through holes 3 are located, and thereby, the conductive paste 8 is further pressed into the through holes 3 so as to be compressed, and thereby, the conductivity of the via holes 15 is increased.

This heating and pressing molding is carried out in a condition where the curing response of the resin layer 4 in the B-stage and of the conductive paste 8 progresses, and this condition can be set at the same level as in the above described cases.

Subsequently, after the base 6 for transcription has been released from the gained layered body, the protective films 12 are layered on both sides of the layered body and through holes 19 are created in this condition by means of laser processing so as to penetrate predetermined portions of the layered body in the direction of the layering. These through holes 19 are created so as to penetrate the respective resin layers 4 (insulation layers 16) and are created if necessary so as to penetrate the conductor circuit 5 that has been transcribed to the wiring board sheet 1a so as to penetrate predetermined portions of the conductor circuit 5 that has been newly transcribed to the outermost layers.

Next, an electroless plating treatment is carried out on the inner surfaces of the created through holes 19 and an electrolytic plating treatment is carried out if necessary so that hole plating 18 such copper plating is formed, and after that the conductive paste 8 is applied to the external surface of the protective films 12 so that the through holes 19 are filled in with the conductive paste 8 from the openings of the through holes 19.

Next, after the protective films 12 have been released from the two surfaces of the multilayer board, the conductive paste 8 is cured inside the through holes 19 by applying heat if necessary, and thereby, the through holes are created.

In the multilayer board 11 gained in the above described manner as shown in FIG. 28(c), the conductor circuits 5 are buried in the respective resin layers 4 (insulation layers 16) on the outermost layers on both sides so that the conductor circuits 5 are exposed from the surfaces, and the conductor circuit 5 that has been formed through transcription by using the base 6 for transcription is placed inside the multilayer board where the via holes 15 for electrically connecting the respective layers are formed. In addition, the electric components 10 are placed inside one of the insulation layers 16.

In the case where the multilayer board is manufactured as described above, the surfaces of the multilayer board become flat and components in sheet form made of the resin layer 4 in the B-stage are layered so that no deformation of the insulation layers 16 occurs in the portions where the conductor circuits 5 have been formed in the molding process in a manner where the insulation layers 16 have highly reliable insulation. Furthermore, the two or more components in sheet form are collectively layered and integrated, and therefore, it is possible to simplify the molding process, saving time and effort required for a complicated molding process, and no difference occurs in the thermal histories of the conductor circuits in the respective layers at the time of molding, making the correction based on the contraction ratios of the conductor circuits 5 due to the difference in the thermal histories unnecessary.

In addition, the conductor circuits 5 can be formed in arbitrary portions of the insulation layers 16 in which the via holes 15 have been formed so that there is more freedom in the wiring design and a via-on-via structure and a pad-on-via structure can be easily formed, making the miniaturization of the circuits and an increase in the density easy, and thereby, miniaturization and reduction in the thickness of the wiring board can be achieved and the signal paths can be shortened.

In addition, additional through holes can be created after the integration of the layers so as to penetrate the entirety of the multilayer board, which makes more freedom in the wiring design. In particular, these through holes secure the conductivity by means of the hole plating 18 and the conductive paste 8, and have highly reliable conductivity.

Such a creation of through holes that penetrate the entirety of the multilayer board 11 after the integration of the layers is not limited to the present embodiment, but rather in any combination of the wiring board sheets 1 and the sheets 13 for manufacturing a multilayer board 11, through holes 19 are created so as to penetrate the entirety of the layered body that has been gained by integrating the above described combined layers and, after hole plating 18 has been placed on the inner surfaces of the through holes 19, these through holes 19 are filled in with the conductive paste 8, and thereby, through holes can be created so as to penetrate the entirety of the multilayer board 11. At this time, though the through holes penetrating the entirety of the multilayer board 11 have long paths, highly reliable conductivity can be secured by combining the hole plating 18 and the conductive paste 8.

Figure 29:
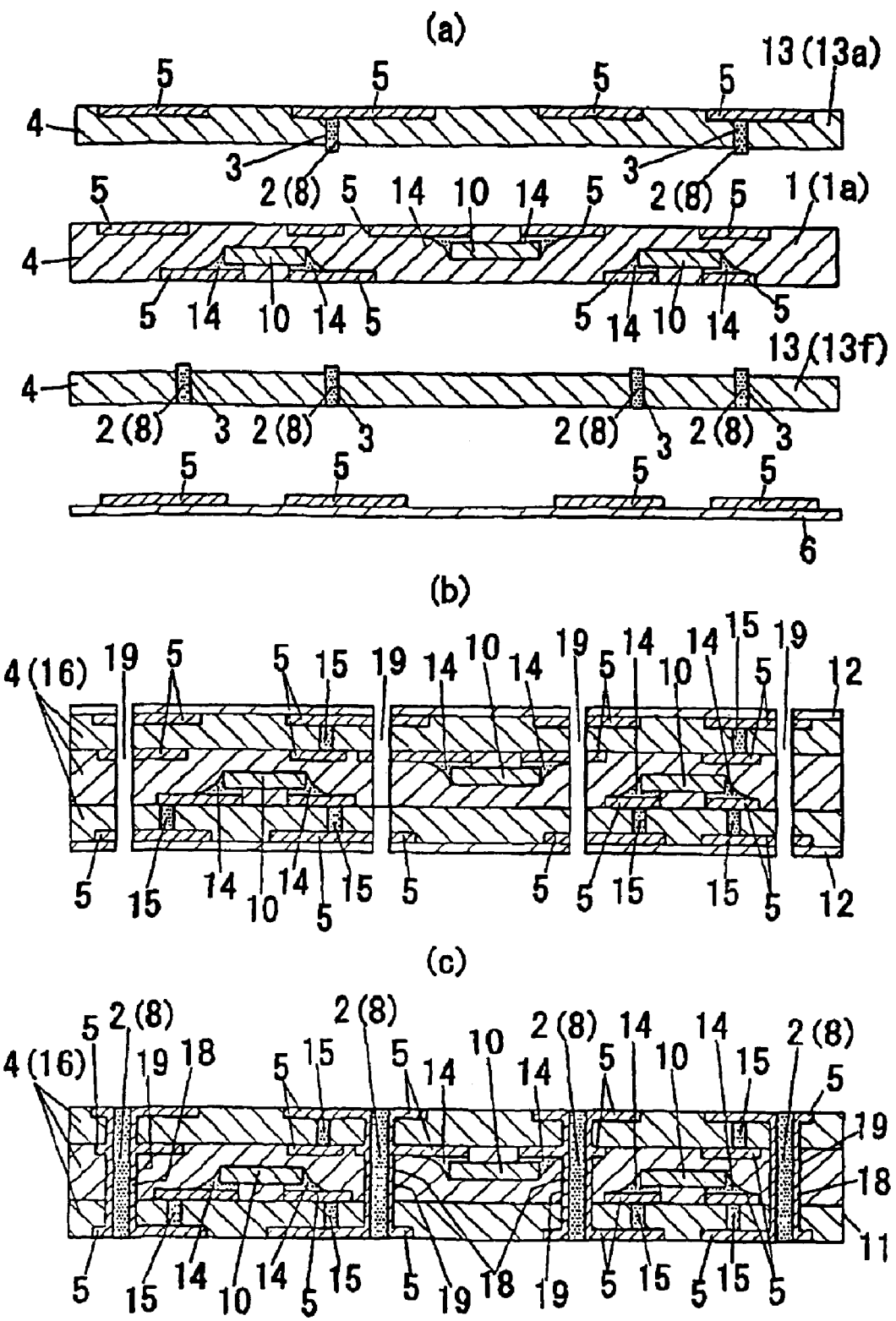
FIGS. 29(*a*) to 29(*c*) are cross sectional views showing still another example of a manufacturing process for a multilayer board.

In addition, the embodiment shown in FIGS. 28(*a*) to 28(*c*) can be modified so that the base 6 for transcription on which the conductor circuit 5 has been placed is not used and the sheet 13*a* shown in FIGS. 16(*a*) to 16(*c*) is used in place of the sheet 13*f*. In addition, in the case where the sheets 13 are layered on the two surfaces of the wiring board sheet 1, the sheet 13*f* and the base 6 for transcription on which the conductor circuit 5 has been placed can be layered on one surface of the wiring board sheet 1 while the sheet 13*a* shown in the FIGS. 16(*a*) to 16(*c*) can be layered on the other surface of the wiring board sheet 1. FIGS. 29(*a*) to 29(*c*) show such an example.

In an example shown in FIGS. 29(*a*) to 29(*c*), a wiring board sheet 1, where the conductor circuits 5 have been formed on both sides (the wiring board sheet 1*a* gained in accordance with the process shown in FIGS. 1(*a*) to 1(*c*) in the illustrated example), a sheet 13*f* gained in accordance with the process, shown in FIGS. 15(*a*) to 15(*d*), a sheet 13*a* gained in accordance with the process, shown if FIGS. 16(*a*) to 16(*c*), and a base 6 for transcription, where the conductor circuit 5 has been formed on a surface, are used, and these sheets and the base are layered and integrated.

In the example shown in FIGS. 29(*a*) to 29(*c*), first, the sheet 13*f* is placed on one surface side of the wiring board sheet 1*a* so that the surface of the wiring board sheet 1*a*, on which the conductor circuit 5 has been formed, and one surface of the sheet 13*f* (the surface where the conductive paste 8 protrudes from the through holes 3) are opposite to each other, and the base 6 for transcription, on which the conductor circuit 5 has been formed, is placed outside of the sheet 13*f* so that the other surface of the sheet 13*f* (the surface where the conductive paste 8 does not protrude from the through holes 3) and the conductor circuit 5 placed on the base 6 for transcription are opposite to each other, and these sheets and the base are layered. At this time, on the surfaces of the wiring board sheet 1*a* and the sheet 13*f* that are opposite to each other, predetermined portions of the conductor circuit 5 are positioned so as to be placed on the positions of the openings of the through holes 3, and on the surfaces of the sheet 13*f* and the conductor circuit 9 that has been placed on the base 6 for transcription that are opposite to each other, predetermined portions of the conductor circuit 5 are positioned so as to be placed on the positions of the openings of the through holes 3.

In addition, the sheet 13*a* is layered and placed on the other surface of the wiring board sheet 1*a* so that the surface of the wiring board sheet 1*a*, on which the conductor circuit 5 has been formed, and one surface of the sheet 13*a* (the surface where the conductive paste 8 protrudes from the through holes 3) are opposite to each other. At this time, on the surfaces of the wiring board sheet 1*a* and the sheet 13*a* that are opposite to each other, predetermined portions of the conductor circuit 5 are positioned so as to be placed on the positions of the openings of the through holes 3.

Heating and pressing molding is carried out in this condition so that the wiring board sheet 1*a*, the sheet 13*a*, the sheet 13*f* and the conductor circuit 5 that has been placed on the base 6 for transcription, are collectively layered and integrated.

In this molding process, the resin layers 4 in the B-stage are cured after being melted, and thereby, the interface between the wiring board sheet 1*a* and the sheet 13*f*, the interface between the sheet 13*f* and the conductor circuit 5 (that has been placed on the base 6 for transcription), and the interface between the wiring board sheet 1*a* and the sheet 13*a*, are respectively joined so as to be layered and integrated where the insulation layers 16 are formed of the cured resin layers 4. At this time, the resin layer 4 of the sheet 13*f* is melted and softened so as to be fluidized so that the conductor circuit 5 that has been placed on the base 6 for transcription is buried in this resin layer 4.

In addition, the conductive paste 8 is cured so as to form the conductive layers in the through holes 3 filled with the conductive paste 8, and thereby, the via holes 15 for electrically connecting the conductor circuits 5 are formed. In addition, in the interface between the wiring board sheet 1*a* and the sheet 13*f*, as well as in the interface between the wiring board sheet 1*a* and the sheet 13*a*, predetermined portions of the conductor circuit 5 of the wiring board sheet 1*a* are connected to the conductive paste 8 that has filled the through holes 3 of the sheets 13*f* and 13*a* at the time of the above described integration, and in the interface between the sheet 13*f* and the conductor circuit 5 (that has been placed on the base 6 for transcription), predetermined portions of the conductor circuit 5 are connected to the conductive paste 8 that has filled the through holes 3 of the sheet 13*f*, so that the conductor circuits 5 are connected to each other, and the conductive paste 8 is cured in this condition so as to form the conductive layers, and thus, the via holes 15 are formed. In addition, the portions of the conductive paste 8 that protrude from the through holes 3 are pressed into the through holes 3 by applying pressure, and particularly, in the interface between the wiring board sheet 1*a* and the sheet 13*f*, predetermined portions of the conductor circuit 5 are buried in the resin layer 4 in the positions where the through holes 3 are located, and thereby, the predetermined portions are further pressed into the through holes 3 so as to be compressed so that the conductivity of the via holes 15 is enhanced.

This heating and pressing molding is carried out in a condition where the curing response of the resin layer 4 in the B-stage and the conductive paste 8 progresses, and this condition is set at the same level as in the above described cases.

Subsequently, after the base 6 for transcription has been released from the gained layered body, the protective films 12 are layered and placed on both sides of the layered body, and through holes 19 are created by means of laser processing in predetermined portions so as to penetrate the layered body in this condition in the direction of the layering. These through holes 19 are created so as to penetrate the respective resin layers 4 (the insulation layers 16) and are created, if necessary, so as to penetrate predetermined portions of the conductor circuits 5, that have been transcribed to the wiring board sheet 1*a* and to the sheet 13*a*, and predetermined portions of the conductor circuit 5 that has been newly transcribed to an external layer.

Next, an electroless plating treatment is carried out on the inner surfaces of the created through holes 19, and an electrolytic plating treatment is carried out, if necessary, so as to form hole plating 18, such as copper plating, and after that, the conductive paste 8 is applied to the external surfaces of the protective films 12 so that the through holes 19 are filled in with the conductive paste 8 from the openings of the through holes 19.

Next, after the protective films 12 on both sides have been released, the conductive paste 8 is cured in the through holes 19 by applying heat, if necessary, so as to complete the through holes.

In the multilayer board 11 gained in this manner, as shown in FIG. 29(*c*), the conductor circuits 5 are placed on the outermost layers on both sides so that the conductor circuits 5 are buried in the resin layers 4 (the insulation layers 16) respectively, and are exposed from the surfaces, and the conductor circuit 5, that has been formed through transcription, is placed in an inner layer of the multilayer board where the via holes 15 for electrically connecting the respective layers are formed. In addition, the electric components 10 are placed inside one insulation layer 16.

Figure 30:
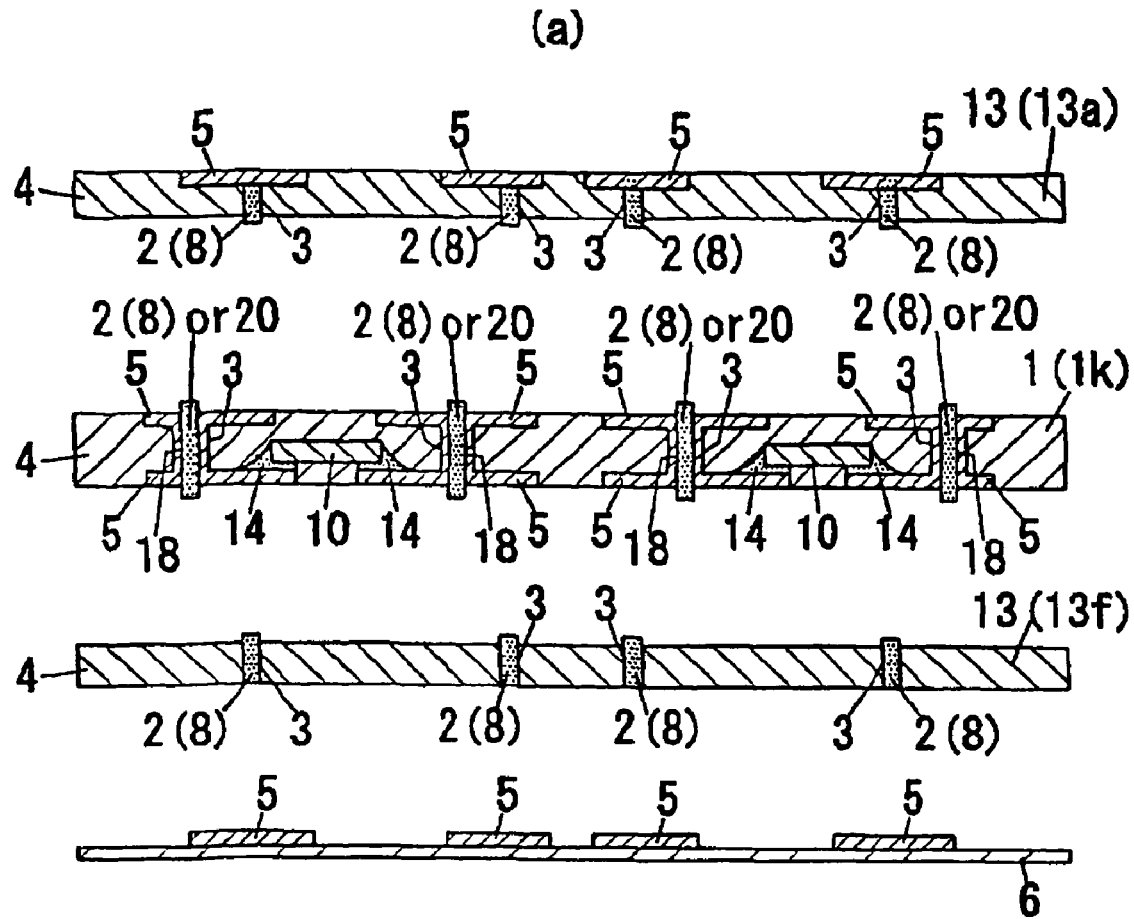
FIGS. 30(*a*) and 30(*b*) are cross sectional views showing still another example of a manufacturing process for a multilayer board.
Figure 30:
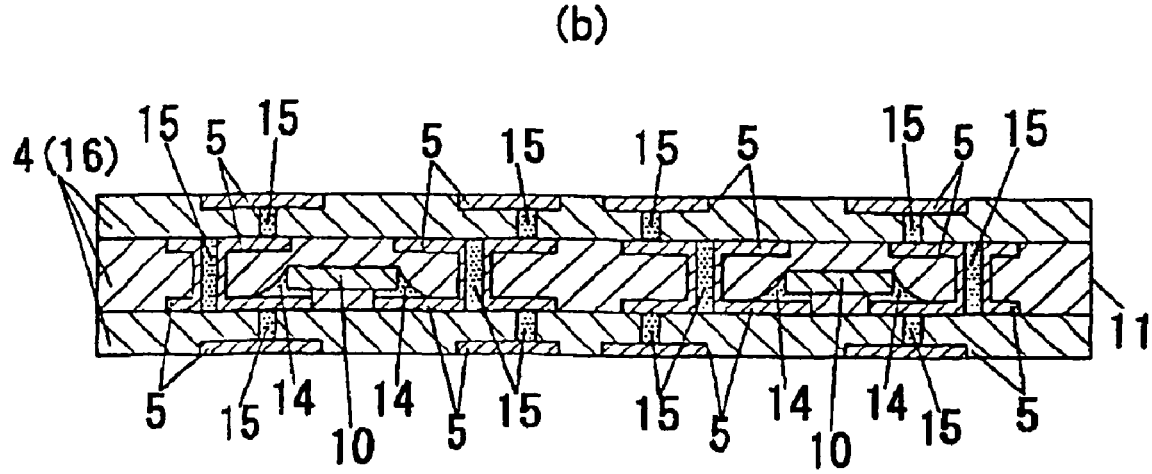

In addition, a wiring board sheet 1, gained in accordance with the process shown in FIGS. 11(*a*) to 11(*c*), a sheet 13*f*, as shown in FIG. 15(*c*), and the base 6 for transcription, on which the conductor circuit 5 has been placed, are used so that at least one sheet 13*f* is layered on one or two surfaces of the wiring board sheet 1, and furthermore, the base 6 for transcription is layered on an external layer so that this conductor circuit 5 and the sheet 13*f* are opposite to each other, and after the layers have been integrated, the base 6 for transcription is released so that the multilayer board 11 can be gained. At this time, the process can be modified so that the base 6 for transcription, on which the conductor circuit 5 has been placed, is not used; the sheet 13*a*, shown in FIGS. 16(*a*) to 16(*c*), is used in place of the sheet 13*f*; and the sheet 13*a* and the wiring board sheet 1 are layered in a manner where the conductor circuit 5, that has been placed on the sheet 13*a*, is placed on the external side of the layered body. In addition, in the case where the sheets 13 are layered on the two surfaces of the wiring board sheet 1, the sheet 13*f* and the base 6 for transcription, on which the conductor circuit 5 has been placed, are layered on one surface of the wiring board sheet 1 while the sheet 13*a*, shown in FIGS. 16(*a*) to 16(*c*), is layered on the other surface of the wiring board sheet 1. FIGS. 30(*a*) and 30(*b*) show such an example.

In the example shown in FIGS. 30(*a*) and 30(*b*), a wiring board sheet 1*k*, gained in accordance with the process shown in FIGS. 11(*a*) to 11(*c*), a sheet 13*f*, gained in accordance with the process shown in FIGS. 15(*a*) to 15(*d*), a sheet 13*a*, gained in accordance with the process shown in FIGS. 16(*a*) to 16(*c*), and the base 6 for transcription, where the conductor circuit 5 has been formed on a surface, are used, and these sheets and the base are layered and integrated. Though in the illustrated example, the wiring board sheet 1*k*, where the electric components 10 have been mounted on only one side of the conductor circuit 5 of the conductor circuits 5 on both sides of the wiring board sheet, is used, the wiring board sheet, where the electric components 10 have been mounted on the conductor circuits 5 on both sides, may, of course, be used.

The base 6 for transcription, on which the conductor circuit 5 has been formed as described above, is used. At this time, though the base 6 for transcription may be formed of a metal material such as stainless steel, in the same manner as the base for transcription that is used for the manufacturing of the wiring board sheet 1, the base 6 for transcription can be formed of a resin film. That is to say, particularly in the case where the conductor circuit 5, to be later transcribed, is formed on the base 6 for transcription, and the electric components 10 are mounted at the time of the manufacturing of the wiring board sheet 1, the temperature of the base 6 for transcription becomes high due to the soldering process, or the like, at the time of the mounting of the electric components 10, and sometimes, a large amount of heat must be applied to the resin layer 4 in a manner where the resin layer 4 is sufficiently melted and softened, so that the electric components 10 are buried in the resin layer 4, and therefore, a high resistance to heat is required for the base 6 for transcription while no electric components 10 are mounted on the base 6 for transcription at the time of the molding of this multilayer board 11, where resistance to heat is not as high as at the time of the manufacturing of the wiring board sheet 1, and as a result, the base 6 for transcription can be formed of a resin film. In this case, a resin film having an adhesive that allows for the release from the conductor circuit 5 due to heat or UV light application, such as, for example, a known PET film or a fluoride based film, can be used.

In the illustrated example, first, the sheet 13*f* is placed on one surface side of the wiring board sheet 1*k* so that the surface of the wiring board sheet 1*a*, on which the conductor circuit 5 has been formed, and one surface of the sheet 13*f* (the surface where the conductive paste 8 protrudes form the through holes 3) are opposite to each other, and the base 6 for transcription, on which the conductor circuit 5 has been formed, is placed on an outer side of the sheet 13*f* so that the other surface of the sheet 13*f* (the surface where the conductive paste 8 does not protrude from the through holes 3) and the conductor circuit 5 that has been placed on the base 6 for transcription, are opposed to each other, and then, these sheets and the base are layered. At this time, on the surfaces of the wiring board sheet 1*k* and the sheet 13*f* that are opposite to each other, predetermined portions of the conductor circuit 5 are positioned so as to be placed on the positions of the openings of the through holes 3, and on the surfaces of the sheet 13 and the conductor circuit 9, that has been placed on the base 6 for transcription, that are opposite to each other, predetermined portions of the conductor circuit 5 are positioned so as to be placed on the positions of the openings of the through holes 3.

In addition, the sheet 13*a* is layered and placed on the other surface side of the wiring board sheet 1*k* so that the surface of the wiring board sheet 1*k*, on which the conductor circuit 5 has been formed, and one surface of the sheet 13*a* (the surface where the conductive paste 8 protrudes from the through holes 3) are opposite to each other. At this time, on the surfaces of the wiring board sheet 1*k* and the sheet 13*a*, predetermined portions of the conductor circuit 5 are positioned so as to be placed on the positions of the openings of the through holes 3.

Heating and pressing molding is carried out in this condition so that the wiring board sheet 1*k*, the sheet 13*a*, the sheet 13*f*, and the conductor circuit 5 that has been placed on the base 6 for transcription, are collectively layered and integrated.

In this molding process, the resin layer 4 in the B-stage is cured after being melted, and thereby, the interface between the wiring board sheet 1k and the sheet 13f, the interface between the sheet 13f and the conductor circuit 5 (placed on the base 6 for transcription) and the interface between the wiring board sheet 1k and the sheet 13a, are respectively joined so as to be layered and integrated where the insulation layers 16 are formed of the cured resin layers 4. At this time, the resin layer 4 of the sheet 13f is melted and softened so as to be fluidized so that the conductor circuit 5 that has been placed on the base 6 for transcription is buried in this resin layer 4.

In addition, the conductive paste 8 is cured so as to form the conductive layers in the through holes 3 of the sheets 13f and 13a filled with the conductive paste 8, and thereby, the via holes 15 are formed. Furthermore, in the interface between the wiring board sheet 1k and the sheet 13f, as well as in the interface between the wiring board sheet 1k and the sheet 13a, predetermined portions of the conductor circuit 5 of the wiring board sheet 1k are connected to the conductive paste 8, that has filled the through holes 3 of the sheets 13f and 13a at the time of the above described integration, and in the interface between the sheet 13f and the conductor circuit 5 (that has been placed on the base 6 for transcription), predetermined portions of the conductor circuit 5 are connected to the conductive paste 8 that has filled the through holes 3 of the sheet 13f, so that the conductor circuits 5 are connected to each other, and the conductive paste 8 is cured in this condition so as to form the conductive layers, and thus, the via holes 15 are formed. In addition, the portions of this conductive paste 8 that protrude from the through holes 3 are pressed into the through holes 3 by applying pressure, and particularly in the interface between the wiring board sheet 1a and the sheet 13f, predetermined portions of the conductor circuit 5 are buried in the resin layer 4 in the positions where the through holes 3 are located, and thereby, the predetermined portions are further pressed so as to be compressed in the through holes 3, and thereby, the conductivity of the via holes 15 is enhanced.

In addition, the portions of the conductive paste 8 or the resin paste 20 that has filled the through holes 3 protruding from the through holes 3, where hole plating 18 has been formed on the inner surfaces, are pressed into the through holes 3 by applying pressure so that the portions are further pressed into the through holes 3 so as to be compressed, and are cured, and thereby, the via holes 15 are formed. These via holes 15 electrically connect the conductor circuits 9 on both sides of the wiring board sheet 1k by means of the hole plating 18, in the case where the through holes are filled in with the resin paste 20, and by means of the hole plating 18 and the cured conductive paste 8 in the case where the through holes are filled in with the conductive paste 8.

This heating and pressing molding is carried out in a condition where the curing response of the resin layer 4 in the B-stage and the conductive paste 8 (as well as the resin paste 20) progresses and this condition can be set at the same level as in the above described cases.

Next, the base 6 for transcription is released from the gained layered body, and thereby, the multilayer board 11 is gained.

In the multilayer board 11 gained in this manner, as shown in FIG. 30(b), the conductor circuits 5 are placed on the outermost layers on both sides of the multilayer board so that the conductor circuits 5 are respectively buried in the resin layers 4 (the insulation layers 16) and are exposed from the surfaces, and the conductor circuit 5, that has been formed through transcription from the base 6 for transcription, is placed in an inner layer of the multilayer board where the via holes 15 for electrically connecting the respective layers are formed. In addition, the electric components 10 are placed inside one insulation layer 16. Furthermore, the conduction of the via holes 15 are secured by the hole plating 18, exhibiting excellent conduction stability, particularly in the insulation layers 16 where the electric components 10 have been buried.

In the case where a multilayer board 11 is fabricated as described above, the surfaces are flat and components in sheet form made of the resin layers 4 in the B-stage are layered, and therefore, no deformation of the insulation layers 16 occurs in the portions where the conductor circuits 5 have been formed in the molding process exhibiting highly reliable insulation in the insulation layers 16. Furthermore, two or more components in sheet form are collectively layered and integrated, and therefore, it is possible to simplify the molding process, saving time and effort required for a complicated molding process, and no differences are made in the thermal histories of the conductor circuits 5 in the respective layers at the time of molding, making the correction, based on the contraction ratio of the conductor circuits 5 due to the difference in the thermal histories, unnecessary.

In addition, the conductor circuits 5 can be formed on arbitrary portions of the insulation layers 16 where the via holes 15 are formed, increasing freedom in the wiring design, and a via-on-via structure and a pad-on-via structure can be easily formed making miniaturization of the circuits, and an increase in the density, easy to be carried out, so that scale-down and reduction in the thickness of the wiring board can be achieved, and the signal paths can be shortened.

In addition, in the embodiment shown in FIGS. 30(a) and 30(b) a wiring board sheet where the through holes 3 having hole plating 18 are filled in with the resin paste 20 is used as the wiring board sheet 1k, and sheets such as the sheets 13f and 13a that are layered on this wiring board sheet 1k where hole plating is not formed inside the through holes 3, so that the conductivity is secured only by the conductive paste 8, can be used as the sheets 13 having the through holes 3 filled with the conductive paste 8. In this case, in the gained multilayer board 11, the thickness of the insulation layers 16 is increased by the thickness of the electric components 10 when the electric components 10 are buried in the resin layers 4 (the insulation layers 16), resulting in an increase in the length of the paths of the via holes 15. However, the conductivity of these via holes 15 is secured by the hole plating 18, and thereby, reliable conductivity of the via holes 15 can be secured. At this time, it is preferable to form the hole plating 18 as thick films by carrying out an electrolytic plating treatment followed by an electroless plating treatment. In addition, the insulation layers 16 where the electric components 10 are not buried in the resin layers 4 (the insulation layers 16) can be formed as thin films so that the paths of the via holes 15 can be shortened, and therefore, the reliable conductivity of the via holes 15 can be secured only by means of the conductive paste.

In addition, a wiring board sheet 1 gained in accordance with the process shown in FIGS. 11(a) to 11(c), a sheet 13f, as shown in FIG. 15(c), and a metal foil 9 such as a copper foil are used so that at least one sheet 13f is layered on one or two sides of the wiring board sheet 1 and the metal foil 9 is layered on the external layer, and after the sheets and the foil have been layered and integrated the base 6 for transcription is released, and thereby, the multilayer board 11 can be gained. At this time, the multilayer board 11 can be modified so that the metal foil 9 is not used and the sheet 13c shown in FIG. 18(b) is used in place of the sheet 13f in a manner where the sheet 13c and the wiring board sheet 1 are layered where the metal foil 9 of the sheet 13c is placed outside. In addition, in the case where the sheets 13 are layered on both sides of the wiring board sheet 1, the sheet 13f and the metal foils 9 are layered on one surface of the wiring board sheet 1, while the sheet 13c shown in FIG. 18(b) can be layered on the other surface of the wiring board sheet 1. FIGS. 31(a) to 31(c) show such an example.

In the example shown in FIGS. 31(a) to 31(c), a wiring board sheet 1k gained in accordance with the process shown in FIG. 11, a sheet 13f gained in accordance with the process shown in FIGS. 15(a) to 15(d), a sheet 13c gained in accordance with the process shown in FIGS. 18(a) and 18(b) and a metal foil 9 are used, and these sheets and the foil are layered and integrated.

An appropriate metal foil such as a copper foil is used as the metal foil 9 and the same metal foil as in the case where the wiring board sheet 1e shown in FIGS. 6(a) and 6(b) is manufactured, for example, can be used.

Though in the illustrated example a wiring board sheet where the electric components 10 have been mounted on the conductor circuits 5 on both sides is used as the wiring board sheet 1k, a wiring board sheet where the electric components 10 are mounted only on the conductor circuit 5 on one side of the wiring board sheet may of course be used.

In the illustrated example, first, the sheet 13f is layered on one surface side of the wiring board sheet 1k so that the surface of the wiring board sheet 1a on which the conductor circuit 5 has been formed and one surface of the sheet 13f (the surface where the conductive paste 8 protrudes from the through holes 3) are opposite to each other, and the metal foil 9 is placed on the outside of the sheet 13f so that the other surface of the sheet 13f (the surface where the conductive paste 8 does not protrude from the through holes 3) and one surface (rough surface) of the metal foil 9 are opposite to each other, and then, these sheets and the foil are layered. At this time, on the surfaces of the wiring board sheet 1k and the sheet 13f that are opposite to each other, predetermined portions of the conductor circuit 5 are positioned so as to be placed on the positions of the openings of the through holes 3.

In addition, the sheet 13c is layered and placed on the other surface side of the wiring board sheet 1k so that the surface on which the conductor circuit 5 of the wiring board sheet 1k has been formed and one surface of the sheet 13c (the surface on which the metal foil 9 is not placed) are opposite to each other. At this time, on the surfaces of the wiring board sheet 1k and the sheet 13c, predetermined portions of the conductor circuit 5 are positioned so as to be placed on the positions of the openings of the through holes 3.

Heating and pressing molding is carried out in this condition so that the wiring board sheet 1k, the sheet 13c, the sheet 13f and the metal foil 9 are collectively layered and integrated.

In this molding process, the resin layers 4 in the B-stage are cured after being melted, and thereby, the interface between the wiring board sheet and the sheet 13f, the interface between the sheet 13f and the metal foil 9 and the interface between the wiring board sheet 1k and the sheet 13c are respectively joined so as to be layered and integrated where the insulation layers 16 are formed of the cured resin layers 4.

In addition, the conductive paste 8 is cured so as to form the conductive layers in the through holes 3 of the sheets 13f and 13c filled with the conductive paste 8, and thereby, the via holes 15 are formed. In addition, in the interface between the wiring board sheet 1k and the sheet 13f as well as in the interface between the wiring board sheet 1k and the sheet 13c, predetermined portions of the conductor circuit 5 on the wiring board sheet 1k are connected to the conductive paste 8 that fills the through holes 3 of the sheets 13f and 13a at the time of the above described integration, and in the interface between the sheet 13f and the metal foil 9, the metal foil 9 is connected to the conductive paste 8 that has filled the through holes 3 of the sheet 13f, and thereby, the conductor circuit 5 and the metal foil 9 are connected so that the conductive paste 8 is cured in this condition so as to form the conductive layers, and thus, the via holes 15 are formed. In addition, the portions of this conductive paste 8 formed on the sheet 13f that protrude from the through holes 3 are pressed into the through holes 3 by applying pressure so as to be compressed in the through holes 3, and thereby, the conductivity of the via holes 15 is increased.

In addition, the portions of the conductive paste 8 or the resin paste 20 that has filled the through holes 3 protruding from the through holes 3 of the wiring board sheet 1k where hole plating 18 is formed on the inner surfaces of the through holes are pressed into the through holes by applying pressure so as to be compressed in the through holes 3 and are cured so as to form the via holes 15. These via holes electrically connect the conductor circuits 9 on both sides of the wiring board sheet 1k by means of the hole plating 18 in the case where the through holes are filled in with the resin paste 20 or by means of the hole plating 18 and the cured conductive paste 8 in the case where the through holes are filled in with the conductive paste 8.

This heating and pressing molding is carried out in a condition where the curing response of the resin layer 4 in the B-stage and the conductive paste 8 (as well as the resin paste 20) progresses and this condition can be set at the same level as in the above described cases.

Subsequently, an etching treatment is carried out on the metal foil 9 placed on the outer layer of the gained layered body, and thereby, the conductor circuit 5 is formed on the outermost layer and the multilayer board 11 is gained.

In the multilayer board 11 gained in this manner, as shown in FIG. 31(c), the conductor circuits 5 are formed by carrying out an etching treatment on the respective metal foils 9 on the outer most layers on both sides of the multilayer board and the conductor circuit 5 formed through transcription to the base 6 for transcription is placed in an inner layer of the multilayer board where the via holes 15 for electrically connecting the respective layers are formed. In addition, the electric components 10 are placed inside one insulation layer 16. Furthermore, particularly in the insulation layer 16 where the electric components 10 have been buried, the conductivity of the via holes 15 is secured by the hole plating 18 exhibiting a high conduction stability.

In the case wherein the multilayer board 11 is fabricated as described above, the surfaces are flat and components in sheet form made of the resin layers 4 in the B-stage are layered, and therefore, deformation of the insulation layers 16 in the portions where the conductor circuits 5 have been formed in the molding process does not occur, and the multilayer board exhibits highly reliable insulation in the insulation layers 16. Furthermore, the two or more components in sheet form are collectively layered and integrated, and therefore, it is possible to simplify the molding process, saving time and effort required for a complicated molding process, and no differences are made in the thermal histories of the conductor circuits 5 in the respective layers at the time of molding, making the correction based on the contraction ratios of the conductor circuits 5 due to the difference in the thermal histories unnecessary.

In addition, the conductor circuits 5 can be formed on arbitrary portions of the insulation layers 16 where the via holes 15 have been formed so that there is more freedom in the wiring design and a via-on-via structure and a pad-on-via structure can be easily formed, and thereby, the miniaturization of the circuits and an increase in the density are made easy to be carried out so that the scale-down and reduction in the thickness of the wiring board can be achieved, and the signal paths can be shortened.

In addition, the conductor circuit 5 on the external layer is formed by carrying out an etching treatment on the metal foil 9 after the insulation layer 16 has been formed of the cured resin layer 4, and thereby, the peel strength of the conductor circuit on this external layer is increased, leading to an increase in the land strength, and the ability of holding the components mounted on the conductor circuit 5 on this external layer is increased.

Figure 31:
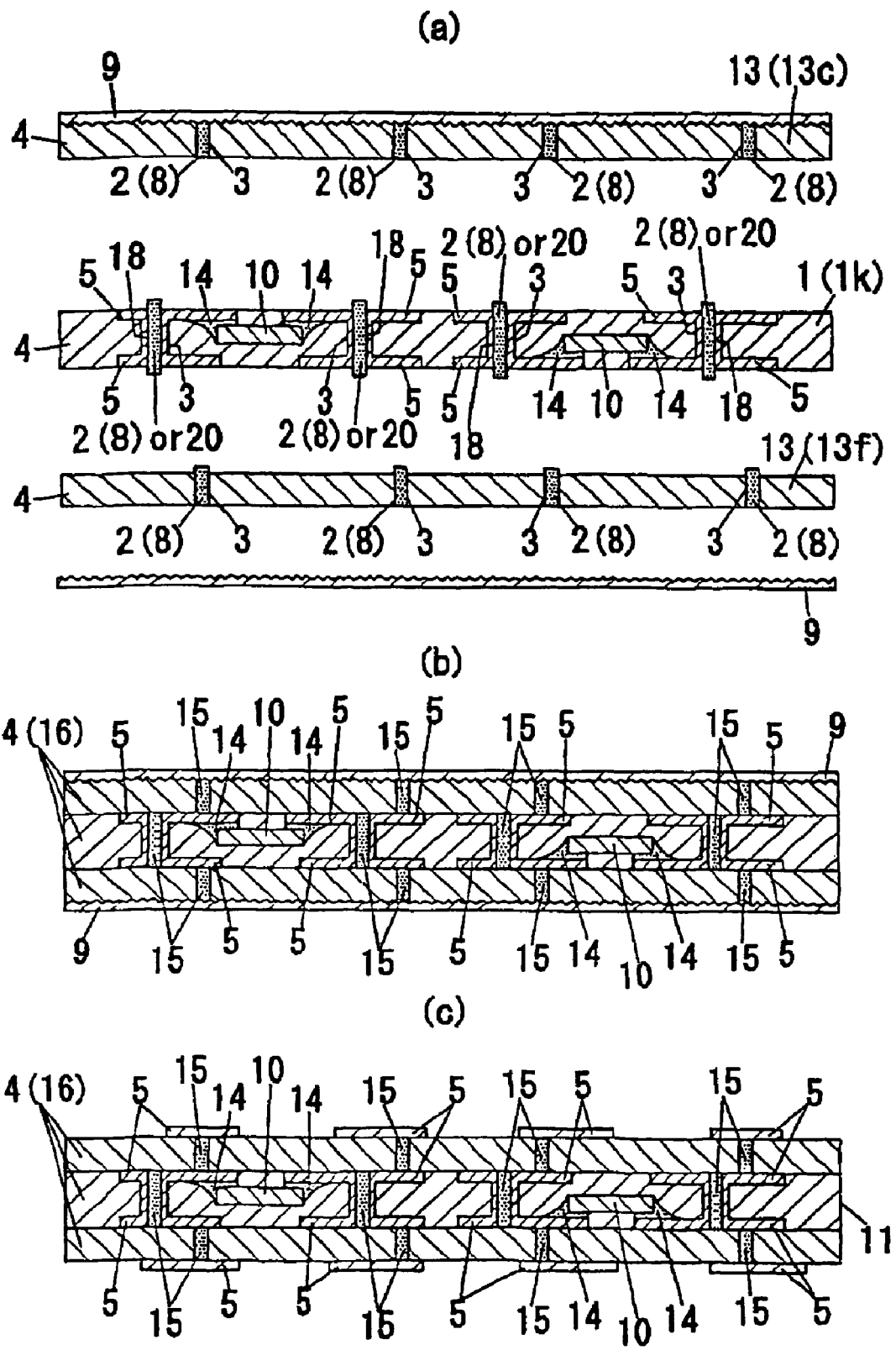
FIGS. 31(*a*) to 31(*c*) are cross sectional views showing still another example of a manufacturing process for a multilayer board.

In addition, in the embodiment shown in FIGS. 31(*a*) to 31(*c*), a wiring board sheet where the through holes 3 having the hole plating 18 are filled in with the resin paste 20 is used as the wiring board sheet 1*k*, particularly in the same manner as in the case shown in FIGS. 30(*a*) and 30(*b*), while a sheet, such as sheets 13*f* and 13*c* layered on this wiring board sheet 1*k*, where the hole plating 18 is not formed in the through holes 3 so that the conductivity is secured only by the conductive paste 8, can be used as the sheet 13 which has through holes 3 filled with the conductive paste 8. In this case, in the gained multilayer board 11, the thickness of the insulation layer 16 is increased by the thickness of the electric components 10 so that the paths of the via holes 15 are elongated when the electric components 10 are buried in the resin layer 4 (the insulation layer 16), and the conductivity of these via holes 15 is secured by the hole plating 18, and thereby, the reliable conductivity of the via holes 15 can be secured. At this time, it is preferable for the hole plating 18 to be formed as a thick film by carrying out an electrolytic plating treatment followed by an electroless plating treatment. In addition, the insulation layer 16 can be formed as a thin film so that the paths of the via holes 15 can be shortened in the resin layer 4 (the insulation layer 16) in which the electric components 10 are not buried, and therefore, the reliable conductivity of the via holes 15 can be secured only by means of the conductive paste 8.

Figure 8:
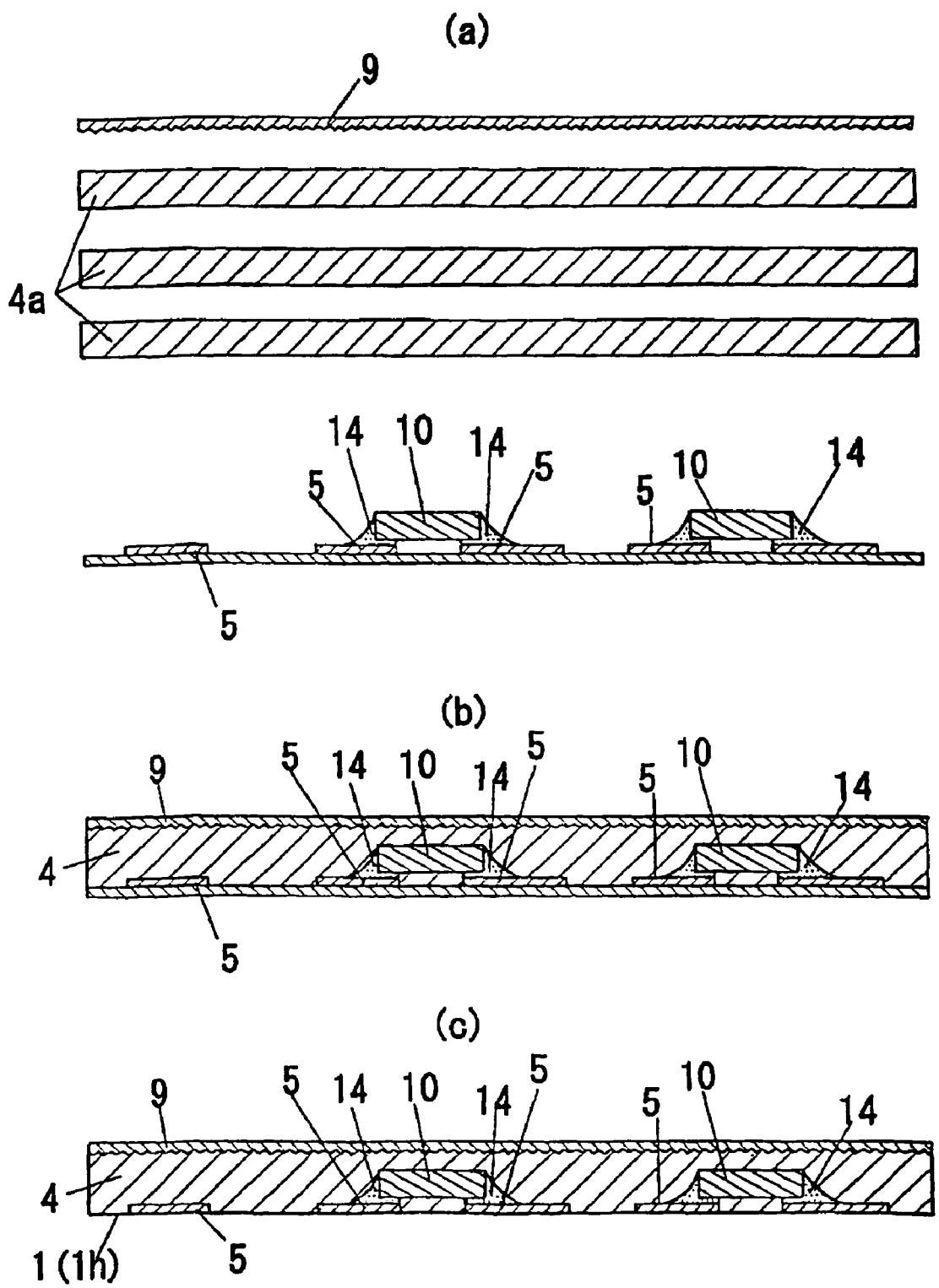
FIGS. 8(*a*) to 8(*c*) are cross sectional views showing still another example of a manufacturing process for a wiring board sheet.
Figure 9:
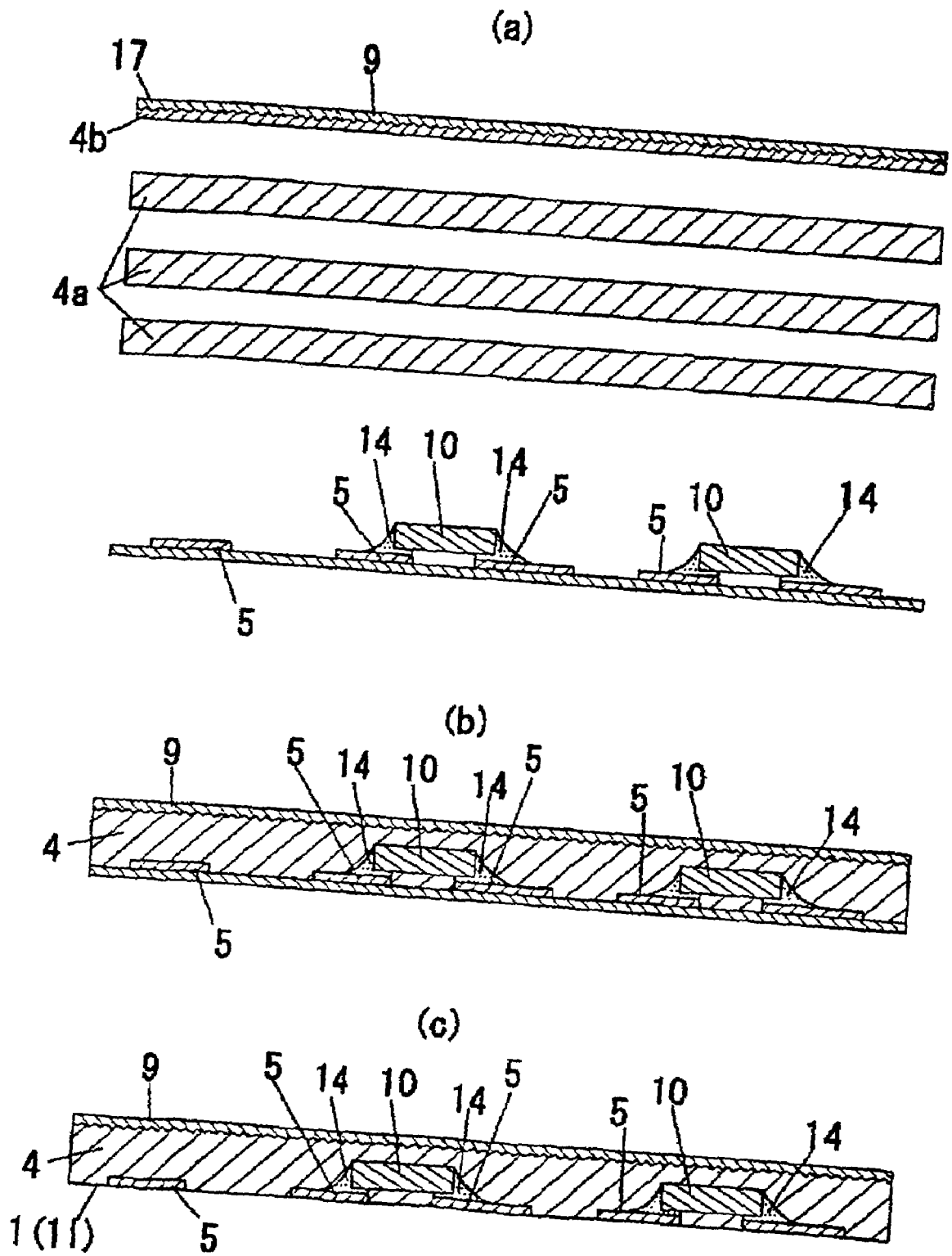
FIGS. 9(*a*) to 9(*c*) are cross sectional views showing still another example of a manufacturing process for a wiring board sheet.
Figure 32:
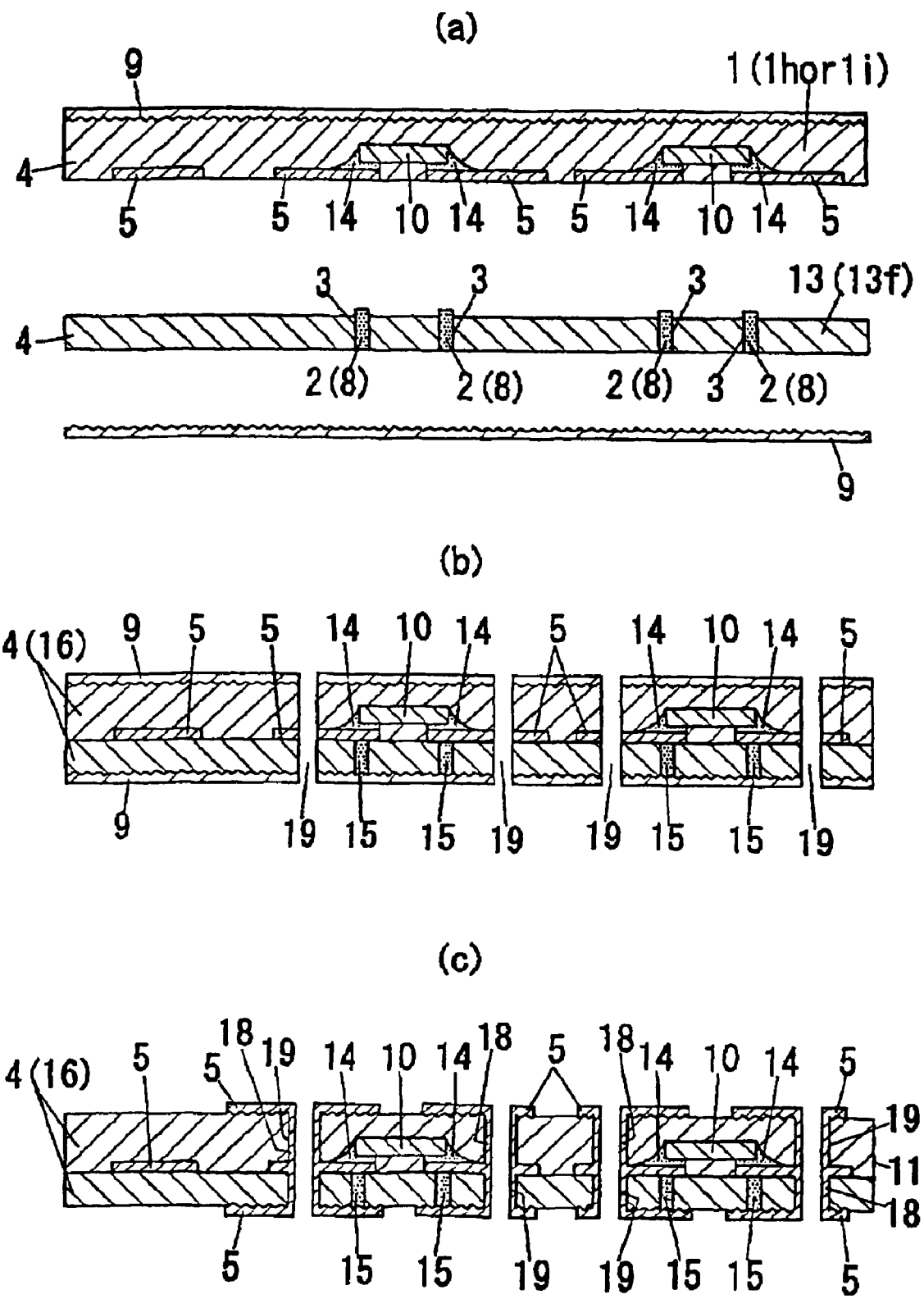
FIGS. 32(*a*) to 32(*c*) are cross sectional views showing still another example of a manufacturing process for a multilayer board.

In addition, in the embodiment shown in FIGS. 32(*a*) to 32(*c*), a wiring board sheet 1*h* (or 1*i*) gained in accordance with the process shown in FIGS. 8(*a*) to 8(*c*) or in accordance with the process shown in FIGS. 9(*a*) to 9(*c*), a sheet 13*f* gained in accordance with the process shown in FIGS. 15(*a*) to 15(*d*) and a metal foil 9 are used so that at least one sheet 13 is layered on the surface of the wiring board sheet 1*h* (or 1*i*) on which the conductor circuit 5 has been formed, and furthermore, the metal foil 9 is layered on the external layer, and after the sheets and the foil have been layered and integrated, through holes are created so as to penetrate the layered body where hole plating 18 is placed on the inner surfaces of the through holes and conductor circuits 5 are formed by carrying out an etching treatment on the metal foils on the two external layers, and thus, the multilayer board 11 is gained.

An appropriate metal foil, such as a copper foil, is used as the metal foil 9 and the same metal foil as in the case where the wiring board sheet 1*e* shown in FIGS. 6(*a*) and 6(*b*) is manufactured, for example, can be used.

In the illustrated example, first, the sheet 13*f* is placed on one side of the wiring board sheet 1*h* (or 1*i*) on which the conductor circuit 5 has been formed so that the surface of the wiring board sheet 1*h* (or 1*i*) on which the conductor circuit 5 has been formed and one surface of the sheet 13*f* (the surface where the conductive paste 8 protrudes from the through holes 3) are opposite to each other, and the metal foil 9 is placed on the outside of the sheet 13*f* so that the other surface of the sheet 13*f* (the surface where the conductive paste does not protrude from the through holes 3), and one surface (rough surface) of the metal foil 9 are opposite to each other and these sheets and the foil are layered. At this time, on the surfaces of the wiring board sheet 1*h* (or 1*i*) and the sheet 13*f* that are opposite to each other, predetermined portions of the conductor circuit 5 are positioned so as to be placed on the positions of the openings of the through holes 3.

Heating and pressing molding is carried out in this condition, and thereby, the wiring board sheet 1*h* (or 1*i*), the sheet 13*f* and the metal foil 9 are collectively layered and integrated.

In this molding process, the resin layers 4 in the B-stage are cured after being melted, and thereby, the interface between the wiring board sheet 1*h* (or 1*i*) and the sheet 13*f* as well as the interface between the sheet 13*f* and the metal foil 9 are joined respectively so as to be layered and integrated where the insulation layers 16 are formed of the cured resin layers 4.

In addition, the conductive paste 8 is cured so as to form the conductive layers in the through holes of the sheet 13*f* filled with the conductive paste 8, and thereby, the via holes 15 are formed. In addition, in the interface between the wiring board sheet 1*h* (or 1*i*) and the sheet 13*f*, predetermined portions of the conductor circuit 5 on the wiring board sheet 1*k* are connected to the conductive paste 8 that has filled the through holes 3 of the sheet 13*f* at the time of the above described integration and in the interface between the sheet 13*f* and the metal foil 9, the metal foil 9 is connected to the conductive paste 8 that has filled the through holes 3 of the sheet 13*f* so that the conductor circuit 5 and the metal foil are connected to each other and the conductive paste 8 is cured in this condition so as to form the conductive layers, and thus, the via holes 15 are formed. In addition, the portions of this conductive paste 8 protruding from the through holes 3 that has been formed on the sheet 13*f* are pressed into the through holes 3 by applying pressure so as to be compressed in the through holes, and thereby, the conductivity of the via holes 15 is increased.

This heating and pressing molding is carried out in a condition where the curing response of the resin layer 4 in the B-stage and the conductive paste 8 (as well as the resin paste 20) progresses, and this condition can be set at the same level as in the above described cases.

Subsequently, through holes 19 are created by means of laser processing so as to penetrate predetermined portions of the gained layered body in the direction of the layering. These through holes 19 are created so as to penetrate the resin layers 4 (the insulation layers 16) and the metal foil 9, and are created, if necessary, so as to penetrate predetermined portions of the conductor circuit 5 (the conductor circuit 5 that has been transcribed to the wiring board sheet 1*h* or 1*i*) inside the layered body.

Next, an electroless plating treatment is carried out on the inner surfaces of the created through holes 19, and an electrolytic plating treatment is carried out if necessary so that the conductor circuits 5 are formed on the outer most layers by carrying out an etching treatment on the metal foils 9 on the outer most layers after the formation of the hole plating 18 such as copper plating (FIG. 32(*c*)).

In the multilayer board 11 gained in this manner, as shown in FIG. 31(c), the conductor circuits 5 are formed by carrying out an etching treatment on the respective metal foils 9 on the outermost layers on both sides of the multi-layer board, and the conductor circuit 5 formed through transcription from the base 6 for transcription is placed inside the multilayer board where the via holes 15 for electrically connecting the respective layers are formed. In addition, the electric components 10 are placed inside one insulation layer 16.

In the case wherein the multilayer board 11 is fabricated as described above, the surfaces are flat and components in sheet form made of the resin layers 4 in the B-stage are layered, and therefore, deformation of the insulation layers 16 in the portions where the conductor circuits 5 have been formed in the molding process does not occur, and the multilayer board exhibits highly reliable insulation in the insulation layers 16. Furthermore, the two or more components in sheet form are collectively layered and integrated, and therefore, it is possible to simplify the molding process, saving time and effort required for a complicated molding process, and no differences are made in the thermal histories of the conductor circuits 5 in the respective layers at the time of molding, making the correction based on the contraction ratios of the conductor circuits 5 due to the difference in the thermal histories unnecessary.

In addition, the conductor circuits 5 can be formed on arbitrary portions of the insulation layers 16 where the via holes 15 have been formed so that there is more freedom in the wiring design and a via-on-via structure and a pad-on-via structure can be easily formed, and thereby, the miniaturization of the circuits and an increase in the density are made easy to be carried out so that the scale-down and reduction in the thickness of the wiring board can be achieved, and the signal paths can be shortened.

In addition, the conductor circuit 5 on the external layer is formed by carrying out an etching treatment on the metal foil 9 after the insulation layer 16 has been formed of the cured resin layer 4, and thereby, the peel strength of the conductor circuit on this external layer is increased, leading to an increase in the land strength, and the ability of holding the components mounted on the conductor circuit 5 on this external layer is increased.

In addition, additional through holes can be created so as to penetrate the entirety of the multilayer board 11 after the formation of the layered body so that there is more freedom in the wiring design.

The embodiment shown in FIGS. 33(a) to 33(d) is an example which is multilayered by means of a build-up manufacturing method. In the case where a multilayer is formed in accordance with the build-up manufacturing method, a variety of wiring board sheets 1, as described above, or a multilayer board 11 manufactured by using wiring board sheets 1 can be used as the core material. In the example shown in FIGS. 33(a) to 33(d) a wiring board sheet 1k gained in accordance with the process shown in FIGS. 11(a) to 11(c) is used as the core material.

Figure 33:
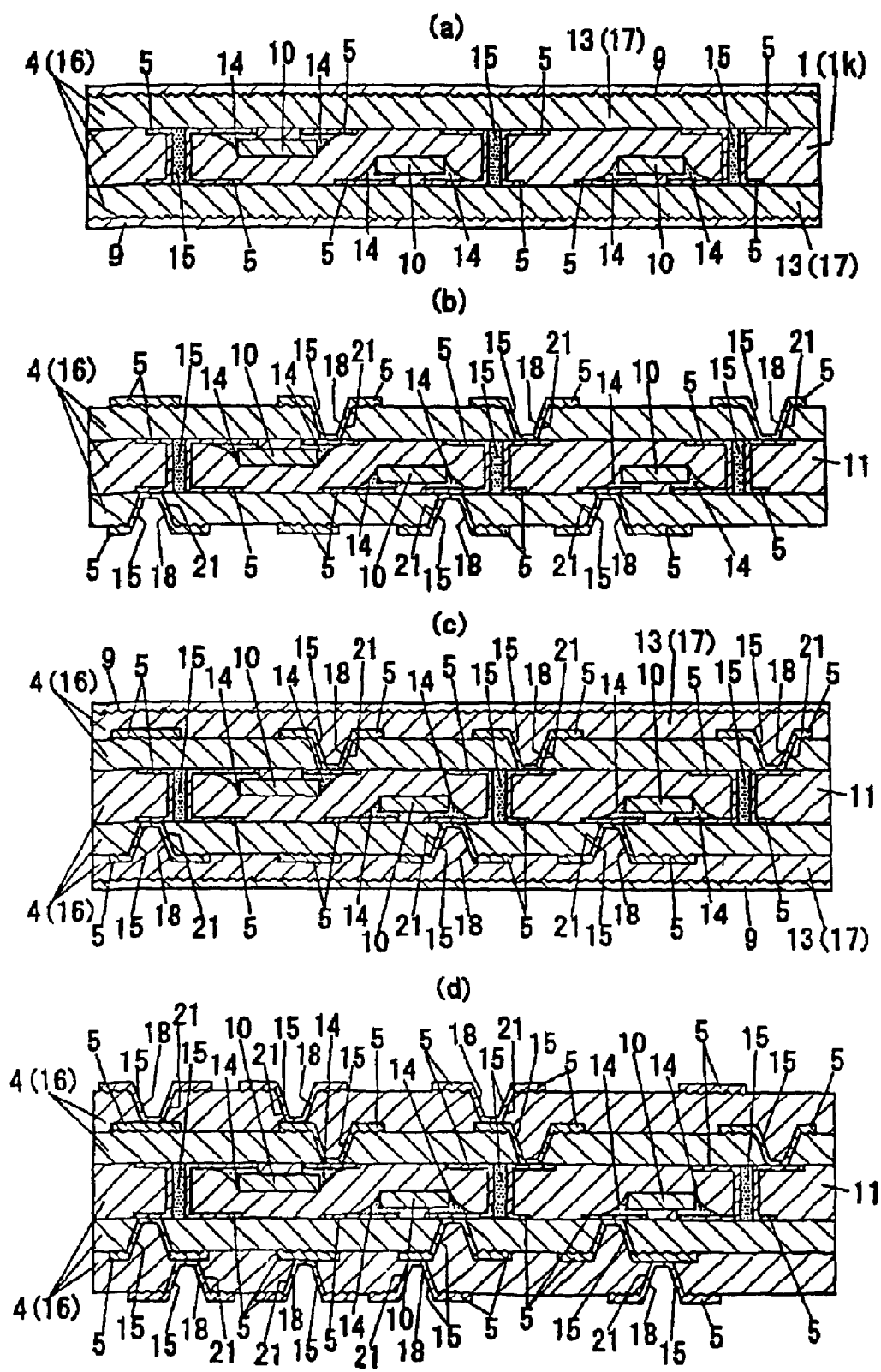
FIGS. 33(*a*) to 33(*c*) are cross sectional views showing sill another example of a manufacturing process for a multilayer board.

In the illustrated example, first, as shown in FIG. 33(a), a metal foil 17 with resin is layered on one or two sides (two sides in the illustration) of the core material (wiring board sheet 1k) as the sheet 13 having the resin layer 4 so that the metal foil 9 is placed on the outer surface, and then, the sheets and the foils are layered and integrated by means of heating and processing molding.

At this time, the core material before being integrated may have the resin layer 4 in the B-stage, or the resin layer 4 may be in the C-stage. In addition, the metal foil 17 with resin can be gained by forming the resin layer 4 in the B-stage on one surface of the metal foil 9 such as copper foil, and for example, a metal foil formed in the same manner as in the manufacture of the wiring board sheet 1i shown in FIG. 9 can be used.

In this molding process, the resin layer 4 in the B-stage is cured after being melted, and thereby, the interface between the wiring board sheet 1k, which is the core material, and the sheet 13 (the metal foil 17 with resin) is joined so that these sheets are layered and integrated where the insulation layers 16 are formed of the cured resin layers 4.

Next, non-through holes 21 are created so as to penetrate only the metal foil 9 and the resin layer 4 of the lower layer of this metal foil, by irradiating the metal foil 9, which is the outermost layer, with a laser beam. These non-through holes 21 are created at predetermined positions of the conductor circuit 5, that has been formed on the wiring board sheet 1 (1k) which is the core material, and these non-through holes 21 are created so that the surface of the conductor circuit 5 that has been formed on this wiring board sheet 1 (1k), is exposed from the bottoms of the non-through holes 21.

Then, hole plating 18 is formed on the inner surfaces of the non-through holes 21. Copper plating or the like can be carried out as the hole plating 18 which can be formed by carrying out electrolytic plating, if necessary, after electro-less plating, for example, has been carried out.

Next, an etching process is carried out on the metal foil 9, which is the external layer, so as to form the conductor circuit 5. At this time, the non-through holes 21, in which the hole plating 18 has been formed, are created as the via holes 15, that electrically connect the conductor circuits 5.

As a result of this, in the illustrated example, as shown in FIG. 33(b), a multilayer board 11 having a four-layered conductor circuit 5 and three insulation layers 16 is gained. At this time, the conduction between the layers crossing the insulation layers 16, where the electrical connections 10 have been buried, is secured by the via holes 15 made of the through holes 3, where the hole plating 18 has been formed on the inner surfaces and which are filled with the conductive paste 8 or resin paste 20 in the multilayer board 11. In addition, the conduction between the layers crossing the insulation layer 16, where the electric components 19 have not been buried, is secured by the via holes 15 made of non-through holes 21, where the hole plating 18 has been formed on the inner surfaces.

Here, these non-through holes 21 where the hole plating 18 has been formed on the inner surfaces may be further filled with conductive paste or resin paste which is then cured.

Furthermore, additional layers can be formed on the multilayer board 11 that has been formed as described above. In such a case, as shown in FIG. 33(c), for example, a metal foil 17 with resin, which is the same metal foil as described above, is placed and layered on one or two sides (two sides in the illustration) of the multilayer board 11 as the sheet 13, in a manner where the metal foil 9 is placed on the external side, and heating and pressing molding is carried out on the multilayer board and the sheet so that the multilayer board and the sheet are layered and integrated.

In this molding process, the resin layer 4 in the B-stage of the metal foil 17 with resin is cured after being melted, and thereby, the interface between the multilayer board 11 and the sheet 13 (the metal foil 17 with resin) is joined, so that the multilayer board and the sheet are layered and integrated where the insulation layers 16 are formed of the cured resin layers 4. In addition, at this time, the melted resin flows into these non-through holes 21 so as to fill these non-through holes 21, in the case where the via holes 15, made of non-through holes 21 where the hole plating 18 has been formed on the inner layer, have not been filled with conductive paste or resin paste.

Subsequently, in the same manner as in the above described case, the multilayer board 11, to which additional layers have been added, can be gained as shown in FIG. 33(d) by creating the non-through holes 21, by forming the hole plating 18 and by forming the conductor circuits 5 on the external layers.

In addition, such formation of the insulation layer 16 and the conductor circuit 5 is repeated so that a multilayer board 11, to which additional layers are further added, can be gained.

The addition of the layers by means of the build-up manufacturing method, is not limited to the one as described above, but rather the formation of layers of the insulation layers 16 can be carried out by applying and curing resin paste, or the formation of layers of the conductor circuits 5 can be carried out by means of a plating treatment. In addition, when the via holes 15 are formed in the insulation layers 16 that have been layered on the core material, the via holes 15 can be formed by filling the non-through holes 21 with conductive paste, which is then cured, without forming the hole plating 18 after the non-through holes 21 have been created as described above. Furthermore, a variety of other techniques, which are carried out in accordance with the build-up manufacturing method, can be adopted.

The multilayer board 11 that is gained in this manner can be formed as a multilayered wiring board that incorporates high level LCR functions, and can be expected to be utilized in a microelectronic field, such as a compact high frequency module including an RF module and a blue tooth module.

In the following, the embodiments of the present invention are described in detail.

Embodiment 1

Slurry that contains components shown in Table 1 is kneaded with a planetary mixer and the viscosity is adjusted to 3000 cP by mixing a proper amount of solvent into the slurry, and thereby, a resin composition is gained.

This resin composition is applied to a carrier base 7 made of a rolled copper foil, which is heated and dried for 5 minutes at 140° C., and thereby, a resin sheet 4a in the B-stage having a thickness of 100 µm is formed on one surface of the carrier base 7.

On the other hand, a soft etching treatment is carried out using a ferric chloride solution on the surface of a stainless steel base made of SUS301 having a thickness of 100 µm, and thereby, a base 6 for transcription having a surface roughness Ra of 0.3 µm is gained. A plating resist is formed on the surface of this base 6 for transcription and the plating resist is released after an electrolytic copper plating treatment has been carried out, and then, a conductor circuit 5 is formed to have a thickness of 15 µm. Furthermore, resistors in chip form and capacitors in chip form, which are electric components 10, are soldered to this conductor circuit 5 by means of a solder reflow treatment, and thereby, the electric components 10 are mounted on the conductor circuit 5. The solder reflow treatment is carried out by applying heat at a maximum temperature of 260° C. for 15 seconds.

Subsequently, six resin sheets 4a, each of which is the same as the above described resin sheet 4a, from which the carrier base 7 has been removed, are placed and layered on a side of the base 6 for transcription on which the conductor circuit 5 has been formed, and then, the base 6 for transcription is released so that the conductor circuit 5 remains on the resin layer 4 after heating and pressing molding has been carried out in a vacuum for 10 minutes at a heating temperature of 130° C. under an applied pressure of 0.294 MPa.

Subsequently, a protective film 12 having a thickness of 100 µm made of PET is layered and placed on one surface of the resin layer 4 on the side on which the conductor circuit 5 has not been formed, and the protective film 12 side is irradiated with a YAG laser in a condition of 15 KHz, 1 W and 15 shots, and thereby, a through hole 3 having an inner diameter of 300 µm is created so as to penetrate the resin layer 4, the protective film 12, and the conductor circuit 5 on one surface of the resin layer 4.

Next, conductive paste 8 (made by Tatsuta Electric Wire & Cable Co., Ltd., model number "AE1244") is applied to the external surface of the protective film 12 using a spatula so that the through holes 3 are filled in with this conductive paste 8, and after that, the protective film 12 is released from the resin layer 4. Thus, two wiring board sheets 1d are gained.

In addition, the base 6 for transcription, on which the conductor circuit 5 has been formed, is layered and placed on the surface of resin layer 4, on the side where the conductor circuit 5 has not been formed, of a wiring board sheet that has been formed in the same manner as the above described wiring board sheets 1d, so that the surface on which the conductor circuit 5 has been formed is opposite to the resin layer 4, in a condition where the through holes 3 and the conductor circuit 5 are in alignment. The base 6 for transcription, on which the conductor circuit 5 has been formed, has been formed in the same manner as in the case of the above described wiring board sheets 1d.

In this condition, heating and pressing molding is carried out in a vacuum for 10 minutes at a heating temperature of 130° C. under an applied pressure of 0.490 MPa, and after that, the base 6 for transcription is released so that the conductor circuit 5 remains on the resin layer 4, and thereby, a wiring board sheet if is gained.

Then, the above described wiring board sheets 1d and 1f are layered in the same manner as shown in FIG. 24(a) and 24(b), and heating and pressing molding is carried out in a vacuum for 90 minutes at a heating temperature of 175° C. and an applied pressure of 2.94 MPa so that the sheets are layered and integrated, and thus, a multilayer board 11 is gained.

Embodiment 2

Slurry that contains components shown in Table 1 is kneaded with a planetary mixer and the viscosity is adjusted to 3000 cP by mixing a proper amount of solvent into the slurry, and thereby, a resin composition is gained.

This resin composition is applied to a carrier base 7 made of a polyethylene terephthalate film which is heated and dried for 8 minutes at 130° C., and thereby, a resin sheet 4a in the B-stage having a thickness of 100 µm is formed on one surface of the carrier base 7.

On the other hand, a plating resist is formed on a surface of the base 6 for transcription in the same manner as in the case of Embodiment 1, and the plating resist is released after an electrolytic copper plating treatment has been carried out, and thereby, a conductor circuit 5 having a thickness of 15 µm is formed. Furthermore, inductors in chip form and bare silicon chips, which are electric components 10, are connected to this conductor circuit 5 via solder balls. Heat is applied at 260° C. for 20 seconds at the time when the connections are made by means of the solder balls. In addition, after the electric components 10 have been mounted, underfill is placed beneath the bare silicon chips and is pre-dried at 150° C. for 10 minutes.

Subsequently, five resin sheets 4a, each of which is the same as the above described resin sheet 4a, from which the carrier base 7 has been removed, are placed and layered on a side of the base 6 for transcription on which the conductor circuit 5 has been formed, and then, the base 6 for transcription is released so that the conductor circuit 5 remains on the resin layer 4 after heating and pressing molding has been carried out in a vacuum for 10 minutes at a heating temperature of 130° C. under an applied pressure of 0.294 MPa.

Subsequently, in the same manner as in the case in Embodiment 1, a through hole 3, having an internal diameter of 300 µm, is created so as to penetrate the resin layer 4, the protective film 12, and the conductor circuit 5 on one side of the resin layer 4.

Next, conductive paste 8 (made by Tatsuta Electric Wire & Cable Co., Ltd., model number "AE1244") is applied to the external surface of the protective film 12 using a spatula so that the through holes 3 are filled in with this conductive paste 8, and after that, the protective film 12 is released from the resin layer 4. Thus, two wiring board sheets 1d are gained.

In addition, an electrolytic copper foil having a thickness of 18 µm is layered and placed on the surface of resin layer 4, on the side where the conductor circuit 5 has not been formed, of a wiring board sheet that has been formed in the same manner as the above described wiring board sheets 1d, and heating and pressing molding is carried out on the layers in this condition in a vacuum for 10 minutes at a heating temperature of 130° C. under an applied pressure of 0.490 MPa, and thus, a wiring board sheet 1e is gained.

Then, the above described two wiring board sheets 1d and one wiring board sheet 1e are layered in a condition where the surface of the wiring board sheet 1e on which the conductor circuit 5 has been formed, and the surface of one of the wiring board sheets 1d on which the conductor circuit 5 has not been formed, are opposite to each other, and the surface of the wiring board sheet 1d on which the conductor circuit 5 has been formed, and the surface of the other wiring board sheet 1d on which the conductor circuit 5 has been formed, are opposite to each other, and then, heating and pressing molding is carried out in a vacuum for 90 minutes at a heating temperature of 175° C. under an applied pressure of 2.94 MPa so that the layers are integrated and a multilayer board 11 is gained.

Embodiment 3

Slurry that contains components shown in Table 1 is kneaded with a planetary mixer and the viscosity is adjusted to 3000 cP by mixing a proper amount of solvent into the slurry, and thereby, a resin composition is gained.

This resin composition is applied to a carrier base 7 made of a polyethylene terephthalate film which is heated and dried for 8 minutes at 130° C., and thereby, a resin sheet 4a in the B-stage having a thickness of 100 µm is formed on one surface of the carrier base 7.

On the other hand, a plating resist is formed on a surface of the base 6 for transcription in the same manner as in the case of Embodiment 1, and the plating resist is released after an electrolytic copper plating treatment has been carried out, and thereby, a conductor circuit 5 having a thickness of 12 µm is formed. Furthermore, electric components 10 are mounted on this conductor circuit 5 in the same manner as in Embodiment 1.

Subsequently, eight resin sheets 4a, each of which is the same as the above described resin sheet 4a, from which the carrier base 7 has been removed, are placed and layered on a side of the base 6 for transcription on which the conductor circuit 5 has been formed, and then, the base 6 for transcription is released so that the conductor circuit 5 remains on the resin layer 4 after heating and pressing molding has been carried out in a vacuum for 10 minutes at a heating temperature of 130° C. under an applied pressure of 0.294 MPa.

Subsequently, in the same manner as in the case in Embodiment 1, a through hole 3, having an internal diameter of 300 µm, is created so as to penetrate the resin layer 4, the protective film 12, and the conductor circuit 5 on one side of the resin layer 4.

Next, conductive paste 8 (made by Tatsuta Electric Wire & Cable Co., Ltd., model number "AE1244") is applied to the external surface of the protective film 12 using a spatula so that the through holes 3 are filled in with this conductive paste 8, and after that, the protective film 12 is released from the resin layer 4. Thus, two wiring board sheets 1d are gained.

In addition, two bases 6 for transcription that have been gained in the same manner as described above, are placed so that the surfaces on which the conductor circuits 5 have been formed are opposite to each other, and six resin sheets 4a, each of which is the same resin sheet 4a as described above from which the carrier base 7 has been removed, are placed between the two bases 6 for transcription so that these bases and sheets are layered and heating and pressing molding is carried out in a vacuum for 10 minutes at a heating temperature of 130° C. under an applied pressure of 0.294 Mpa, and after that, the bases 6 for transcription are released so that the conductor circuits 5 remain on the resin layer 4. Subsequently, a protective film 12 made of PET having a thickness of 75 µm is layered and placed on one surface of the resin layer 4, and a through hole 3 having an inner diameter of 300 µm is created by means of a laser irradiation under the same conditions as in Embodiment 1, so as to penetrate the resin layer 4, the protective film 12, and the conductor circuits 5 on both sides of the resin layer 4.

Next, conductive paste 8 (made by Tatsuta Electric Wire & Cable Co., Ltd., model number "AE1244") is applied to the external surface of the protective film 12 using a spatula so that the through holes 3 are filled in with this conductive paste 8, and after that, the protective film 12 is released from the resin layer 4, and thus, a wiring board sheet 1b is gained.

In addition, the above described resin composition is applied to a carrier base 7 made of a polyethylene terephthalate film having a thickness of 100 µm, which is heated and dried for 9 minutes at 130° C., and thereby, a resin layer 4 in the B-stage having a thickness of 100 µm is formed on one surface of the carrier base 7.

Subsequently, the carrier base 7 side is irradiated with a carbonic acid gas laser under the conditions of 7.1 mJ, 100 Hz, 1 shot and a pulse width of 35 µs, and thereby, a through hole 3 having an inner diameter of 100 µm is created so as to penetrate the carrier base 7 and the resin layer 4.

Next, conductive paste 8 (made by Tatsuta Electric Wire & Cable Co., Ltd., model number "AE1244") is applied to the external surface of the protective film 12 using a spatula so that the through holes 3 are filled in with this conductive paste 8, and after that, the carrier base 7 is released from the resin layer 4.

Subsequently, the base 6 for transcription on which the conductor circuit 5 has been formed, and the above described resin layer 4, are layered so that the conductor circuit 5 and the resin layer 4 are opposite to each other and the through holes 3 and the conductor circuit 5 are aligned, and heating and pressing molding is carried out in a vacuum for 10 minutes at a heating temperature of 130° C. under an applied pressure of 2.94 MPa. After that, the base 6 for transcription is released so that the conductor circuit 5 remains on the resin layer 4, and thereby, a sheet 13a with a circuit on one side is gained. The base 6 for transcription on which the conductor circuit 5 has been formed, has been formed in the same manner as in the case of the above described wiring board sheets 1d.

Then, the above described wiring board sheets 1d, 1b and the sheet 13a with a circuit on one side, are layered in the same manner as shown in FIGS. 25(a) and 25(b), and heating and pressing molding is carried out in a vacuum for 90 minutes at a heating temperature of 175° C. under an applied pressure of 2.94 MPa so that the layers are integrated and a multilayer board 11 is gained.

Embodiment 4

Slurry that contains components shown in Table 1 is kneaded with a planetary mixer and the viscosity is adjusted to 3000 cP by mixing a proper amount of solvent into the slurry, and thereby, a resin composition is gained.

This resin composition is applied to a carrier base 7 made of a polyethylene terephthalate film which is heated and dried for 10 minutes at 150° C., and thereby, a resin sheet 4a in the B-stage having a thickness of 100 μm is formed on one surface of the carrier base 7.

On the other hand, a soft etching treatment is carried out using a ferric chloride solution on the surface of a stainless steel base made of SUS304 having a thickness of 100 μm, so that the base 6 for transcription of which the degree of surface roughness, Ra, is 0.25 μm, is gained. A plating resist is formed on a surface of this base 6 for transcription and the plating resist is released after an electrolytic copper plating treatment has been carried out, and thereby, a conductor circuit 5 having a thickness of 15 μm is formed. Furthermore, capacitor paste (one-component polymer based dielectric paste which contains barium titanate powder that has been mixed in a mixed binder of an epoxy resin and a melamine resin, which has been kneaded so that the powder is dispersed is the binder, made by Asahi Chemical Research Laboratory Co., Ltd., CX-16) and resistor paste (carbon resistor paste that contains carbon powder uniformly dispersed in a phenol resin binder, made by Asahi Chemical Research Laboratory Co., Ltd., TU-100-8), which are electric components 10, are printed on or applied to this base 6 for transcription, and are cured by heating and drying for 30 minutes at 150° C. and for 60 minutes at 170° C., respectively. In addition, copper paste (made by Asahi Chemical Research Laboratory Co., Ltd., LS-504J) is applied to the base and is cured by heating and drying for 30 minutes at 150° C., and then, electrodes of capacitor elements are formed.

Subsequently, two bases 6 for transcription are placed so that the surfaces on which the conductor circuits 5 have been formed are opposite to each other, and seven resin sheets 4a, each of which is the same as the above described resin sheet 4a from which the carrier base 7 has been removed, are layered between the two bases, and the layers are cured by applying heat for 15 minutes at 175° C. under a pressure of 0.294 MPa, and after that, the bases 6 for transcription are released so that the conductor circuits 5 remain on the resin layer 4.

Subsequently, protective films 12 made of PET having a thickness of 50 μm are layered and placed on both sides of the resin layer 4, and one of the sides of the protective films 12 is irradiated with a YAG laser under conditions of 15 KHz, 1.8 W and 50 shots, and thereby, a through hole 3 having an inner diameter of 300 μm is created so as to penetrate the resin layer 4, the protective films 12, and the conductor circuits 5 on both sides of the resin layer 4.

An electroless copper plating treatment is carried out on the inner surface of this through hole 3 so as to form hole plating 18 having a thickness of 0.2 μm, and after that, conductive paste 8 (made by Tatsuta Electric Wire & Cable Co., Ltd., model number "AE1244") is applied to the external surface of the protective film 12 using a spatula so that the through hole 3 is filled in with this conductive paste 8, which is preliminary dried for 60 minutes at 80° C., and after that, the protective film 12 is released from the resin layer 4. Thus, a wiring board sheet 1k is gained.

In addition, the above described resin composition is applied to the carrier base 7 made of a polyethylene terephthalate film having a thickness of 100 μm, which is heated and dried for 9 minutes at 130° C. so that a resin layer 4 in the B-stage having a thickness of 100 μm is formed on one surface of the carrier base 7.

Subsequently, the carrier base 7 side is irradiated with a carbonic acid gas laser under the conditions of 7.1 mJ, 100 Hz, 1 shot and a pulse width of 35 μs, and thereby, a through hole 3 having an inner diameter of 100 μm is created so as to penetrate the carrier base 7 and the resin layer 4.

Next, conductive paste 8 (made by Tatsuta Electric Wire & Cable Co., Ltd., model number "AE1244") is applied to the external surface of the carrier base 7 using a spatula so that the through holes 3 are filled in with this conductive paste 8, and after that, the carrier base 7 is released from the resin layer 4 so that a sheet 13f having through holes 3 filled with the conductive paste 8 is gained.

In addition, a plating resist is formed on a surface of a base 6 for transcription formed of a stainless steel base made of SUS304 having a thickness of 100 μm, and the plating resist is released after an electrolytic copper plating treatment has been carried out so that a conductor circuit 5 having a thickness of 15 μm is formed, and the base 6 for transcription on which the conductor circuit 5 has been formed is gained.

Then, sheets 13f are placed on both sides of the wiring board sheet 1k so that the surface of the sheets 13f, from which the conductive paste 8 protrudes, are opposite to the wiring board sheet 1k and bases 6 for transcription, on which the conductor circuits 5 have been formed, are placed and layered on the outer layers of the sheets 13f so that the conductor circuits 5 are opposite to the sheets 13f, and heating and pressing molding is carried out for 60 minutes at a heating temperature of 175° C. under an applied pressure of 2.94 MPa so that the layers are integrated and a multilayer board 11 is gained.

Embodiment 5

Slurry that contains components shown in Table 1 is kneaded with a planetary mixer and the viscosity is adjusted to 3000 cP by mixing a proper amount of solvent into the slurry, and thereby, a resin composition is gained.

A glass unwoven cloth (made by Oribest Co., Ltd., SAS series, having a weight of 25 g/cm$^2$, and a thickness of 200 μm) is impregnated with this resin composition, which is dried for 5 minutes at 160° C. so that a resin sheet 4a having a thickness of 200 μm is fabricated.

On the other hand, a soft etching is carried out using a mixed solution of nitric acid and hydrofluoric acid on the surface of a stainless steel base made of SUS304 having a thickness of 100 μm so that a base 6 for transcription having a degree of surface roughness, Ra, of 0.3 μm is gained. After a pattern of a plating resist has been formed on the surface of this base 6 for transcription, a copper plating is formed by means of an electrolytic copper plating treatment and furthermore, plating treatments are carried out in the order of nickel plating and gold plating, and after that, the resist is released so as to form a conductor circuit 5 having a thickness of 15 μm. Furthermore, ICs (flip chips), resistors in chip form and capacitors in chip form, which are electric components 10, are soldered to this conductor circuit 5 by means of a solder reflow treatment, and thus, the electric components 10 are mounted on the conductor circuit 5. The solder reflow treatment is carried out by applying heat for 15 seconds at a maximum temperature of 260° C. In addition, underfill (made by Matsushita Electric Works, Ltd., CV5183) is placed beneath the ICs and is heated and cured for 30 minutes at 150° C.

In addition, the above described resin composition is applied to the rough surface side of a copper foil having a thickness of 18 μm, which is dried for 10 minutes at 130° C. so that a metal foil 17 with resin that has a resin layer 4b having a thickness of 50 μm.

Subsequently, three resin sheets 4a, each of which is the same as the above described resin sheet 4a, are layered on the surface of the base 6 for transcription on which the conductor circuit 5 has been formed, and furthermore, the metal foil 17 with resin is layered and placed on the external surface side of the outer most resin sheet 4a so that the resin layer 4b is opposite to the resin sheet 4a and heating and pressing molding is carried out in a vacuum for 15 minutes at a heating temperature of 175° C. under an applied pressure of 0.294 MPa and after that, the base 6 for transcription is released so that the conductor circuit 5 remains on the resin layer 4. Thereby, a wiring board sheet 1i is gained.

In addition, the above described resin composition is applied to a carrier base 7 made of a PET film having a thickness of 100 μm, which is then heated and dried for 5 minutes at 130° C., and thereby, a resin layer 4 in the B-stage having a thickness of 100 μm is formed.

Subsequently, a carbonic acid gas laser is emitted under the conditions of 7.1 mJ, 100 Hz, 1 shot and a pulse width of 35 μs, and thereby, through holes 3 having an inner diameter of 100 μm are created so as to penetrate the carrier base 7 and the resin layer 4.

Next, conductive paste 8 (made by Tatsuta Electric Wire & Cable Co., Ltd., model number "AE1244") is applied to the external surface of the carrier base 7 using a spatula so that the through holes 3 are filled in with this conductive paste 8, and after that, the carrier base 7 is released from the resin layer 4 so that a sheet 13f having the through holes 3 filled with the conductive paste 8 is gained.

In addition, the same copper foil as the one used for fabricating the above described wiring board sheet 1i is prepared as the metal foil 9.

Then, the sheet 13f is placed on the surface of the wiring board sheet 1i on the side where the conductor circuit 5 has been formed so that the surface from which the conductive paste 8 protrudes is opposite to the conductor circuit 5 and furthermore, the metal foil 9 is layered and placed on the external surface side of the sheet 13f so that the rough surface of the metal foil 9 is opposite to the sheet 13f and heating molding is carried out for 60 minutes at a heating temperature of 175° C. so that the layers are integrated.

Subsequently, the gained layered body is irradiated with a YAG laser under the condition of 15 KHz, 1.8 W and 50 shots, and thereby, through holes are created so as to penetrate the entirety of the layered body, and after that, desmear treatment is carried out on the inner surfaces of the through holes so that hole plating 18 having a thickness of 20 μm is formed of electroless plating and electrolytic plating. Furthermore, an etching treatment is carried out on the metal foils 9 on the external layers on both sides so as to carry out surface layer patterning and conductor circuits 5 are formed on the external layers on both sides, and thus, a multilayer board 11 is gained.

TABLE 1

|  | Embodiment 1 | Embodiment 2 | Embodiment 3 | Embodiment 4 | Embodiment 5 |
|---|---|---|---|---|---|
| Cresol novolac-type epoxy resin | 1.2 | 7.0 | — | 1.2 | — |
| Polyfunctional bisphenol A-type epoxy resin | — | — | 7 | — | 7.0 |
| Bisphenol A-type epoxy resin | 0.4 | — | — | 0.4 | — |
| Bisphenol F-type epoxy resin | — | 3.1 | 0.9 | — | 0.9 |
| Phenoxy resin | 0.3 | 0.8 | 1 | 0.3 | 1 |
| Brominated epoxy resin | 1.0 | 2.55 | 4 | 1.0 | 4 |
| Phenolic novolac resin (curing agent) | 1.0 | — | — | 1.0 | — |
| Dicyandiamide (curing agent) | — | 0.5 | 1 | — | 1 |
| 2E4MZ (curing accelerator) | 0.1 | 0.05 | 0.1 | 0.1 | 0.1 |
| Triphenyl phosphine (curing accelerator) | 0.1 | — | — | 0.1 | — |
| Alumina | 85 | 60 | — | 95 | — |
| Aluminum nitride | 10 | — | — | — | 60 |
| Boron nitride | — | 25 | — | — | 25 |
| Silica | — | — | 85 | — | — |
| Epoxy silane (coupling agent) | 1 | 0.8 | 0.8 | 1 | 0.8 |
| M208F (dispersing agent) | — | 0.2 | 0.2 | — | 0.2 |
| Type of solvent | Methyl ethyl ketone | Acetone, dimethyl formamide | Methyl ethyl ketone, dimethyl formamide | Methyl ethyl ketone | Methyl ethyl ketone, dimethyl formamide |
| Carrier base | Rolled copper foil | PET | PET | PET | Glass unwoven cloth |
| Base for transcription | SUS301 | SUS301 | SUS304 | SUS304 | SUS304 |

The details of the respective components in the table are as follows.

Cresol novolac-type epoxy resin: made by Sumitomo Chemical Co., Ltd., model number "ESCN195XL4"

Polyfunctional bisphenol A-type epoxy resin: made by Mitsui Chemical Co., Ltd., model number "VG3101"

Bisphenol A-type epoxy resin: made by Yuka Shell Epoxy Co., Ltd., model number "EPIKOTE 828"

Bisphenol F-type epoxy resin: made by Toto Kasei Industry Co., Ltd., model number "YDF8170"

Phenoxy resin: made by Toto Kasei Co., Ltd., model number "YPP50"

Brominated epoxy resin: made by Sumitomo Chemical Co., Ltd., model number "ESB400T"

Phenolic novolac resin: made by Gun Ei Chemical Industry Co., Ltd., model number "Tamanol 752"

2E4MZ: 2-methyl-4-methyl imidazole

Alumina: having an average grain diameter of 12 μm and a maximum grain diameter of 50 μm Aluminum nitride: having an average grain diameter of 2 μm and a maximum grain diameter of 15 μm Boron nitride: having an average grain diameter of 1.5 μm and a maximum grain diameter of 10 μm Silica: having an average grain diameter of 2 μm and a maximum grain diameter of 10 μm Epoxy silane: made by Nippon Unicar Co., Ltd., model number "A-187"

M208F: made by Dai-ichi Kogyo Seiyaku Co., Ltd., model number "M208F" of which the compound name is referred to as polyoxy alkylene alkyl ether phosphate ester mono ethanol amine salt

INDUSTRIAL APPLICABILITY

According to the manufacturing method for a wiring board sheet of the present invention, a base for transcription where a conductor circuit has been placed on a surface and electric components have been mounted on or printed on this conductor circuit is layered on one or two surfaces of a resin layer in the B-stage so that the conductor circuit as well as the electric components are opposite to the resin layer and the conductor circuit and the electric components are buried in the resin layer; and the base for transcription is released from the resin layer and the conductor circuit is made to remain on the resin layer side so that the conductor circuit is transcribed on the resin layer in a manner where the external surface of the resin layer and the exposed surface of the conductor circuit are in the same plane; and therefore, the surface is formed into a flat state and the electric components are placed in the resin layer and at this time the electric components can be placed so that no air spaces are generated around the electric components due to the fluidity of the resin layer; and therefore, when an insulation layer is formed of the cured resin layer, a wiring board where electric components are placed in the insulation layer can be gained; and thereby, the number of components mounted on the wiring board can be increased where the electric components are prevented from sticking out from the wiring board so that the miniaturization of the wiring board can be achieved, and furthermore, there is more freedom in the wiring design due to the expansion of the areas where the electric components can be mounted; in addition, the electric components are placed within an insulation layer without the existence of air gaps around these electric components, and therefore, no air remains around the electric components, and thus, cracking of the insulation layer, damages to the electric components and the occurrence of defects such as disconnection of wires due to the thermal expansion of air can be prevented even in the case where the wiring board receives stress due to heat; in addition, the electric components can be placed at arbitrary positions by melting and softening the resin layer which is then fluidized, irrespective of the number of the mounted electric components and irrespective of the positions of the mounted electric components; as a result, the electric components can be placed in arbitrary portions inside the resin layer or inside the insulation layer that has been gained by curing the resin layer. Furthermore, other components can be mounted on the surfaces of the multilayered board in which components have been buried.

In addition to the above described manufacturing method for a wiring board sheet, according to the manufacturing method for a wiring board sheet of the present invention, a conductor circuit is transcribed on only one surface of the resin layer by using a base for transcription so that the external surface of the resin layer and the exposed surface of the conductor circuit are formed to be in the same plane while a metal foil or a metal foil with resin is layered on the other surface of the resin layer so that the foil and the resin layer are integrated, and therefore, this metal foil is placed on the outermost layer at the time of the formation of the multilayer board, and thereby, a circuit can be formed according to a general etching manufacturing method. In addition, the reliability concerning the tension strength of the components mounted on the surface layer can be easily secured by utilizing a copper foil or the like on which a roughing treatment has been carried out.

In addition to the above described manufacturing method for a wiring board sheet, according to the manufacturing method for a wiring board sheet of the present invention, when a conductor circuit is placed on a surface of a base for transcription and electric components are mounted, a stainless steel base is used as the base for transcription, and a plating treatment is carried out on the surface of the base for transcription after the formation of a resistor, and thereby, a conductor circuit is placed and electric components are mounted or printed while underfill is placed between the electric components and the mounting surface, and therefore, active components such as ICs having large component areas and LCR components having large capacities with large areas are secured and stably mounted exhibiting the effects of increasing the connection reliability. In addition, at least either resistor elements or capacitor elements, which are electric components, can be formed on the base for transcription, and thereby, the electric components are mounted, and therefore, it becomes possible to form very thin elements as the electric components so that the reduction in the thickness of the wiring board can be realized. In addition, the solder can be suppressed from flowing out at the second time when the solder is melted by applying heat again.

In addition to the above described manufacturing method for a wiring board sheet, according to the manufacturing method for a wiring board sheet of the present invention, a protective film is layered on one or two surfaces of a resin layer after a conductor circuit has been transcribed to the resin layer and through holes are created so as to penetrate the resin layer, the conductor circuit and the protective film wherein the through holes are filled in with conductive paste by applying the conductive paste from the external surface side of the protective film and after that, the protective film is released from the resin layer so that the conductive paste is formed so as to protrude outwards from the through holes, and therefore, the via holes for electrically connecting the conductor circuits can be formed at arbitrary positions.

In addition, according to the manufacturing method for a wiring board sheet of the present invention, a metal foil is layered on the surface of a wiring board sheet, on the side opposite to the side where the conductor circuit has been formed, which is gained according to the above described manufacturing method for a wiring board sheet, where the conductor circuit has been formed on only one surface so that the metal foil and the wiring board sheet are integrated or a base for transcription where a conductor circuit has been placed on a surface is layered on the surface of the wiring board sheet, on the side opposite to the side where the conductor circuit has been formed, which is gained according to the above described manufacturing method for a wiring board sheet, where the conductor circuit has been formed on only one surface so that the conductor circuit and the resin layer are opposite to each other, and therefore, the metal foil and the conductor circuit can be formed and the via holes for electrically making connection between the metal foil and the conductor circuit and between the conductor circuits can be formed at arbitrary positions. In addition, the conductive via holes are compressed at the time when the metal foil or the conductor circuit and the resin layer are layered and integrated, and therefore, the conductive resistance of the via holes can be reduced.

In addition to the above described manufacturing method for a wiring board sheet, according to the manufacturing method for a wiring board sheet of the present invention, a protective film is layered on one or two surfaces of a resin layer after a conductor circuit has been transcribed to one or two surfaces of the resin layer and through holes are created so as to penetrate the resin layer, the conductor circuit and the protective film and hole plating is carried out on the inner surfaces of the through holes and the through holes are filled in with resin paste or conductive paste by applying the resin paste or the conductive paste on the external surface side of the protective film, and after that, the protective film is released from the resin layer, and therefore, the hole plating can provide a high stability in the conductivity of the via holes even in the case where the paths of the via holes formed in the resin layer are elongated due to the increased thickness of this resin layer as a result of the buried electric components. Furthermore, highly stable conductivity can additionally be provided to the via holes by means of the conductive paste.

In addition to the above described manufacturing method for a wiring board sheet, according to the manufacturing method for a wiring board sheet of the present invention, a stainless steel base having a thickness of 50 µm to 150 µm, where a surface roughening treatment has been carried out so that the degree of surface roughness, Ra, of the surface on which the conductor circuit is formed, becomes 2 µm or less is used as the base for transcription, and therefore, the base for transcription can be easily released from the resin layer by stripping the base for transcription at the time when the conductor circuit is transcribed to the wiring board sheet under fabrication, and furthermore, the adhesiveness between the base for transcription and the conductor circuit is adjusted by means of a surface roughing treatment so that the conductor circuit is not released from the base for transcription in an unprepared manner, and the conductor circuit can be made to remain on the resin layer side without fail by releasing the conductor circuit from the base for transcription at the time when the base for transcription is released from the resin layer in order to transcribe the conductor circuit.

In addition to the above described manufacturing method for a wiring board sheet, according to the manufacturing method for a wiring board sheet of the present invention, the resin layer is formed of a resin composition that contains at least one type of inorganic filler selected from among silica, alumina, aluminum nitride, boron nitride, titanium oxide, aluminum borate and magnesium oxide where the maximum grain diameter of this inorganic filler is 10 µm or less, while these inorganic fillers can be freely used to adjust the thermal conductivity, dielectric constant, grain distribution and color tone, and therefore, the grain size can be appropriately designed in order to selectively exercise desired functions and the density of the fillings can be easily increased so that the coefficient of thermal expansion of the resin layer or of the insulation layer formed of this resin layer is reduced and the difference in the coefficient of thermal expansion between the built in components and the material forming the conductor circuits is reduced, and thereby, the occurrence of deformation such as warping can be prevented in the case where the multilayer board is heated such as during the manufacture of the multilayer board or the multilayer board that has been manufactured, receives thermal stress.

In addition to the above described manufacturing method for a wiring board sheet, according to the manufacturing method for a wiring board sheet of the present invention, the resin layer is formed of a resin composition where the content of the inorganic filler is 70 wt. % to 95 wt. % and which contains at least one of a coupling agent and a dispersing agent, and therefore, the inorganic filler can be filled to a high density while the dispersion thereof is increased so that the coefficient of thermal expansion of the resin layer or of the insulation layer formed of this resin layer is reduced and the difference in the coefficient of thermal expansion between the built in components and the material forming the conductor circuits is reduced, and thereby, the occurrence of deformation such as warping can be prevented in the case where the multilayer board is heated such as during the manufacture of the multilayer board or the multilayer board that has been manufactured, receives thermal stress.

In addition to the above described manufacturing method for a wiring board sheet, according to the manufacturing method for a wiring board sheet of the present invention, the resin layer is formed of a resin sheet that is gained by impregnating an unwoven cloth with a resin composition, which is then dried, and therefore, a very thick resin sheet from both sides of which the solvent evaporates at the time of being dried can be formed in a very cost effective manner due to its ability of effectively being dried. In addition, the resin sheet made of an unwoven cloth is stiff and is advantageous in handling due to its tenacity in the case where a sheet of a large area is handled. Furthermore, resin easily moves over the unwoven cloth following the unevenness made of the components or the like at the time of forming the layers, and therefore, it is particularly effective in the case where the resin covers an area having unevenness with large steps.

In addition to the above described manufacturing method for a wiring board sheet, according to the manufacturing method for a wiring board sheet of the present invention, the resin layer after having been formed is maintained in the B-stage, and therefore, can be favorably used for the manufacture of a multilayer board and at this time, two or more wiring board sheets or at least one sheet and another sheet where a conductor circuit or a metal foil is placed in the resin layer in the B-stage are collectively layered so that a multilayer board can be gained. At this time, the surface is flat and a member in sheet form made of a resin layer in the B-stage is layered on the surface, and therefore, no deformation occurs in the portions of the insulation layer where the conductor circuits have been formed during the molding process having a highly reliable insulation in the insulation layer, and in addition, two or more members in sheet form are collectively layered and integrated, and therefore, it is possible to simplify the molding process, saving time and effort required for a complicated process and no difference is made in the thermal histories of the conductor circuits on the respective layers at the time of molding, making the correction based on the contraction ratios of the conductor circuits 5 due to the difference in the thermal histories unnecessary. In addition, conductor circuits can be formed in arbitrary portions of the insulation layer, providing more freedom in the wiring design, and furthermore, the via holes can be formed at arbitrary positions when a wiring board sheet where via holes have been formed or another sheet is used so that a via-on-via structure or a pad-on-via structure can be easily formed, and thereby, the miniaturization of the circuit and an increase in the density of the circuit become easy so that scale-down and reduction in the thickness of a wiring board can be achieved and the signal paths can be shortened.

A wiring board sheet of the present invention has been manufactured according to the above described manufacturing method for a wiring board sheet, and therefore, the surface is formed to be in a flat state and the electric components can be placed in a resin layer where the fluidity of the resin layer prevents air spaces from being generated around the electric components, and therefore, a wire board where electric components are provided in an insulation layer can be gained when the insulation layer is formed of the cured resin layer in a manner where the number of components mounted on the wiring board can be increased while miniaturization of the wiring board can be achieved by restricting the electric components from protruding from the wiring board. Furthermore, the area for allowing the electric components to be mounted is expanded, providing more freedom in the wiring design and the electric components are placed in an insulation layer without the existence of air spaces around the electric components, and therefore, no air remains around the electric components so that cracking of the insulation layer, damages to the electric components and occurrence of defects, such as disconnection of wires due to the thermal expansion of the air can be restricted even in the case where the wiring board receives stress due to heat; in addition, the resin layer is melted and softened so as to be fluidized so that the electric components can be placed at arbitrary positions irrelevant of the number of the mounted electric components or irrelevant of the positions of the mounted electric components in a manner where the electric components can be placed in arbitrary positions inside the resin insulation layer or inside the insulation layer made of the cured resin layer without undergoing a complicated process. Furthermore, other components can be mounted also on the surfaces of the multilayer board where the components have been buried.

According to the manufacturing method for a multilayer board of the present invention, two or more wiring board sheets such as the ones described in the above are layered and integrated, and therefore, a multilayer board wherein electric components are placed in an insulation layer can be gained and the number of the components mounted on the multilayer board can be increased and miniaturization of the multilayer board can be achieved by suppressing the electric components from protruding from the multilayer board. Furthermore, the area where the electric components can be mounted is expanded, providing more freedom in the wiring design, and the electric components are placed in an insulation layer without the existence of air spaces around the electric components, and therefore, no air remains around the electric components in a manner where cracking of the insulation layer, damages to the electric components and the occurrence of defects such as disconnection of wires due to the thermal expansion of the air can be restricted even in the case where the multilayer board receives stress due to heat. In addition, the electric components can be placed at arbitrary positions irrelevant of the numbers of mounted electric components or the positions of the mounted electric components so that electric components can be placed in arbitrary portions inside the insulation layer without undergoing a complicated process. Furthermore, other components can be mounted also on the surfaces of the multilayer board in which the components have been buried. In addition, members in sheet form having flat surfaces are layered, and therefore, no deformation occurs in the portions of the insulation layer where the conductor circuits have been formed during the molding process, providing highly reliable insulation in the insulation layer. In addition, the gained multilayer board can be formed as a multilayered wiring board that incorporates high level LCR functions, and can be expected to be utilized in a microelectronic field, such as a compact high frequency module including an RF module and a blue tooth module.

In addition, according to the manufacturing method for a multilayer board of the present invention, at least one wiring board sheet as described above and at least one sheet having a resin layer in the B and/or C-stage where no electric components are buried inside the sheet are layered and are integrated, and therefore, a multilayer board wherein electric components are placed in an insulation layer can be gained in a manner where the number of the components mounted in the multilayer board can be increased and miniaturization of the multilayer board can be achieved by suppressing the electric components from protruding from the multilayer board; furthermore, an area where the electric components can be mounted is expanded, providing more freedom in the wiring design and the electric components are placed in the insulation layer without the existence of air spaces around the electric components, and thereby, no air remains around the electric components in a manner where cracking of the insulation layer, damages to the electric components and the occurrence of defects such as disconnection of wires due to the thermal expansion of the air can be restricted even in the case where the multilayer board receives stress due to heat. In addition, the electric components can be placed at arbitrary positions irrelevant of the numbers of mounted electric components or the positions of the mounted electric components so that electric components can be placed in arbitrary portions inside the insulation layer without undergoing a complicated process. Furthermore, other components can be mounted also on the surfaces of the multilayer board in which the components have been buried. In addition, members in sheet form having flat surfaces are layered, and therefore, no deformation occurs in the portions of the insulation layer where the conductor circuits have been formed during the molding process, providing highly reliable insulation in the insulation layer. In addition, the gained multilayer board can be formed as a multilayered wiring board that incorporates high level LCR functions, and can be expected to be utilized in a microelectronic field, such as a compact high frequency module including an RF module and a blue tooth module.

In addition to the above described manufacturing method for a multilayer board, according to the manufacturing method for a multilayer board of the present invention, at least one wiring board sheet as described above and at least one sheet having a resin layer in the B and/or C-stage where no electric components are buried inside the sheet are layered so as to be integrated in this condition, that is to say two or more members in sheet form are collectively layered and integrated, and therefore, it is possible to simplify the molding process, saving time and effort for a complicated process, and no difference is made in the thermal histories of the conductor circuits on the respective layers at the time of molding, making the correction based on the contraction ratios of the conductor circuits due to the difference in the thermal histories unnecessary.

In addition to the above described manufacturing method for a multilayer board, according to the manufacturing method for a multilayer board of the present invention, at least one wiring board sheet as described above is used in order to integrate multiple layers and in order to create via holes in accordance with a build-up manufacturing method, and therefore, a variety of types of sheet materials can be used for the core portion and it becomes possible to manufacture a multilayer board having highly reliable connections wherein layers are formed in accordance with a general build-up manufacturing method, vias are formed by means of laser processing, plating and the like. For example, when a wiring board sheet that incorporates electric components is used as the core portion, this sheet can be utilized as the core material so that a substrate that incorporates components can be easily fabricated in accordance with a build-up manufacturing method.

In addition to the above described manufacturing method for a multilayer board, according to the manufacturing method for a multilayer board of the present invention, through holes are created so as to penetrate the layered body after the layers have been integrated, and after hole plating has been placed on the inner surfaces of the through holes, these through holes are filled in with resin paste or conductive paste, and therefore, additional through holes can be created so as to penetrate the entirety of the multilayer board after the layers have been integrated, providing more freedom in the wiring design and a high stability in the conductivity of the through holes can be secured by the usage of both the hole plating and the conductive paste.

A multilayer board of the present invention has been manufactured according to the above described manufacturing method for a multilayer board, and therefore, a multilayer board where electric components are placed in an insulation layer can be gained in a manner where the number of components mounted in the multilayer board can be increased and the miniaturization of the multilayer board can be achieved by suppressing the electric components from protruding from the multilayer board; furthermore, an area where the electric components can be mounted is expanded, providing more freedom in the wiring design and the electric components are placed in the insulation layer without the existence of air spaces around the electric components, and thereby, no air remains around the electric components in a manner where cracking of the insulation layer, damages to the electric components and the occurrence of defects such as disconnection of wires due to the thermal expansion of the air can be restricted even in the case where the multilayer board receives stress due to heat. In addition, the electric components can be placed at arbitrary positions irrelevant of the numbers of mounted electric components or the positions of the mounted electric components so that electric components can be placed in arbitrary portions inside the insulation layer without undergoing a complicated process. Furthermore, other components can be mounted also on the surfaces of the multilayer board in which the components have been buried. In addition, members in sheet form having flat surfaces are layered, and therefore, no deformation occurs in the portions of the insulation layer where the conductor circuits have been formed during the molding process, providing highly reliable insulation in the insulation layer. In addition, the gained multilayer board can be formed as a multilayered wiring board that incorporates high level LCR functions, and can be expected to be utilized in a microelectronic field, such as a compact high frequency module including an RF module and a blue tooth module.

The invention claimed is:

1. A method for manufacturing a wiring board sheet, comprising:

placing a conductor circuit on a base for transcription and mounting or forming through printing an electric component on the conductor circuit;

layering the base and conductor circuit on an external surface of a resin layer in the B-stage so that the conductor circuit and electric component are opposite to the external surface of the resin layer and the conductor circuit and electric component are buried in the resin layer;

then releasing the base from the resin layer while permitting the conductor circuit to remain in the resin layer external surface such that the external surface of the resin layer and an exposed surface of the conductor circuit are in the same plane;

then layering a protective film on the external surface of the resin layer and the exposed surface of the conductor circuit;

then creating a through hole that penetrates the protective film, conductor circuit and resin layer;

applying a conductive paste to an external side of the protective film to fill the through hole with the conductive paste; and then releasing the protective film from the resin layer so that the conductive paste protrudes outwardly from the through hole above the plane of the external surface of the resin layer and the exposed surface of the conductor circuit.

2. The method of claim 1 and further comprising:

layering a second base, second conductor circuit and second electric component on an opposite external surface of the resin layer so that the second conductor circuit and second electric component are buried in the resin layer;

then releasing the second base from the resin layer while permitting the second conductor circuit to remain in the resin layer opposite external surface such that the opposite external surface of the resin layer and an exposed surface of the second conductor circuit are in the same plane;

then layering a second protective film on the opposite external surface of the resin layer and the exposed surface of the second conductor circuit;

the through hole penetrating the second protective film and second conductor circuit; and then releasing the second protective film from the resin layer so that the conductive paste protrudes outwardly from the through hole above the plane of the opposite external surface of the resin layer and the exposed surface of the second conductor circuit.

3. The method of claim 1 and layering a metal foil or metal foil with resin on an opposite external surface of the resin layer and integrating the foil or foil with resin with the opposite external surface.

4. The method of claim 1 wherein the base for transcription is stainless steel and the conductor surface is placed thereon by a plating treatment after the formation of a resist on the surface of the base.

5. The method of claim 1 wherein the base for transcription is stainless steel having a thickness of from 50 µm to 150 µm on which a surface roughening treatment has been carried out to produce a surface roughness $R_a$ on the surface on which the conductor circuit is placed of 2 µm or less.

6. The method of claim 1, wherein the resin layer is formed of a resin composition that contains at least one type of inorganic filler selected from the group consisting of silica, alumina, aluminum nitride, boron nitride, titanium oxide, aluminum borate and magnesium oxide, wherein the maximum grain diameter of said organic fillers is 10 µm or less.

7. The method of claim 1, wherein the resin layer is formed of a resin composition having an organic filler of which the content of the inorganic filler is from 70 wt. % to 95 wt. % and that contains at least a coupling agent or a dispersing agent.

8. The method of claim 1, wherein the resin layer is formed of a resin sheet produced by impregnating an unwoven cloth with a resin composition which is then dried.

9. The manufacturing method of claim 1, wherein after formation of the resin layer, the resin layer is maintained in the B-stage.

10. A method for manufacturing a wiring board sheet, comprising:
    placing a conductor circuit on a base for transcription and mounting or forming through printing an electric component on the conductor circuit;
    layering the base and conductor circuit on an external surface of a resin layer in the B-stage so that the conductor circuit and electric component are opposite to the external surface of the resin layer and the conductor circuit and electric component are buried in the resin layer;
    then releasing the base from the resin layer while permitting the conductor circuit to remain in the resin layer external surface such that the external surface of the resin layer and an exposed surface of the conductor circuit are in the same plane;
    then layering a protective film on the external surface of the resin layer and the exposed surface of the conductor circuit;
    then creating a through hole that penetrates the protective film, conductor circuit and resin layer;
    plating the inner surface of the through hole;
    applying a resin or conductive paste to an external side of the protective film to fill the through hole with the resin or conductive paste; and
    then releasing the protective film from the resin layer so that the resin or conductive paste protrudes outwardly from the through hole above the plane of the external surface of the resin layer and the exposed surface of the conductor circuit.

11. The method of manufacturing a multi-layer board by layering and integrating a plurality of wiring board sheets wherein each of said sheets is formed by the following method:
    placing a conductor circuit on a base for transcription and mounting or forming through printing an electric component on the conductor circuit;
    layering the base and conductor circuit on an external surface of a resin layer in the B-stage so that the conductor circuit and electric component are opposite to the external surface of the resin layer and the conductor circuit and electric component are buried in the resin layer;
    then releasing the base from the resin layer while permitting the conductor circuit to remain in the resin layer external surface such that the external surface of the resin layer and an exposed surface of the conductor circuit are in the same plane;
    then layering a protective film on the external surface of the resin layer and the exposed surface of the conductor circuit;
    then creating a through hole that penetrates the protective film, conductor circuit and resin layer;
    applying a conductive paste to an external side of the protective film to fill the through hole with the conductive paste; and
    then releasing the protective film from the resin layer so that the conductive paste protrudes outwardly from the through hole above the plane of the external surface of the resin layer and the exposed surface of the conductor circuit.

12. The method of claim 11 wherein said through hole is created after the layering and integrating process and said hole is plated on its inner surface prior to filling with the conductive paste.

13. The method of manufacturing a multi-layer board by layering and integrating a plurality of wiring board sheets wherein each of said sheets is formed by the following method:
    placing a conductor circuit on a base for transcription and mounting or forming through printing an electric component on the conductor circuit;
    layering the base and conductor circuit on an external surface of a resin layer in the B-stage so that the conductor circuit and electric component are opposite to the external surface of the resin layer and the conductor circuit and electric component are buried in the resin layer;
    then releasing the base from the resin layer while permitting the conductor circuit to remain in the resin layer external surface such that the external surface of the resin layer and an exposed surface of the conductor circuit are in the same plane;
    then layering a protective film on the external surface of the resin layer and the exposed surface of the conductor circuit;
    then creating a through hole that penetrates the protective film, conductor circuit and resin layer;
    applying a conductive paste to an external side of the protective film to fill the through hole with the conductive paste;
    then releasing the protective film from the resin layer so that the conductive paste protrudes outwardly from the through hole above the plane of the external surface of the resin layer and the exposed surface of the conductor circuit;
    layering a second base, second conductor circuit and second electric component on an opposite external surface of the resin layer so that the second conductor circuit and second electric component are buried in the resin layer;

then releasing the second base from the resin layer while permitting the second conductor circuit to remain in the resin layer opposite external surface such that the opposite external surface of the resin layer and an exposed surface of the second conductor circuit are in the same plane;

then layering a second protective film on the opposite external surface of the resin layer and the exposed surface of the second conductor circuit;

the through hole penetrating the second protective film and second conductor circuit; and then releasing the second protective film from the resin layer so that the conductive paste protrudes outwardly from the through hole above the plane of the opposite external surface of the resin layer and the exposed surface of the second conductor circuit.

14. A method of manufacturing a multilayer board comprising layering and integrating a wiring board sheet and at least one sheet having a resin layer in the B and/or C-stage and being devoid of an electric component buried therein, wherein said wiring board sheet is formed by the following method:

placing a conductor circuit on a base for transcription and mounting or forming through printing an electric component on the conductor circuit;

layering the base and conductor circuit on an external surface of a resin layer in the B-stage so that the conductor circuit and electric component are opposite to the external surface of the resin layer and the conductor circuit and electric component are buried in the resin layer;

then releasing the base from the resin layer while permitting the conductor circuit to remain in the resin layer external surface such that the external surface of the resin layer and an exposed surface of the conductor circuit are in the same plane;

then layering a protective film on the external surface of the resin layer and the exposed surface of the conductor circuit;

then creating a through hole that penetrates the protective film, conductor circuit and resin layer;

applying a conductive paste to an external side of the protective film to fill the through hole with the conductive paste; and then releasing the protective film from the resin layer so that the conductive paste protrudes outwardly from the through hole above the plane of the external surface of the resin layer and the exposed surface of the conductor circuit.

15. A method of manufacturing a multilayer board comprising layering and collectively molding a wiring board sheet and at least one sheet having a resin layer in the B and/or C-stage and being devoid of an electric component buried therein, wherein said wiring board sheet is formed by the following method:

placing a conductor circuit on a base for transcription and mounting or forming through printing an electric component on the conductor circuit;

layering the base and conductor circuit on an external surface of a resin layer in the B-stage so that the conductor circuit and electric component are opposite to the external surface of the resin layer and the conductor circuit and electric component are buried in the resin layer;

then releasing the base from the resin layer while permitting the conductor circuit to remain in the resin layer external surface such that the external surface of the resin layer and an exposed surface of the conductor circuit are in the same plane;

then layering a protective film on the external surface of the resin layer and the exposed surface of the conductor circuit;

then creating a through hole that penetrates the protective film, conductor circuit and resin layer;

applying a conductive paste to an external side of the protective film to fill the through hole with the conductive paste; and then releasing the protective film from the resin layer so that the conductive paste protrudes outwardly from the through hole above the plane of the external surface of the resin layer and the exposed surface of the conductor circuit.

16. A wiring board sheet made by the following method:

placing a conductor circuit on a base for transcription and mounting or forming through printing an electric component on the conductor circuit;

layering the base and conductor circuit on an external surface of a resin layer in the B-stage so that the conductor circuit and electric component are opposite to the external surface of the resin layer and the conductor circuit and electric component are buried in the resin layer;

then releasing the base from the resin layer while permitting the conductor circuit to remain in the resin layer external surface such that the external surface of the resin layer and an exposed surface of the conductor circuit are in the same plane;

then layering a protective film on the external surface of the resin layer and the exposed surface of the conductor circuit;

then creating a through hole that penetrates the protective film, conductor circuit and resin layer;

applying a conductive paste to an external side of the protective film to fill the through hole with the conductive paste; and then releasing the protective film from the resin layer so that the conductive paste protrudes outwardly from the through hole above the plane of the external surface of the resin layer and the exposed surface of the conductor circuit.

17. A multilayer board made by layering and integrating a plurality of wiring board sheets wherein each of said sheets is made by the following method:

placing a conductor circuit on a base for transcription and mounting or forming through printing an electric component on the conductor circuit;

layering the base and conductor circuit on an external surface of a resin layer in the B-stage so that the conductor circuit and electric component are opposite to the external surface of the resin layer and the conductor circuit and electric component are buried in the resin layer;

then releasing the base from the resin layer while permitting the conductor circuit to remain in the resin layer external surface such that the external surface of the resin layer and an exposed surface of the conductor circuit are in the same plane;

then layering a protective film on the external surface of the resin layer and the exposed surface of the conductor circuit;

then creating a through hole that penetrates the protective film, conductor circuit and resin layer;

applying a conductive paste to an external side of the protective film to fill the through hole with the conductive paste; and then releasing the protective film from the resin layer so that the conductive paste protrudes outwardly from the through hole above the plane of the external surface of the resin layer and the exposed surface of the conductor circuit.

18. A module utilized in the microelectronics field made by layering and integrating a plurality of wiring board sheets wherein each of said sheets is made by the following method:

placing a conductor circuit on a base for transcription and mounting or forming through printing an electric component on the conductor circuit;

layering the base and conductor circuit on an external surface of a resin layer in the B-stage so that the conductor circuit and electric component are opposite to the external surface of the resin layer and the conductor circuit and electric component are buried in the resin layer;

then releasing the base from the resin layer while permitting the conductor circuit to remain in the resin layer external surface such that the external surface of the resin layer and an exposed surface of the conductor circuit are in the same plane;

then layering a protective film on the external surface of the resin layer and the exposed surface of the conductor circuit;

then creating a through hole that penetrates the protective film, conductor circuit and resin layer;

applying a conductive paste to an external side of the protective film to fill the through hole with the conductive paste; and then releasing the protective film from the resin layer so that the conductive paste protrudes outwardly from the through hole above the plane of the external surface of the resin layer and the exposed surface of the conductor circuit.

* * * * *